(12) United States Patent
Watanabe

(10) Patent No.: US 7,683,104 B2
(45) Date of Patent: *Mar. 23, 2010

(54) CURABLE COMPOSITION, INK COMPOSITION, INKJET-RECORDING METHOD, AND PLANOGRAPHIC PRINTING PLATE

(75) Inventor: Kotaro Watanabe, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/713,731

(22) Filed: Mar. 5, 2007

(65) Prior Publication Data

US 2007/0206054 A1    Sep. 6, 2007

(30) Foreign Application Priority Data

| Mar. 3, 2006 | (JP) | ............................ 2006-058723 |
| Mar. 29, 2006 | (JP) | ............................ 2006-092438 |
| Mar. 31, 2006 | (JP) | ............................ 2006-100896 |

(51) Int. Cl.
*C08F 4/50* (2006.01)
*C08J 3/28* (2006.01)

(52) U.S. Cl. .............. 522/168; 522/181; 427/457; 427/487; 427/508; 427/510; 427/511

(58) Field of Classification Search ............. 549/200, 549/510; 522/168, 181; 427/457, 487, 508, 427/510, 511

See application file for complete search history.

(56) References Cited

U.S. PATENT DOCUMENTS

| 5,547,806 | A * | 8/1996 | Kamikawa et al. ........... 430/138 |
| 6,284,898 | B1 * | 9/2001 | Moszner et al. .............. 549/214 |
| 2001/0002423 | A1 * | 5/2001 | Sugiyama et al. ........... 549/510 |
| 2003/0008232 | A1 * | 1/2003 | Kinsho et al. ............. 430/270.1 |
| 2004/0019128 | A1 | 1/2004 | Kondo |
| 2004/0052967 | A1 | 3/2004 | Takabayashi |
| 2004/0227798 | A1 | 11/2004 | Nakajima |
| 2004/0244641 | A1 | 12/2004 | Takabayashi et al. |
| 2004/0252171 | A1 * | 12/2004 | Nishizeki et al. ........... 347/100 |
| 2005/0196697 | A1 * | 9/2005 | Masumi et al. ........... 430/270.1 |
| 2005/0224757 | A1 * | 10/2005 | Syundo et al. ........... 252/299.61 |
| 2006/0174799 | A1 | 8/2006 | Aoai |
| 2006/0178449 | A1 * | 8/2006 | Tsuchimura et al. ........ 523/160 |

FOREIGN PATENT DOCUMENTS

| EP | 1 477 537 A1 | 11/2004 |
| EP | 1 484 370 A1 | 12/2004 |
| EP | 1 486 526 A1 | 12/2004 |
| EP | 1 688 467 A1 | 8/2006 |
| EP | 1 688 468 A1 | 8/2006 |
| JP | 63-235382 A | 9/1988 |
| JP | 3-216379 A | 9/1991 |
| JP | 5-214280 A | 8/1993 |
| JP | 6-21256 B2 | 3/1994 |
| JP | 6-62905 B2 | 8/1994 |
| JP | 9-183928 A | 7/1997 |
| JP | 11-43540 A | 2/1999 |
| JP | 11-60702 A | 3/1999 |
| JP | 2003-192943 A | 7/2003 |
| JP | 2003-192944 A | 7/2003 |
| JP | 2003-312121 A | 11/2003 |
| JP | 2003-341217 A | 12/2003 |
| JP | 2004-91558 A | 3/2004 |
| WO | WO 2006/008251 A2 | 1/2006 |

* cited by examiner

*Primary Examiner*—Sanza L McClendon
(74) *Attorney, Agent, or Firm*—Sughrue Mion, PLLC

(57) ABSTRACT

The present invention provides a curable composition including: a compound having a single partial structure containing a cyclic ether group, and at least one linear alkyl group having 5 or more carbon atoms; and a compound that generates acid when irradiated with radiation. The present invention also provides an ink composition containing the curable composition, an inkjet-recording method by using the ink composition, and a planographic printing plate obtained by using the ink composition.

10 Claims, No Drawings

CURABLE COMPOSITION, INK COMPOSITION, INKJET-RECORDING METHOD, AND PLANOGRAPHIC PRINTING PLATE

CROSS-REFERENCE TO RELATED APPLICATION

This application claims priority under 35 USC 119 from Japanese Patent Applications Nos. 2006-058723, 2006-092438 and 2006-100896, the disclosure of which are incorporated by reference herein.

BACKGROUND OF THE INVENTION

1. Field of the Invention

The present invention relates to a curable composition that is suitably used for an ink composition, a coating material, an adhesive and the like. The invention also relates to an ink composition, which includes the curable composition, suitably used for an inkjet-recording method. The present invention further relates to a planographic printing plate obtained by using the ink composition.

2. Description of the Related Art

Curable compositions that cure at high sensitivity by irradiation of active radiation and form a cured film have been used in various applications, and are attracting attention as the principal component of the ink composition used in the image-recording method described below.

Cyclic ether compounds, such as 3- or 4-membered rings, are known as materials that exhibit high reactivity, and have been used as a polymerizable compound that are included in curable compositions applied to thermal polymerization using photocationic polymerization or acid anhydrides (see, for example, Japanese Patent Application Laid-Open(JP-A) Nos. 11-43540 and 11-60702).

As an image recording method of forming an image on a recording medium, such as a paper or the like, on the basis of image data signals, there are an electrophotographic method, a sublimate-type and melt-type thermal transfer method, and an inkjet method. Among these, the inkjet method is feasible with a low cost device, in which an image is directly formed on a recording medium by discharging ink on a necessary image area only. Therefore, the ink can be efficiently used and the running cost is low. In addition, the inkjet method is superior as an image recording method since noise is low.

According to the inkjet method, it is possible to print not only on a normal paper but also on a non-absorptive recording medium, such as a plastic sheet and a metal plate. However, in this case, speeding-up upon printing and high definition are key matters. Further, there is a property in which the time required for drying and curing droplets after printing have a large effect on productivity of printed materials or sharpness of printed images.

As one of the inkjet methods, there is a recording method that uses inkjet recording ink curable by irradiation of radiation. According to this method, since ink droplets are cured by irradiating radiation immediately after or after a predetermined time after ink is ejected, the productivity of printing can be increased and sharp images can be formed.

When high sensitivity of inkjet recording ink curable by irradiation of radiation, such as ultraviolet rays, is realized, high curability with respect to radiation is given, which causes numerous benefits, such as the improvement of the productivity of inkjet recording, the reduction in power consumption, the extension of lifetime due to a reduction in load on a radiation generator, and the prevention of the occurrence of volatilization of low molecule substances by insufficient curing. Further, high sensitivity means the improvement of the strength of an image formed by, in particular, inkjet recording ink. Particularly, if it is applied to the formation of a planographic printing plate, strength of the cured image area is increased, and thus high printing durability can be obtained.

Recently, such an inkjet method curable by radiation, for example, ultraviolet rays has been drawing attention from the point of relatively less odor, quick drying properties, and a capability of recording onto a non-ink absorptive recording medium. Ultraviolet ray curable ink compositions for inkjet using radical polymerization are disclosed (for example, see JP-A No. 63-235382, JP-A No. 3-216379, JP-A No. 5-214280, JP-B No. 6-21256, and JP-B No. 6-62905).

Further, with an object of providing inkjet recording ink capable of recording an image without bleeding, but with high sensitivity, and high adhesiveness onto a recording medium, even for a substrate that is normally difficult to directly record by an inkjet recording method, and highly safe due to less irritation and sensitization to skin, compositions including colorants and polymerizable compounds including a specific radial polymerizable acrylate compound group are proposed (for example, see JP-A No. 2003-192943 and JP-A No. 2003-192944). These radical polymerizable inks are superior in a curing rate, and are capable of forming an image without bleeding, but have a problem in that the adhesiveness onto a recording medium is decreased due to volume shrinkage upon curing.

For this reason, with an object of improving the adhesiveness onto a recording medium, cationic polymerizable ink compositions with a lower shrinkage rate upon curing by ultraviolet rays are proposed (see, for example, JP-A No. 9-183928). However, cationic polymerizable ink has a big disadvantage for practical use in that the stability during the storage is not sufficient due to a reaction based on acid generated over time. Therefore, as an attempt to improve the storage stability, techniques of adding a basic compound or a thermal base generator are proposed (for example, see JP-A No. 2003-312121, JP-A No. 2003-341217, and JP-A No. 2004-91558). However, it was found a new problem occurs in that the basic compound inhibits the function of acid generated by exposure, thus decreasing the ink curing sensitivity.

Further, multifunctional cyclic ethers used for improving the sensitivity of cationic polymerizable ink give a polymer, which is obtained by curing the multifunctional cyclic ethers, having a highly crosslinked three-dimensional structure. For this reason, the cationic polymerizable ink including such multifunctional cyclic ethers has disadvantages such as deterioration of the flexibility of the film after ink curing, easier cracking, exfoliation, and decreased durability of the cured film on recording medium.

Currently, as described above, there is still no curable composition that can be applied to UV-curing ink composition and the like, which has highly sensitivity to radiation irradiation, a high-strength film formability, and superior in flexibility of cured materials.

SUMMARY OF THE INVENTION

The present invention has been made in consideration of the above situations.

A first aspect of the invention provides a curable composition including: a compound having a single partial structure containing a cyclic ether group, and at least one linear alkyl group having 5 or more carbon atoms (hereinafter, sometimes referred to as "specific polymerizable compound A"); and a compound that generates acid when irradiated with radiation.

A second aspect of the invention provides a curable composition containing a compound represented by the following Formula (I) (hereinafter, sometimes, referred to as "specific polymerizable compound B") and a compound that generates acid when irradiated with radiation.

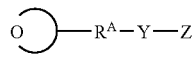
(I)

In Formula (I), a cyclic ether group at the end of the compound may have a substituent; $R^A$ represents a bivalent linking group a bivalent linking group in which the number of atoms constituting the main skeleton thereof is 7 or more; Y represents a bivalent or trivalent linking group having at least one partial structure selected from the following groups.

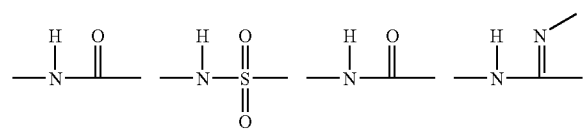

In neighboring two or more compounds represented by Formula (I), two or more partial structures represented by Y may interact with each other.

When Y is a bivalent linking group, Z represents a hydrogen atom or a monovalent nonmetal atomic group.

When Y is a trivalent linking group, two of Z each independently represent a hydrogen atom or a monovalent nonmetal atomic group, and the two of Z may combine with each other to form a ring structure.

A third aspect of the invention provides a curable composition containing a compound represented by the following Formula (II) (hereinafter, sometimes, referred to as "specific polymerizable compound C") and a compound that generates acid when irradiated with radiation.

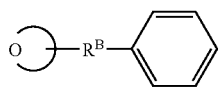
(II)

In Formula (II), $R^B$ represents a linking group a bivalent linking group in which the number of atoms constituting the main skeleton thereof is 4 or more.

A fourth aspect of the invention provides an ink composition containing the curable composition in the first, second or third aspect of the invention, and a colorant.

A fifth aspect of the invention provides an inkjet recording method including: ejecting the ink composition in the fourth aspect of the invention onto a recording medium using an inkjet recording apparatus; and curing the ejected ink composition by irradiation of active radiation.

A sixth aspect of the invention provides a producing a planographic printing plate produced by a method including: ejecting the ink composition in the fourth aspect of the present invention onto a support; and curing the ejected ink composition by irradiation of active radiation onto the ejected ink composition so as to form a hydrophobic image on the support with the cured in k composition.

DETAIL DESCRIPTION OF THE PRESENT INVENTION

<Curable Composition and Ink Composition>

The curable composition according to the present invention is a composition containing a specific polymerizable compound that is cured by irradiation of radiation, and a compound that generates acid when irradiated with radiation.

The "radiation" as used in the present invention is not particularly limited as long as it can provides an energy capable of generating initiation sites in the composition by irradiation of it, and broadly including $\alpha$ rays, $\gamma$ rays, X rays ultraviolet rays, visible rays, and electron beam. Among them, ultraviolet rays and electron beam are preferable, and ultraviolet rays are particularly preferable, from the viewpoints of curing sensitivity and easy availability of apparatus. Thus, the curable composition according to the present invention is preferably a composition that be cured by irradiation of ultraviolet rays as the radiation.

A particularly preferable embodiment of the curable composition according to the present invention is an ink composition including the curable composition and a colorant. Hereinafter, each embodiment of the curable composition according to the present invention will be described as an ink composition (ink composition according to the present invention), but the invention is not limited thereto.

In the present specification ". . . to . . . " represents a range including the numeral values represented before and after "to" as a minimum value and a maximum value, respectively.

1. Curable Composition According to the First Embodiment of the Present Invention A first embodiment of the curable composition according to the present invention (hereinafter, sometimes referred to as "curable composition A") is a curable composition containing a compound having a single partial structure containing a cyclic ether group and at least one linear alkyl group having 5 or more carbon atoms (specific polymerizable compound A), and a compound that generates acid when irradiated with radiation.

The curable composition A is cured at high sensitivity by irradiation of radiation, and is capable of forming a sufficiently flexible cured material. Although the mechanism is not yet clear, it seems that, because the specific polymerizable compound A contained in the curable composition A has a linear alkyl group that shows a surface orientation in the composition, a droplet of an ink composition including the curable composition A is ejected on a recording medium in a state in which the specific polymerizable compound A is oriented at the surface of the droplet. In addition, because the surface energy of the droplet is lower than that of the recording medium, the droplet is extremely adhesive to the recording medium. The cured film obtained by curing the specific polymerizable compound A is a cured film having a lower crosslinking density, and thus, the cured material obtained from the curable composition A is superior in flexibility.

[Compound Having a Single Partial Structure Having a Cyclic Ether Group and at Least One Linear Alkyl Group Having 5 or More Carbon Atoms (Specific Polymerizable Compound A)]

The specific polymerizable compound A according to the present invention will be described below.

The specific polymerizable compound A is a compound having a single partial structure containing a cyclic ether group and at least one linear alkyl group having 5 or more carbon atoms in its molecular structure.

The specific polymerizable compound A is a compound that initiates polymerization reaction and is cured by a compound that generates acid by irradiation of radiation described below.

The cyclic ether group in the specific polymerizable compound A is preferably a cyclic ether having 2 to 9 carbon atoms, more preferably a cyclic ether group having 2 to 6 carbon atoms. It may be a monocyclic or polycyclic group.

Specifically, the cyclic ether is particularly preferably one of the cyclic ethers shown below, from the viewpoint of cationic polymerization efficiency.

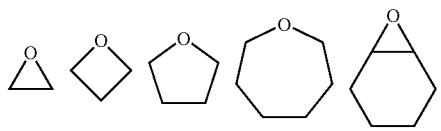

The carbon atoms in the cyclic ether may be introduced a substituent group. Examples of the substituent group that may be introduced include an alkyl group having 1 to 18 carbon atoms, a cycloalkyl group having 3 to 12 carbon atoms, an aryl groups having 6 to 14 carbon atom, an alkoxy groups having 1 to 18 carbon atoms, an aryloxy group having 6 to 10 carbon atoms, an alkylamino groups having 1 to 18 carbon atoms, an arylamino group having 6 to 10 carbon atoms and the like.

The specific polymerizable compound A is a compound having single cyclic ether group in the molecule.

Examples of the linear alkyl group having 5 or more carbon atoms in the specific polymerizable compound A include an alkyl group having 5 to 30 carbon atoms, preferably an alkyl group having 6 to 20 carbon atoms, and more preferably an alkyl group having 8 to 16 carbon atoms.

Specific examples of the linear alkyl group include n-butyl group, n-hexyl group, n-octyl group, n-decyl group, n-dodecyl group, n-tetradecyl group, and the like. The specific polymerizable compound may contain only one or two or more such a linear alkyl group.

In the specific polymerizable compound A, the linear alkyl group having 5 or more carbon atoms is linked, directly or via a linking group, to a carbon atom in the cyclic ether group.

Examples of the linking group include —O—, —S—, —C(=O)O—, and combinations thereof.

Preferable examples of the specific polymerizable compound A include the followings.

That is, the preferable specific polymerizable compound A has a single cyclic ether group in the molecule in which the cyclic ether group is a 3-membered ring structure (i.e. a ring structure having 2 carbon atoms) or a 4-membered ring structure (i.e. a cyclic ether having 3 carbon atoms), and also has a linear alkyl group in which the linear alkyl group has 8 to 16 carbon atoms. Among such a specific polymerizable compound A, a compound that has a four-membered cyclic ether group, i.e. a cyclic ether group having 3 carbon atoms is more preferable Hereinafter, representative and specific examples of the specific polymerizable compounds A will be shown, but the specific polymerizable compound A is not limited thereto

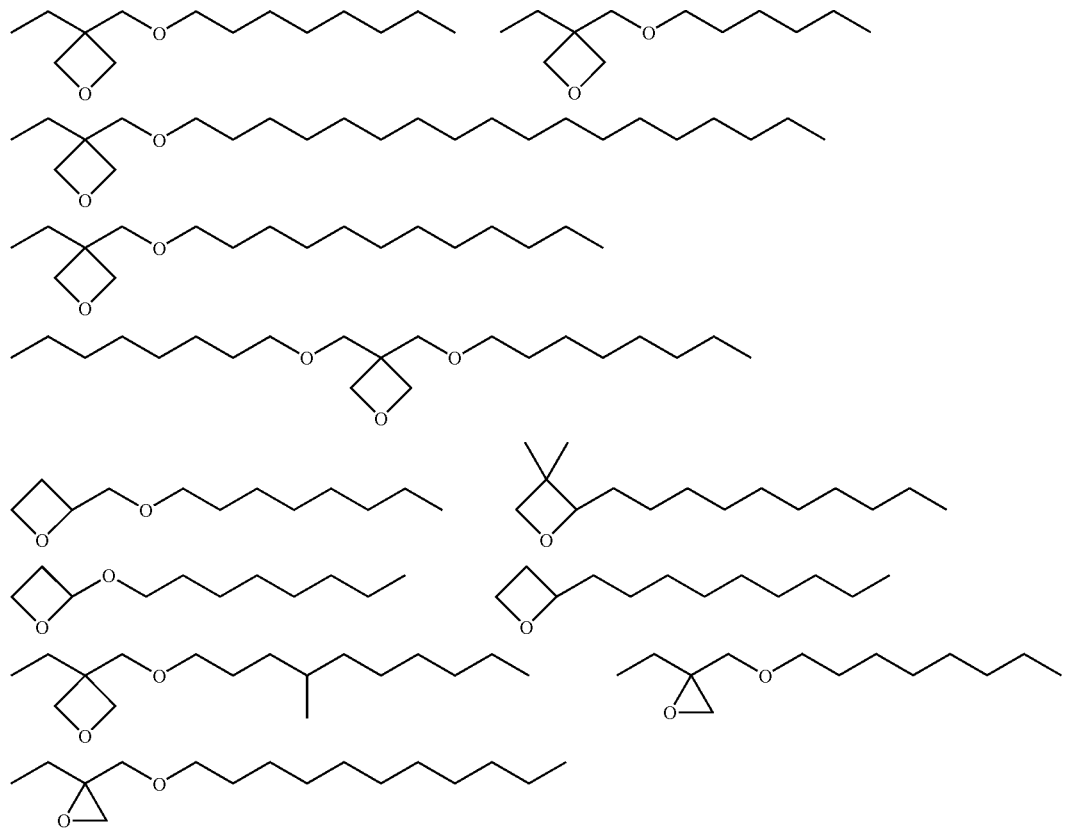

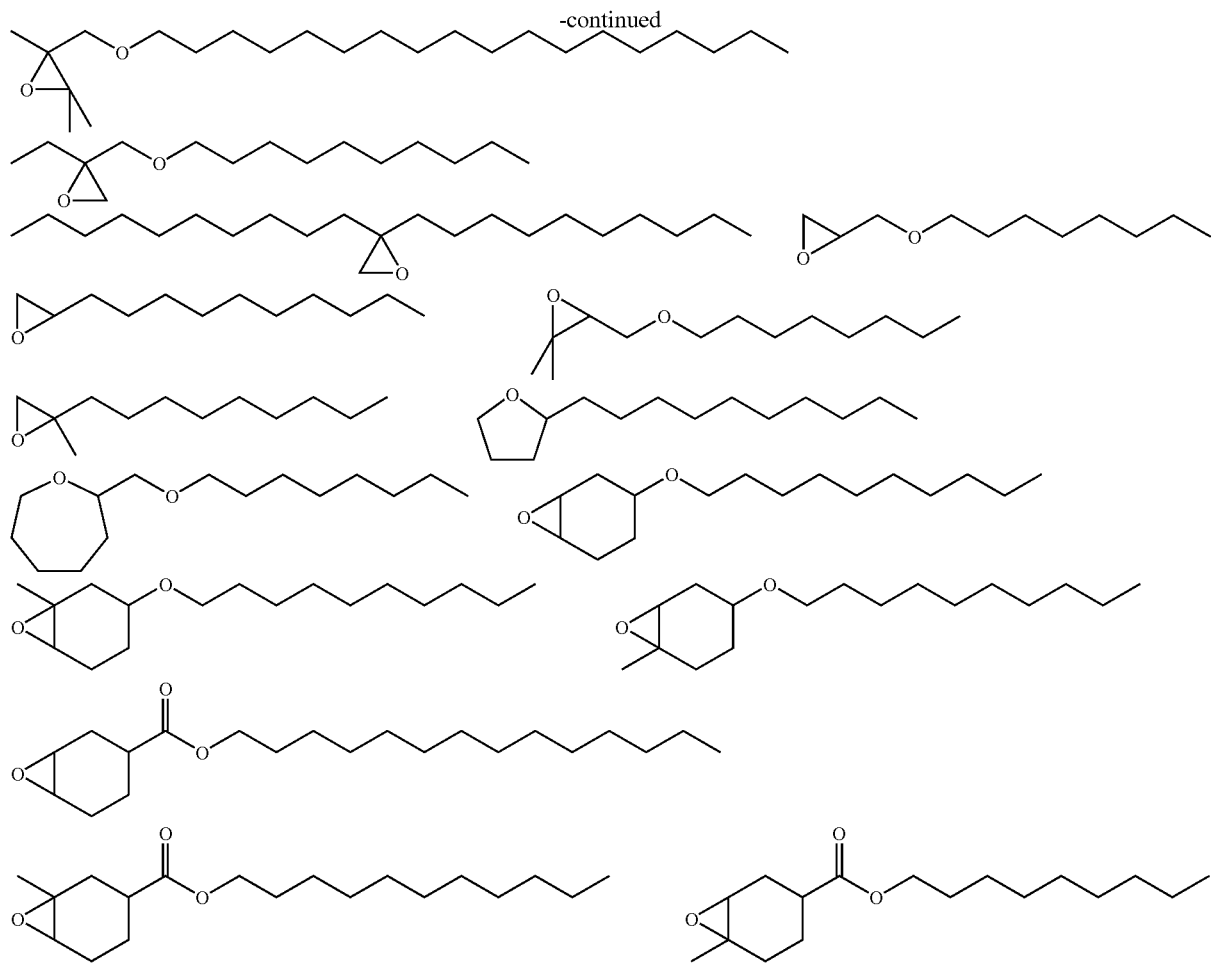

The specific polymerizable compound A may be produced by a conventionally known method of producing cyclic ether compounds. For example, the specific polymerizable compound A may be produced by the method described below.

(1) Raw Materials

The raw materials used for the synthesis of the specific polymerizable compound A will be described below.

Any raw material may be used as the raw materials for the specific polymerizable compound, if the raw material makes it possible to produce an oxetane compound according to the Motoi's method (Motoi et al., Bull. Chem. Soc. Jpn. 61, 1998) which is a dehydrochlorination reaction, or to a similar sulfonate elimination reaction. Specifically, the specific polymerizable compound A can be produced by an etherification reaction of a cyclic ether alcohol compound represented by the following Formula (A) with an alkyl halide compound.

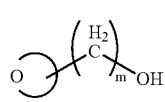

(A)

In Formula (A), m is an integer of from 0 to 10, preferably 0 to 5, and more preferably 0 to 3. The cyclic ether group in Formula (I) may be substituted with an alkyl group having 1 to 5 carbon atoms, or an aromatic group.

Specific examples of the cyclic ether alcohol compound represented by Formula (A) (i.e. an oxetane alcohol compound) include 3-methyl-3-oxetanemethanol, 3-methyl-3-oxetaneethanol, 3-methyl-3-oxetanepropanol, 3-ethyl-3-oxetanemethanol, 3-ethyl-3-oxetaneethanol, 3-ethyl-3-oxetanepropanol, 3-propyl-3-oxetanemethanol, 3-propyl-3-oxetaneethanol, 3-propyl-3-oxetanepropanol, and the like. These compounds may be used alone or in combination of two or more.

Examples of the alkyl halide compound include bromoheptane, bromooctane, and the like.

The reaction ratio of the oxetane alcohol compound represented by Formula (A) to the alkyl halide compound is not particularly limited, but the alkyl halide compound is preferably used in the reaction in an amount in the range of 0.05 to 0.6 mole with respect to 1 mole of the oxetane alcohol compound represented by Formula (A). The alkyl halide compound is more preferably used in reaction in an amount in the range of 0.2 to 0.5 mole with respect to 1 mole of the oxetane alcohol compound represented by Formula (A).

(2) Reaction Temperature

The reaction temperature in production of the specific polymerizable compound A will be described below. The reaction temperature for reaction of the two components is determined by considering the yield of the specific polymerizable compound A or the like, but is preferably in the range of 0 to 100° C., more preferably 10 to 90° C., and still more preferably 20 to 80° C., from the viewpoint of reactivity between the raw material compounds and the yield of the reaction, and the degree of freedom of selectivity of usable organic solvents.

(3) Reaction Time

The reaction time in producing the specific polymerizable compound A will be described below. The reaction period is decided by considering the yield of the specific polymerizable compound A and the reaction temperature or the like. For example, a value in the range of 10 minutes to 100 hours is preferable at the preferable reaction temperature of 0 to 100° C. In the reaction time above, it is possible to control the amount of residual unreacted raw materials and obtain high productivity. The reaction time in producing the specific polymerizable compound A is more preferably in the range of 30 minutes to 50 hours and still more preferably in the range of 1 to 10 hours.

(4) Reaction Atomospher (pH)

The reaction atomospher (pH) in producing the specific polymerizable compound A will be described below. The reaction atomospher (pH value) is decided by considering the yield of the specific polymerizable compound A, and the like. For example, the reaction atomospher is preferably in the range of 5 to 14 from the view point of suppression of a side reaction and the degree of freedom of selectivity of the raw materials. The pH value in production of the specific polymerizable compound A is more preferably in the range of 6 to 14, and still more preferably in the range of 7 to 14. It is preferable to add an alkali such as sodium hydroxide or potassium hydroxide for adjustment of the pH value in the range above.

(5) Phase-transfer Catalyst

The phase-transfer catalyst used in production of the specific polymerizable compound A will be described next. A phase-transfer catalyst is preferably added during reaction to improve the reactivity of the oxetane alcohol compound and the alkyl halide compound. For example, the added amount of the phase-transfer catalyst is preferably set to a value in the range of 0.1 to 30 parts by mass per 100 parts by mass of the total amount of the raw materials, from the viewpoint of expression property of effects such as the improvement reactivity and yield by addition, and easy purification of the specific polymerizable compound A obtained. The added amount is more preferably in the range of 1.0 to 20.0 parts by mass, more preferably 2.0 to 10.0 parts by mass per 100 parts by mass of the total amount of the raw materials.

The kinds of phase-transfer catalyst is not particularly limited. For example, the phase-transfer catalyst is preferably at lease one compound selected from a group of a quaternary ammonium salt, and a quaternary phosphonium salt. Specific examples thereof include tetra-n-butylammonium bromide, tetramethylammonium bromide, benzyltriethylammonium bromide, hexadecyltrimethylammonium bromide, triethylhexadecylammonium bromide, trioctylmethylammonium bromide, methyltriphenylphosphonium bromide, triethylhexadecylphosphonium bromide, tetraphenylphosphonium bromide, tetrabutylphosphonium bromide, and the like. These compounds may be used alone or in combination of two or more.

(6) Organic Solvent

The organic solvent for use in production of the specific polymerizable compound A will be described next. The organic solvent is preferably a liquid whose boiling point under atmospheric pressure is 250° C. or lower since the liquid is a good solvent for the raw materials and the production can be easily made. Examples of the organic solvents include hydrocarbons such as hexane, heptane, and octane; halogenated hydrocarbons such as dichloromethane and chloroform; ethers such as diethylether, dibutylether, ethylene glycol dimethylether, tetrahydrofuran, and dioxane; ketones such as acetone, methylethylketone, methylisobutylketone and cyclohexanone; esters such as ethyl acetate, butyl acetate, amyl acetate and γ-butylolactone; aromatic hydrocarbons such as benzene, toluene and xylene; and the like. These solvents may be used alone or in combination of two or more.

The structure of the specific polymerizable compound A obtained by the production method above can be identified from $^1$H-NMR and IR spectra.

In the curable composition A, the content of the specific polymerizable compound A is preferably 1 to 90% by mass, more preferably 1 to 70% by mass, and still more preferably 1 to 50% by mass, with respect to the total solid matters in the composition.

The preferable range of the content of the specific polymerizable compound A is also applicable, when the curable composition A is applied as an ink composition.

The curable composition A and the ink composition including the curable composition A may contain other polymerizable compounds as described below in detail (i.e. cationically polymerizable compounds) together with the specific polymerizable compound A, within a range that does not impair the effects of the present invention.

In the invention, the curable composition A and the ink composition including the curable composition A of the invention preferably contain the specific polymerizable compound A, at least one compound selected from epoxy compounds or other oxetane compounds not included in the specific polymerizable compound A, as described below as other polymerizable compounds, and a vinyl ether compound, from the viewpoint of effectively suppressing shrinkage during the curing of the composition.

(Other Polymerizable Compound)

Other cationic polymerizable compound used in the invention is not particularly limited, if it is a compound as described below that initiates polymerization reaction and cures by an acid generated from a compound that generates acid when irradiated with a radiation, and any one of various cationically polymerizable monomers known as photocationically polymerizable monomers may be used. Examples of the cation polymerizable monomers include epoxy compounds, vinyl ether compounds, and other oxetane compounds not included in the specific polymerizable compounds that are described in JP-A Nos. 6-9714, 2001-31892, 2001-40068, 2001-55507, 2001-310938, 2001-310937, and 2001-220526, and the like.

Examples of the epoxy compound include aromatic epoxides, alicyclic epoxides, aromatic epoxides, and the like.

The aromatic epoxides are, for example, a di- or polyglycidyl ether prepared in reaction of a polyvalent phenol having at least one aromatic ring, or the alkyleneoxide adduct thereof, and epichlorohydrin, and examples thereof include di- and poly-glycidyl ethers of bisphenol A and the alkyleneoxide adducts thereof, di- or poly-glycidyl ethers of hydrogenated bisphenol A and the alkyleneoxide adducts thereof, novolak epoxy resins, and the like. Here, examples of the alkyleneoxides include ethyleneoxide, propyleneoxide, and the like.

Alicyclic epoxides are preferably cyclohexene oxide or cyclopentene oxide-containing compounds that are produced by epoxidizing a compound having at least one cycloalkane ring such as cyclohexene and cyclopentene ring with an appropriate oxidizing agent such as hydrogen peroxide and peracid.

The aliphatic epoxides include di- or polyglycidyl ethers of aliphatic polyhydric alcohol or an alkylene oxide adduct thereof and the like. Representative examples thereof include diglycidyl ethers of alkylene glycols such as diglycidyl ether of ethylene glycol, diglycidyl ether of propylene glycol or diglycidyl ether of 1,6-hexanediol; polyglycidyl ethers of polyhydric alcohol such as di- or triglycidyl ethers of glycerine or an alkylene oxide adduct thereof; and diglycidyl ethers of polyalkylene glycols such as diglycidyl ethers of polyethylene glycol or an alkylene oxide adduct thereof, diglycidyl ethers of polypropylene glycol or an alkylene oxide adduct thereof. Here, examples of the alkylene oxide include ethylene oxide and propylene oxide.

Monofunctional and multifunctional epoxy compounds usable in the invention will be exemplified in detail.

Examples of the monofunctional epoxy compounds include phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monoxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide, and 3-vinylcyclohexene oxide.

Further, examples of the multifunctional epoxy compounds include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolak resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-metha-dioxane, bis(3,4-epoxycyclohexylmethyl)adipate, vinylcyclohexene oxide, 4-vinylepoxycyclohexane, bis(3,4-epoxy-6-methylcyclohexylmethyl)adipate, 3,4-epoxy-6-methylcyclohexyl-3',4'-epoxy-6'-methylcyclohexane carboxylate, methylenebis(3,4-epoxycyclohexane), dicyclopentadiene diepoxide, ethylene glycol di(3,4-epoxycyclohexylmethyl)ether, ethylenebis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers, 1,1,3-tetradecadiene dioxide, limonene dioxide, 1,2,7,8-diepoxy octane, and 1,2,5,6-diepoxy cyclooctane.

Among these epoxy compounds, the aromatic epoxides and alicyclic epoxides are preferable since they are excellent in the curing rate. The alicyclic epoxides are particularly preferable.

Examples of the vinyl ether compounds include di- or trivinyl ether compounds such as ethylene glycol divinyl ether, diethylene glycol divinyl ether, triethylene glycol divinyl ether, propylene glycol divinyl ether, dipropylene glycol divinyl ether, butanediol divinyl ether, hexanediol divinyl ether, cyclohexanedimethanol divinyl ether and trimethylolpropane trivinyl ether; and monovinyl ether compounds such as ethyl vinyl ether, n-butyl vinyl ether, iso-butyl vinyl ether, octadecyl vinyl ether, cyclohexyl vinyl ether, hydroxybutyl vinyl ether, 2-ethylhexyl vinyl ether, cyclohexanedimethanol monovinyl ether, n-propyl vinyl ether, iso-propyl vinyl ether, iso-propenyl ether-O-propylene carbonate, dodecyl vinyl ether, diethylene glycol monovinyl ether and octadecyl vinyl ether.

Hereinafter, monofunctional and multifunctional vinyl ethers will be exemplified in detail.

Examples of the monofunctional vinyl ethers include methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexyl methyl vinyl ether, 4-methylcyclohexylmethyl vinyl ether, benzyl vinyl ether, dicyclopentenyl vinyl ether, 2-dicyclopentenoxy ethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxy polyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethyl cyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxy polyethylene glycol vinyl ether.

Further, examples of multifunctional vinyl ethers include: divinyl ethers such as ethylene glycol divinyl ether, diethylene glycol divinyl ether, polyethylene glycol divinyl ether, propylene glycol divinyl ether, butylene glycol divinyl ether, hexanediol divinyl ether, bisphenol A alkylene oxide divinyl ether, and bisphenol F alkylene oxide divinyl ether; and multifunctional vinyl ethers such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, ethylene oxide-added trimethylolpropane trivinyl ether, propylene oxide-added trimethylolpropane trivinyl ether, ethylene oxide-added ditrimethylolpropane tetravinyl ether, propylene oxide-added ditrimethylolpropane tetravinyl ether, ethylene oxide-added pentaerythritol tetravinyl ether, propylene oxide-added pentaerythritol tetravinyl ether, ethylene oxide-added dipentaerythritol hexavinyl ether, and propylene oxide-added dipentaerythritol hexavinyl ether.

From the viewpoint of curing properties, adhesion to a recording medium, and the surface hardness of an image formed, the vinyl ether compound is preferably a di- or trivinyl ether compound, particularly preferably a divinyl ether compound.

As the oxetane compound in the present invention, any one of known oxetane compounds such as described in JP-A Nos. 2001-220526, 2001-310937, and 2003-341217 may be selected and used.

The oxetane ring-containing compound for using with the specific polymerizable compound A of the present invention is preferably a compound having 1 to 4 oxetane rings in its structure. By using such a compound, the viscosity of the composition can be readily kept within a range of excellent handling properties, and high adhesiveness of the cured composition onto the recording medium can be obtained, when it is applied in ink composition and the like.

Examples of the compounds having one or two oxetane rings in the molecule that are used additionally in the present invention include the compounds represented by the following Formulae (1) to (3), and the like.

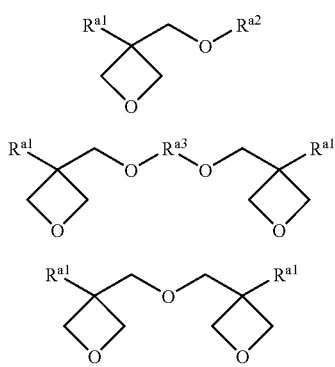

(1)

(2)

(3)

$R^{a1}$ represents a hydrogen atom, an alkyl group having 1 to 6 carbon atoms, a fluoroalkyl group having 1 to 6 carbon atoms, an allyl group, an aryl group, a furyl group, or a thienyl group. If there are two $R^{a1}$ in a molecule, they may be the same or different.

Examples of the alkyl group include a methyl group, an ethyl group, a propyl group, and a butyl group. Preferred examples of the fluoroalkyl group include the alkyl groups wherein any one of hydrogens is substituted with the fluorine atom.

$R^{a2}$ represents a hydrogen atom, an alkyl group having 1 to 6 carbon atoms, an alkenyl group having 2 to 6 carbon atoms, a group having one or more aromatic rings, an alkylcarbonyl group having 2 to 6 carbon atoms, an alkoxycarbonyl group having 2 to 6 carbon atoms, and an N-alkylcarbamoyl group having 2 to 6 carbon atoms.

Examples of the alkyl group include a methyl group, an ethyl group, a propyl group, and a butyl group. Examples of the alkenyl group include a 1-propenyl group, a 2-propenyl group, a 2-methyl-1-propenyl group, a 2-methyl-2-propenyl group, a 1-butenyl group, a 2-butenyl group, and a 3-butenyl group. Examples of the group having one or more aromatic rings include a phenyl group, a benzyl group, a fluorobenzyl group, a methoxybenzyl group, and a phenoxyethyl group.

Examples of the alkylcarbonyl group include an ethylcarbonyl group, a propylcarbonyl group, and a butylcarbonyl group. Examples of the alkoxycarbonyl group include an ethoxycarbonyl group, a propoxycarbonyl group, and a butoxycarbonyl group. Examples of the N-alkylcarbamoyl group include an ethylcarbamoyl group, a propylcarbamoyl group, a butylcarbamoyl group, and a pentylcarbamoyl group.

Further, $R^{a2}$ may have the substituent and examples of the substituent include an alkyl group having 1 to 6 carbon atoms and a fluorine atom.

$R^{a3}$ represents a linear or branched alkylene group, a linear or branched poly(alkyleneoxy) group, a linear or branched unsaturated hydrocarbon group, a carbonyl groups or an alkylene group including one or more carbonyl groups, or one or more carboxyl groups, an alkylene group including one or more carbamoyl groups, or the following groups. Examples of the alkylene group include an ethylene group, a propylene group, and a butylene group. Examples of the poly(alkyleneoxy) group include a poly (ethyleneoxy) group and a poly (propyleneoxy) group.

Examples of the unsaturated hydrocarbon group include a propenylene group, a methylpropenylene group, and a butenylene group.

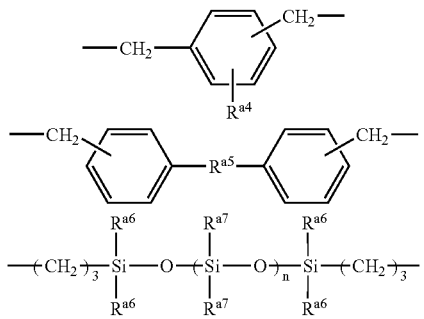

When $R^{a4}$ is a polyvalent group, $R^{a4}$ represents a hydrogen atom, an alkyl group having 1 to 4 carbon atoms, an alkoxy group having 1 to 4 carbon atoms, a halogen atom, a nitro group, a cyano group, a mercapto group, a lower alkylcarboxyl group, a carboxyl group, or a carbamoyl group.

$R^{a5}$ represents an oxygen atom, a sulfur atom, a methylenegroup, NH, SO, $SO_2$, $C(CF_3)_2$, or $C(CH_3)_2$.

$R^{a6}$ represents an alkyl group having 1 to 4 carbon atoms or an aryl group. n is an integer of 0 to 2000.

$R^{a7}$ represents an alkyl group having 1 to 4 carbon atoms, an aryl group, or a monovalent group having the following structure. In the formula below, $R^{a8}$ represents an alkyl group having 1 to 4 carbon atoms or an aryl group; m is an integer of 0 to 100.

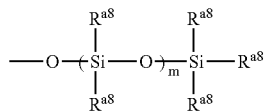

Examples of the compound represented by Formula (1) include 3-ethyl-3-hydroxymethyloxetane (trade name: OXT-101, available from Toagosei Co., Ltd.), 3-ethyl-3-(2-ethylhexyloxymethyl)oxetane (trade name: OXT-212, available from Toagosei Co., Ltd.), and 3-ethyl-3-phenoxymethyloxetane (trade name: OXT-211, available from Toagosei Co., Ltd.). Examples of the compound represented by Formula (2) include 1,4-bis[(3-ethyl-3-oxetanylmethoxy)methyl]benzene (trade name: OXT-121, available from Toagosei Co., Ltd.).

Examples of the compound having 3 to 4 oxetane rings include the compounds represented by the following Formula (4).

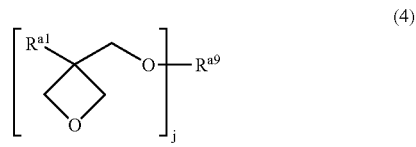

(4)

In Formula (4), $R^{a1}$ is synonymous with $R^{a1}$ in Formula (1). $R^{a9}$ represents a polyvalent linking group. Examples thereof include a branched alkylene group having 1 to 12 carbon atoms such as groups represented by A to C below, a branched poly(alkyleneoxy)group such as a group represented by D below, and a branched polysiloxy group such as a group represented by E below. J is 3 or 4.

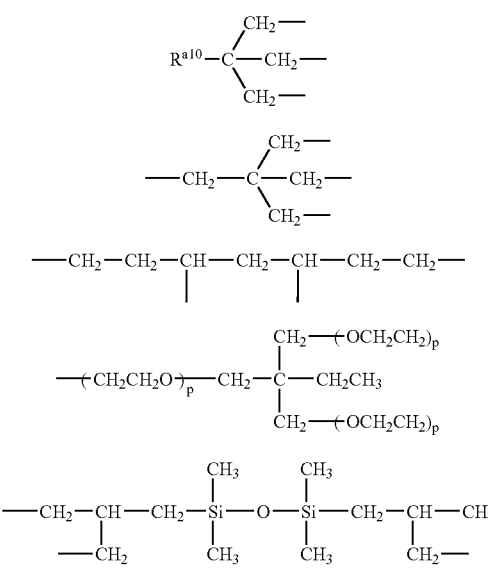

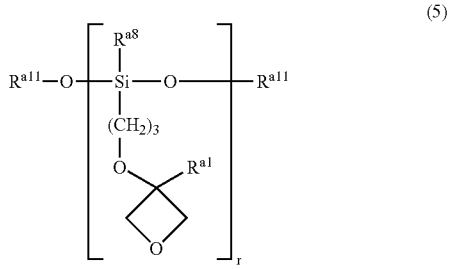

In A, $R^{a10}$ represents a methyl group, an ethyl group, and a propyl group. In D, p is an integer of 1 to 10.

Another mode of the oxetane compound preferably used in the present invention includes a compound represented by Formula (5) having an oxetane ring on the side chain.

In Formula (5), $R^{a1}$ and $R^{a8}$ are synonymous with aforesaid $R^{a1}$ and $R^{a8}$. $R^{a11}$ represents an alkyl group having 1 to 4 carbon atoms such as a methyl group, an ethyl group, a propyl group, or a butyl group, or a trialkylsilyl group. r is 1 to 4.

Examples of such an oxetane ring-containing compounds are described in detail in JP-A No. 2003-341217, paragraphs (0021) to (0084). The compounds described therein can be preferably used in the present invention.

Oxetane compounds described in JP-A No. 2004-91556 may be used together in the present invention. The compounds are described in detail in paragraphs (0022) and (0058) in the document.

Among other oxetane compounds used in the present invention, a compound having one oxetane ring is preferably used from the viewpoint of viscosity and cohesiveness of the ink composition.

In the invention, when the specific polymerizable compound A and another cationic polymerizable compounds are used together, the content ratio between the specific polymerizable compound A and another cationic polymerizable compounds is preferably 10:1 to 10:100, more preferably 10:3 to 10:80, and still more preferably 10:5 to 10:60 in terms of mass ratio.

[Compound that Generates Acid when Irradiated of Radiation]

The curable composition A and the ink composition including the curable composition A preferably contain a compound that generates acid when irradiated with radiation (hereinafter, sometimes referred to as "photochemical acid generator"). In the present invention, the polymerization reaction of the polymerizable compound described above is initiated by the acid generated by irradiation of radiation, and the polymerizable compound is cured by the acid.

As the photochemical acid generator, a photoinitiator for photocationic polymerization, a photoinitiator for photoradical polymerization, a photo-decolorant such as dyes, a photo-decolorant, or a compound that generates an acid by irradiation of rays (ultraviolet rays of 400 to 200 nm, far ultraviolet rays, particularly preferably g rays, h rays, i rays and a KrF excimer laser) which are used for microresist and the like, an ArF excimer laser, electron beam, X-rays, molecular beam or ion beam may be appropriately selected and used.

Examples of the photochemical acid generators include onium salt compounds such as diazonium salts, phosphonium salts, sulfonium salts and iodonium salts and sulfonate compounds such as imidosulfonates, oxime sulfonates, diazodisulfones, disulfones, and o-nitrobenzyl sulfonates that decompose and generate acid by irradiation of radiation.

Other examples of the compound that generates an acid by irradiation of radiation or other activated light (photochemical acid generators) used in the present invention include the diazonium salts described in S. I. Schlesinger, Photogr. Sci. Eng., 18,387 (1974), T. S. Bal et al., Polymer, 21,423 (1980), and the like; the ammonium salts described in U.S. Pat. Nos. 4,069,055, 4,069,056, and Re 27992, JP-A No. 3-140140, and the like; the phosphonium salts described in D. C. Necker et al., Macromolecules, 17, 2468 (1984), C. S. Wen et al., Teh, Proc. Conf. Rad. Curing ASIA, p. 478 Tokyo, October (1988), U.S. Pat. Nos. 4,069,055 and 4,069,056, and the like; the iodonium salts described in J. V. Crivello et al., Macromolecules, 10(6), 1307 (1977), Chem. & Eng. News, Nov. 28, p. 31 (1988), EP Nos. 104,143, 339,049, and 410,201, JP-A Nos. 2-150848 and 2-296514, and the like; the sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 2,877 (1979), EP Nos. 370,693, 161,811, 410,201, 339,049, 233, 567, 297,443, and 297,442, U.S. Pat. Nos. 3,902,114, 4,933, 377, 4,760,013, 4,734,444, and 2,833,827, German Patent Nos. 2,904,626, 3,604,580, and 3,604,581, JP-A Nos. 7-28237 and 8-27102, and the like; Macromolecules, 10(6), 1307 (1977), J. V. Crivello et al., J. Polymer Sci., Polymer Chem. Ed., 17, 1047 (1979), and the like; the onium salts such as arsonium salts described in C. S. Wen et al., Teh, Proc. Conf. Rad. Curing ASIA, p. 478 Tokyo, October (1988), and the like; the organic halogen compounds described in U.S. Pat. No. 3,905,815, JP-B No. 46-4605, JP-A Nos. 48-36281, 55-32070, 60-239736, 61-169835, 61-169837, 62-58241, 62-212401, 63-70243, and 63-298339, and the like; the organic metals/organic halides described in K. Meier et al., J. Rad. Curing, 13(4), 26 (1986), T. P. Gill et al., Inorg. Chem., 19, 3007 (1980), D. Astruc, Acc. Chem. Res., 19 (12), 377 (1896), JP-A No. 2-161445, and the like; protecting group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2,205 (1973), D.

H. R. Barton et al., J. Chem. Soc., 3,571 (1965), P. M. Collins et al., J. Chem. Soc., Perkin I, 1,695 (1975), M. Rudinstein et al., Tetrahedron Lett., (17), 1,445 (1975), J. W. Walker et al., J. Am. Chem. Soc., 110, 7170 (1988), S. C. Busman et al., J. Imaging Technol., 11(4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), EP Nos. 0,290,750, 046,083, 156,535, 271,851, and 0,388,343, U.S. Pat. Nos. 3,901,710 and 4,181,531, JP-A Nos. 60-198538 and 53-133022, and the like; the sulfone compounds that photodecompose and generate acid such as iminosulfonates described in M. Tunooka et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints Japan, 37(3), EP Nos. 0,199,672, 84,515, 044,115, 618,564, and 0,101,122, U.S. Pat. Nos. 4,371,605 and 4,431,774, JP-A Nos. 64-18143, 2-245756, and 3-140109, and the like; the disulfonated compounds described in JP-A Nos. 61-166544 and 2-71270, and the like; and the diazoketosulfone and diazodisulfonated compounds described in JP-A Nos. 3-103854, 3-103856, and 4-210960 and the like.

In addition, compounds having a group generating acid by the light described above or polymers having such a compound in the main chain or on the side, including those described in M. E. Woodhouse et al., J. Am. Chem. Soc., 104, 5586 (1982), S. P. Pappas et al., J. Imaging Sci., 30 (5), 218 (1986), S. Kondo et al., Macromol. Chem., Rapid Commun., 9, 625 (1988), Y. Yamada et al., Macromol. Chem., 152, 153, 163 (1972), J. V. Crivello et al., J. Polymer Sci., Polymer Chem. Ed., 17, 3845 (1979), U.S. Pat. No. 3,849,137, German Patent No. 3,914,407 JP-A Nos. 63-26653, 55-164824, 62-69263, 63-146038, 63-163452, 62-15,853, and 63-146029, and the like, may also be used. Examples thereof include onium salts such as diazonium salts, ammonium salts, phosphonium salts, iodonium salts, sulfonium salts, selenoniums salts, and arsonium salts; organic halogen compounds, organic metals/organic halides, o-nitrobenzyl protecting group-containing photochemical acid generators, sulfone compounds that generates acid by photochemical decomposition such as iminosulfonates, disulfonated compounds, diazoketosulfones, and diazodisulfonated compounds.

Further, compounds that generate acid by light described in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 3,779,778, EP No. 126,712, and the like may also be used.

Preferred examples of the photochemical acid generators for use in the present invention include the compounds represented by the following Formulae (b1), (b2), and (b3).

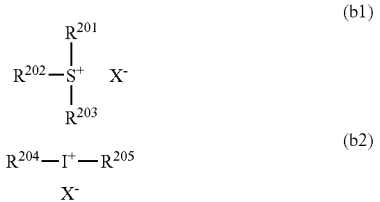

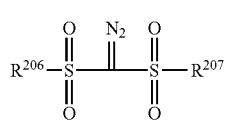

In Formula (b1), $R^{201}$, $R^{202}$ and $R^{203}$ each independently represents an organic group.

$X^-$ represents a non-nucleophilic anion, and is preferably a sulfonate anion, carboxylate anion, bis(alkylsulfonyl)amide anion, tris(alkylsulfonyl)methide anion, $BF_4^-$, $PF_6^-$, $SbF_6^-$ or a group shown below, preferably an organic anion having one or more carbon atoms.

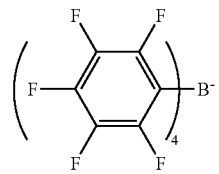

Preferred examples of the organic anion include the organic anions represented by the following Formulae.

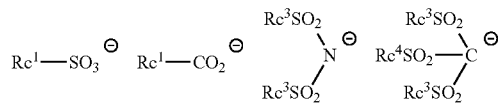

In the formulae above, $Rc^1$ represents an organic group. The organic group represented by $Rc^1$ includes a group having 1 to 30 carbon atoms, and preferably an alkyl group, a cycloalkyl group, an aryl group, or a group wherein two or more of these groups are linked each other via a single bond or a linking group such as, —O—, —$CO_2$—, —S—, —$SO_3^-$, or —$SO_2N(Rd^1)$-.

$Rd^1$ represents a hydrogen atom or an alkyl group. $Rc^3$, $Rc^4$, and $Rc^5$ each independently represent an organic group. The organic group represented by $Rc^3$, $Rc^4$, or $Rc^5$ is preferably the same as the preferred organic group in $Rc^1$, and particularly preferably a perfluoroalkyl group having 1 to 4 carbon atoms. $Rc^3$ and $Rc^4$ may combine with each other to form a ring. The group formed by bonding $Rc^3$ and $Rc^4$ includes an alkylene group and an arylene group, and is preferably a perfluoroalkylene group having 2 to 4 carbon atoms.

The organic group represented by $Rc^1$ and $Rc^3$ to $Rc^5$ is most preferably an alkyl group with the 1-position being substituted by a fluorine atom or a fluoroalkyl group, or a phenyl group substituted by a fluorine atom or a fluoroalkyl group. By virtue of having a fluorine atom or a fluoroalkyl group, the acidity of the acid generated upon light irradiation is increased and the sensitivity is enhanced.

The number of carbon atoms in the organic group represented by $R^{201}$, $R^{202}$ or $R^{203}$ is generally 1 to 30, preferably 1 to 20. Further, two groups of $R^{201}$ to $R^{203}$ may combine with each other to form a ring structure, and the ring may contain an oxygen atom, a sulfur atom, an ester bond, an amide bond, or a carbonyl group. Examples of the group formed by bonding two groups of $R^{201}$ to $R^{203}$ include an alkylene group (e.g., a butylene group, and a pentylene group).

Specific examples of the organic group represented by $R^{201}$, $R^{202}$ or $R^{203}$ include corresponding groups in the compounds (b1-1), (b1-2), and (b1-3) described below.

The photochemical acid generator may be a compound having multiple groups in the structure represented by Formula (b1). For example, it may be a compound having a structure wherein at least one of $R^{201}$ to $R^{203}$ in the compound represented by Formula (b1) is bond, directly or via a linking group, to at least one of $R^{201}$ to $R^{203}$ in the other compound represented by Formula (b1).

The component (b1) is more preferably a compound (b1-1), (b1-2), or (b1-3) described below.

The compound (b1-1) is an arylsulfonium compound where at least one of $R^{201}$ to $R^{203}$ in Formula (b1) is an aryl group, that is, a compound having an arylsulfonium ion as its cation.

All of $R^{201}$ to $R^{203}$ in the arylsulfonium compound may be aryl groups; or alternatively, one or two of $R^{201}$ to $R^{203}$ may be aryl groups and the other is an alkyl or cycloalkyl group.

Examples of the arylsulfonium compound include a triarylsulfonium compound, a diarylalkylsulfonium compound, an aryldialkylsulfonium compound, a diarylcycloalkylsulfonium compound, an aryldicycloalkylsulfonium compound, and the like.

The aryl group in the arylsulfonium compounds is preferably an aryl group such as a phenyl group and a naphthyl group, or a heteroaryl group such as an indole residue and a pyrrole residue, and more preferably a phenyl group and an indole residue. When the arylsulfonium compound has two or more aryl groups, these two or more aryl groups may be the same as or different from each other.

The alkyl group that the arylsulfonium compound may have as needed is preferably a linear or branched alkyl group having 1 to 15 carbons, and examples thereof include a methyl group, an ethyl group, a propyl group, a n-butyl group, a sec-butyl group, and a t-butyl group, and the like.

The cycloalkyl group that the arylsulfonium compound may have as needed is preferably a cycloalkyl group having 3 to 15 carbons, and examples thereof include a cyclopropyl group, a cyclobutyl group, and a cyclohexyl group, and the like.

The aryl group, alkyl group, or cycloalkyl group represented by $R^{201}$ to $R^{203}$ may have, as a substituent, an alkyl group (e.g., that having 1 to 15 carbon atoms), a cycloalkyl group (e.g., that having 3 to 15 carbon atoms), an aryl group (e.g., that having 6 to 14 carbon atoms), an alkoxy group (e.g., that having 1 to 15 carbon atoms), a halogen atom, a hydroxyl group, or a phenylthio group. Preferable examples of the substituent group include a linear or branched alkyl group having 1 to 12 carbons, a cycloalkyl group having 3 to 12 carbons, and a linear, branched or cyclic alkoxy group having 1 to 12 carbons; and most preferable is an alkyl group having 1 to 4 carbons and an alkoxy group having 1 to 4 carbons. The substituent may be substituted to a any one of $R^{201}$ to $R^{203}$, or may be substituted all of these three members. In case where $R^{201}$ to $R^{203}$ represents an aryl group, the substituent group is preferably substituted at the p-position in the aryl group.

Hereinafter, the compound (b1-2) will be described.

The compound (b1-2) is a compound where $R^{201}$ to $R^{203}$ in Formula (b1) each independently represent an organic group containing no aromatic ring. The aromatic ring as used herein also includes an aromatic ring containing a heteroatom.

The organic group containing no aromatic ring represented by $R^{201}$ to $R^{203}$ generally has 1 to 30 carbon atoms, preferably 1 to 20 carbon atoms.

$R^{201}$ to $R^{203}$ each independently represent preferably an alkyl group, a cycloalkyl group, an allyl group, or a vinyl group, more preferably a linear, branched or cyclic 2-oxoalkyl group or an alkoxycarbonylmethyl group, and particularly preferably a linear or branched 2-oxoalkyl group.

The alkyl group represented by $R^{201}$ to $R^{203}$ may be a linear or branched group, and is preferably a linear or branched alkyl group having 1 to 10 carbon atoms (for example, a methyl group, an ethyl group, a propyl group, a butyl group, and a pentyl group), more preferably a linear or branched 2-oxoalkyl group or an alkoxycarbonylmethyl group.

The cycloalkyl group represented by $R^{201}$ to $R^{203}$ is preferably a cycloalkyl group having 3 to 10 carbon atoms (such as a cyclopentyl group, a cyclohexyl group, and a norbornyl group), more preferably a cyclic 2-oxoalkyl group.

The linear, branched or cyclic 2-oxoalkyl group represented by $R^{201}$ to $R^{203}$ is preferably an alkyl group described above or a cycloalkyl group having $>C=O$ at the 2 position.

The alkoxy group in the alkoxycarbonylmethyl group represented by $R^{201}$ to $R^{203}$ is preferably an alkoxy group having 1 to 5 carbon atoms (such as a methoxy group, an ethoxy group, a propoxy group, a butoxy group, and a pentoxy group).

$R^{201}$ to $R^{203}$ each may be further substituted by a halogen atom, an alkoxy group (e.g., having 1 to 5 carbon atoms), a hydroxyl group, a cyano group, or a nitro group.

The Compound (b1-3) is a compound represented by the following Formula (b1-3) having a phenacylsulfonium salt structure.

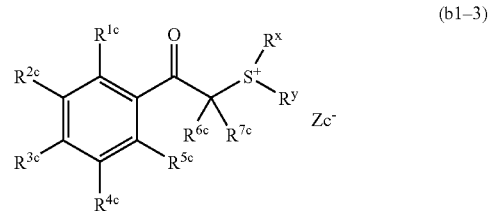

(b1-3)

In Formula (b1-3), $R^{1c}$ to $R^{5c}$ each independently represent a hydrogen atom, an alkyl group, a cycloalkyl group, an alkoxy group, or a halogen atom.

$R^{6c}$ and $R^{7c}$ each independently represent a hydrogen atom or an alkyl group or a cycloalkyl group.

$R^x$ and $R^y$ each independently represent an alkyl group, a cycloalkyl group, an allyl group, or a vinyl group.

Any two or more members of $R^{1c}$ to $R^{5c}$, or each pair of $R^{6c}$ and $R^{7c}$, and $R^x$ and $R^y$ may combine with each other to form a ring structure.

$Zc^-$ represents a non-nucleophilic anion, and examples thereof are the same as those of the non-nucleophilic anions of $X^-$ in Formula (b1).

The alkyl group represented by $R^{1c}$ to $R^{7c}$ may be a linear or branched group, and is, for example, a linear and branched alkyl group having 1 to 20 carbon atoms, preferably having 1 to 12 carbon atoms (such as a methyl group, an ethyl group, a linear or branched propyl group, a linear or branched butyl group, or a linear or branched pentyl group).

The cycloalkyl group represented by $R^{1c}$ to $R^{7c}$ is preferably, for example, a cycloalkyl group having 3 to 8 carbon atoms (such as a cyclopentyl group and a cyclohexyl group).

The alkoxy group represented by $R^{1c}$ to $R^{5c}$ may be a linear, branched or cyclic group, and is preferably, for example, an alkoxy group having 1 to 10 carbon atoms, preferably, a linear or branched alkoxy group having 1 to 5 carbon atoms (such as a methoxy group, an ethoxy group, a linear or branched propoxy group, a linear or branched butoxy group, and a linear or branched pentoxy group) and a cyclic alkoxy group having 3 to 8 carbon atoms (such as a cyclopentyloxy group and a cyclohexyloxy group).

The group formed by bonding any two or more members of $R^{1c}$ to $R^{5c}$, or each pair of $R^{6c}$ and $R^{7c}$, and $R^x$ and $R^y$ include a butylene group, a pentylene group. The ring structure may contain an oxygen atom, a sulfur atom, an ester bond, or an amide bond.

Preferably, any one of $R^{1c}$ to $R^{5c}$ is a linear or branched alkyl group, a cycloalkyl group, or a linear or branched acyclic alkoxy group, and more preferably, the sum of the numbers of carbons of $R^{1c}$ to $R^{5c}$ is 2 to 15. Such a structure is favorable, because it improves solvent solubility and prevents particle generation during storage.

The alkyl or cycloalkyl group represented by $R^x$ and $R^y$ is the same as the alkyl or cycloalkyl group represented by $R^{1c}$ to $R^{7c}$.

Each of $R^x$ and $R^y$ is preferably a 2-oxoalkyl group or an alkoxycarbonylmethyl group.

Examples of the 2-oxoalkyl groups include the alkyl or cycloalkyl group represented by $R^{1c}$ to $R^{5c}$ having >C=O at the 2 position.

The alkoxy group in the alkoxycarbonylmethyl group is the same as the alkoxy group represented by $R^{1c}$ to $R^{5c}$.

Each of $R^x$ and $R^y$ is preferably an alkyl or cycloalkyl group having 4 or more carbons atoms, more preferably an alkyl or cycloalkyl group having 6 or more carbons atoms, still more preferably 8 or more carbons atoms In Formulae (b2) and (b3), $R^{204}$ to $R^{207}$ each independently represent an aryl group, an alkyl group or a cycloalkyl group. $X^-$ represents a non-nucleophilic anion, and examples thereof include non-nucleophilic anions as same as those of $X^-$ in Formula (b1).

The aryl group represented by $R^{204}$ to $R^{207}$ is preferably a phenyl and naphthyl group, more preferably a phenyl group.

The alkyl group represented by $R^{204}$ to $R^{207}$ may be a linear or branched group, and is preferably, for example, a linear or branched alkyl group having 1 to 10 carbon atoms (such as a methyl group, an ethyl group, a propyl group, a butyl group, and a pentyl group). The cycloalkyl group represented by $R^{204}$ to $R^{207}$ is preferably, for example, a cycloalkyl group having 3 to 10 carbon atoms (such as a cyclopentyl group, a cyclohexyl group, and a norbornyl group).

Examples of the substituent group that $R^{204}$ to $R^{207}$ each may have include an alkyl group (for example, an alkyl group having 1 to 15 carbon atoms), a cycloalkyl group (for example, a cycloalkyl group having 3 to 15 carbon atoms), an aryl group (for example, an aryl group having 6 to 15 carbon atoms), an alkoxy group (for example, an alkoxy group having 1 to 15 carbon atoms), a halogen atom, a hydroxyl group, a phenylthio group, and the like.

Examples of the usable compound that generate an acid by irradiation of activated light or radiation include the compounds represented by the following Formulae (b4), (b5), and (b6).

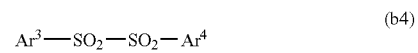

(b4)

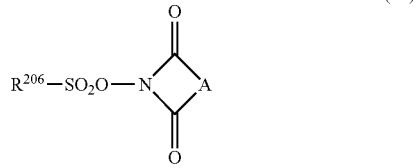

(b5)

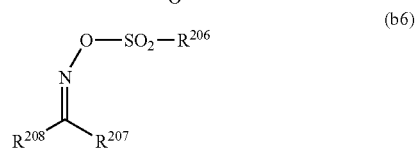

(b6)

In Formulae (b4) to (b6), $Ar^3$ and $Ar^4$ each independently represent an aryl group.

$R^{206}$, $R^{207}$ and $R^{208}$ each independently represent an alkyl group, a cycloalkyl group, or an aryl group.

A represents an alkylene group, an alkenylene group, or an arylene group.

Preferable examples among the photochemical acid generators are the compounds represented by Formulae (b1) to (b3).

Favorable example of the photochemical acid generators (b) [(b-1) to (b-96)] for use in the present invention will be listed below, but the invention is not limited thereto.

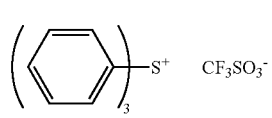

(b-1)

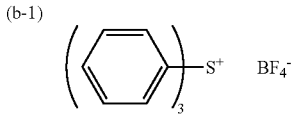

(b-2)

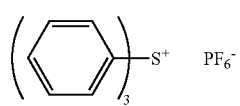

(b-3)

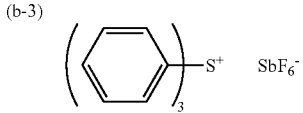

(b-4)

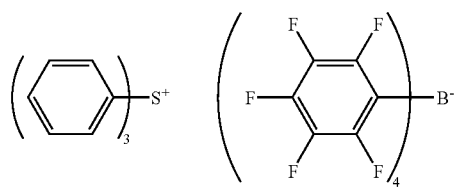

(b-5)

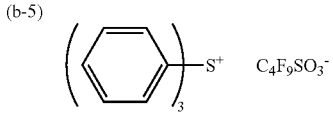

(b-6)

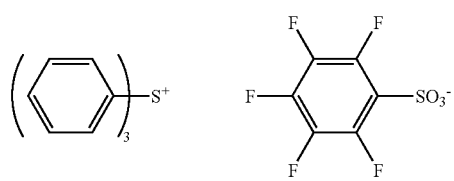 (b-7)
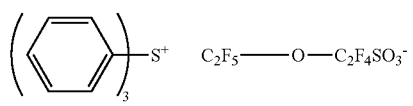 (b-8)
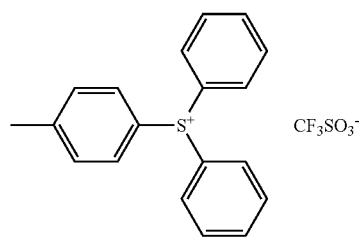 (b-9)
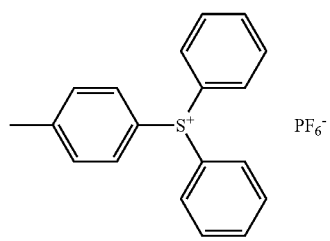 (b-10)
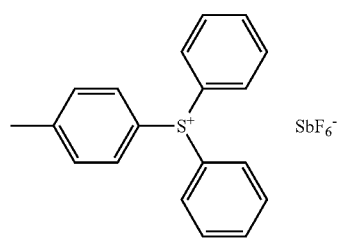 (b-11)
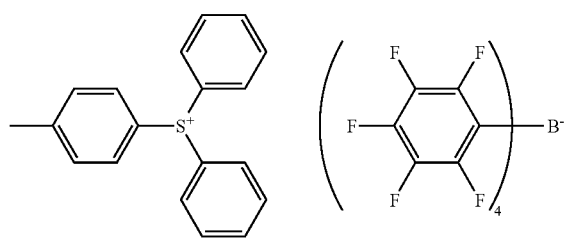 (b-12)
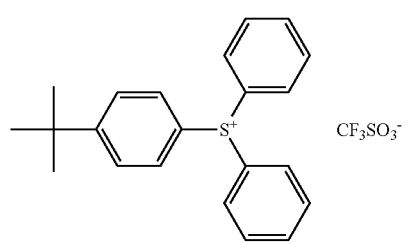 (b-13)
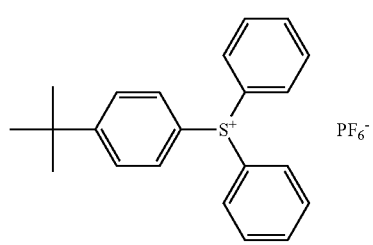 (b-14)
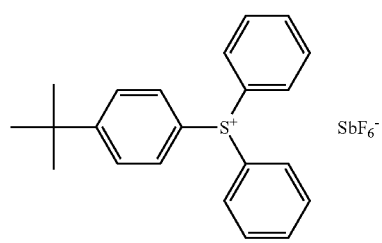 (b-15)
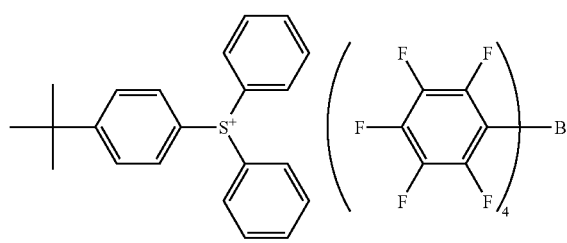 (b-16)
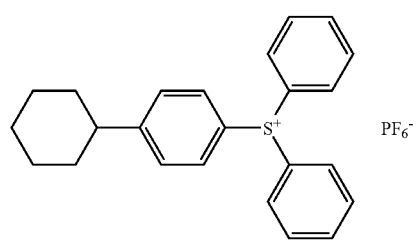 (b-17)
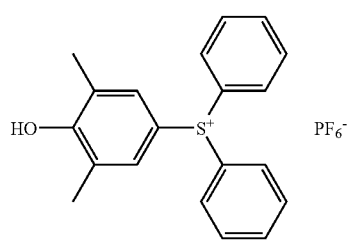 (b-18)

-continued
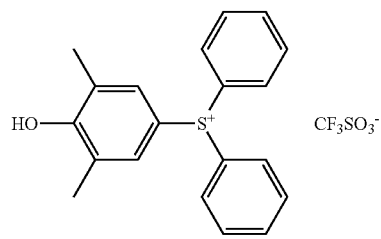 (b-19)
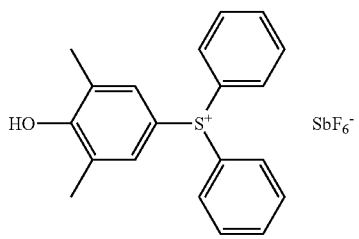 (b-20)
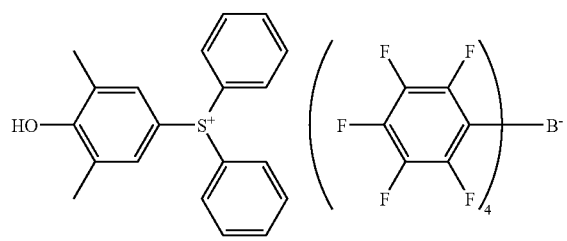 (b-21)
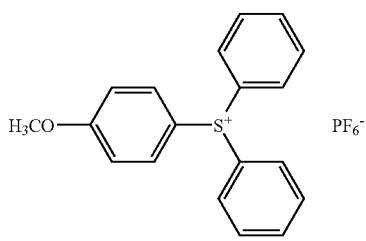 (b-22)
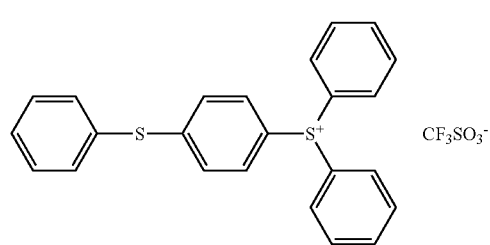 (b-23)
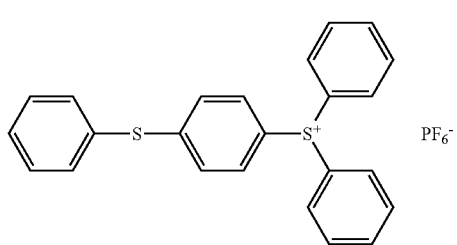 (b-24)
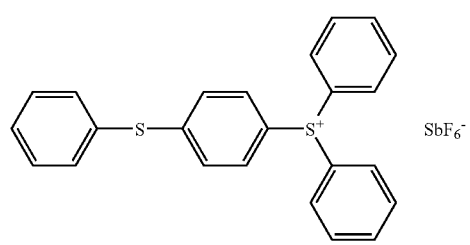 (b-25)
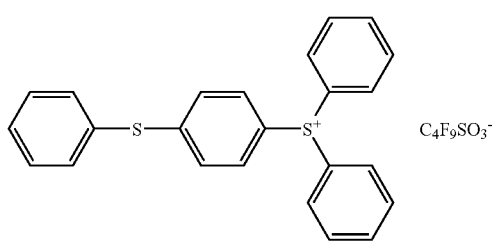 (b-26)
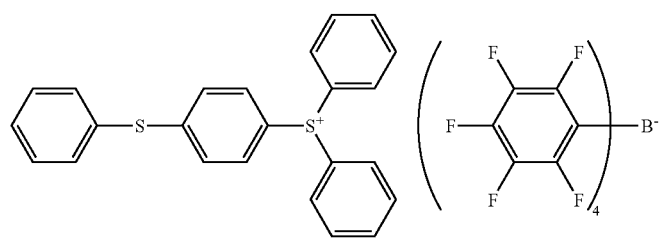 (b-27)
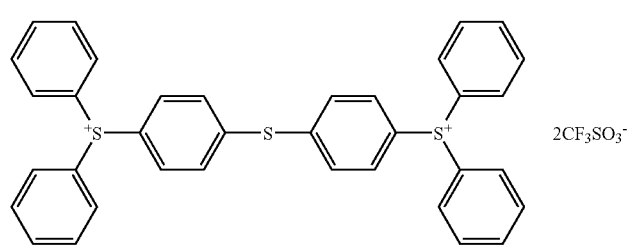 (b-28)

-continued
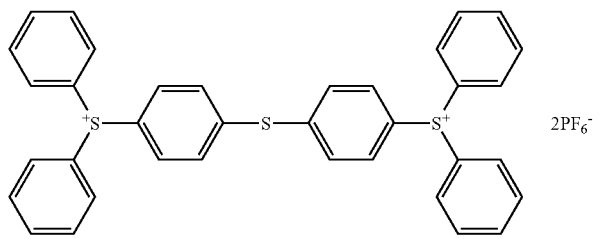 (b-29)
2PF$_6^-$
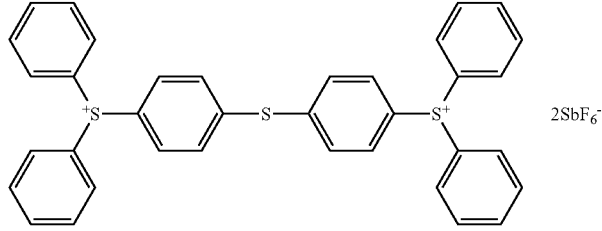 (b-30)
2SbF$_6^-$
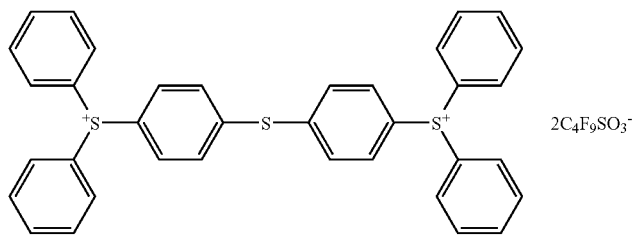 (b-31)
2C$_4$F$_9$SO$_3^-$
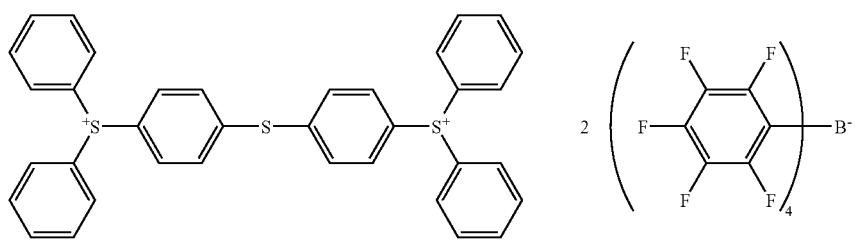 (b-32)
 (b-33) (b-34)
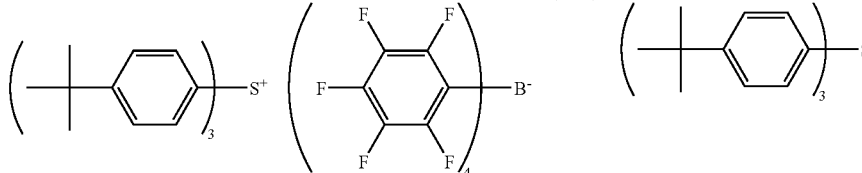 (b-35) (b-36)
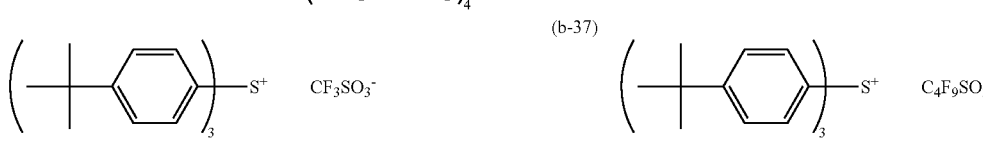 (b-37) (b-38)
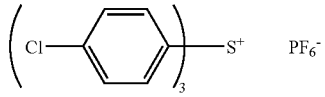 (b-39)
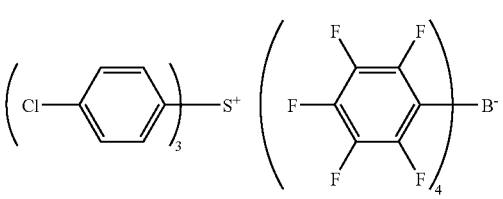 (b-40)

-continued
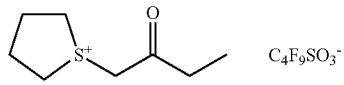 (b-41)
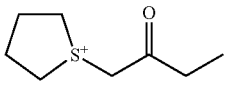 (b-42)
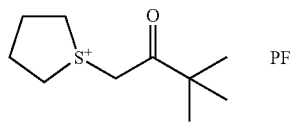 (b-43)
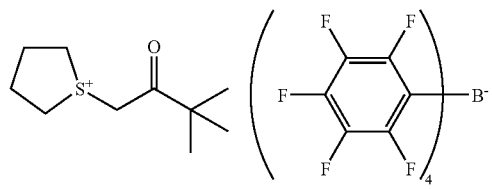 (b-44)
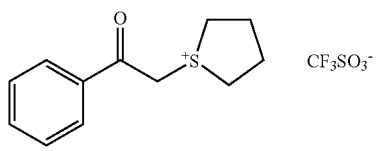 (b-45)
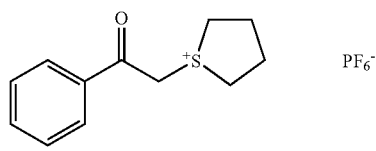 (b-46)
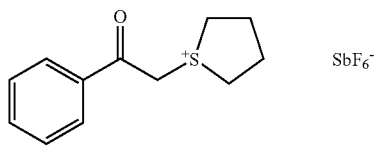 (b-47)
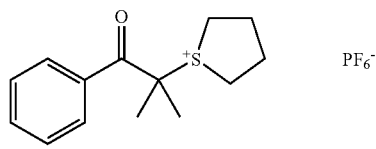 (b-48)
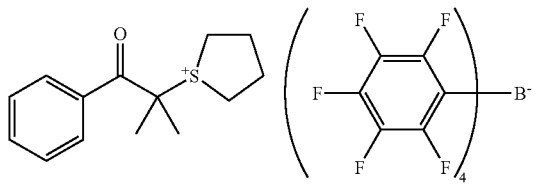 (b-49)
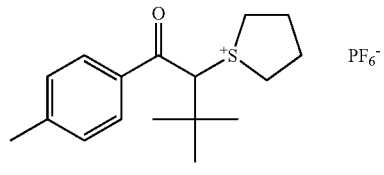 (b-50)
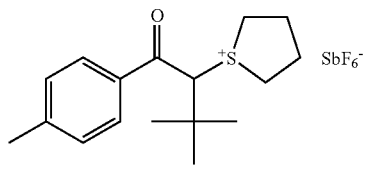 (b-51)
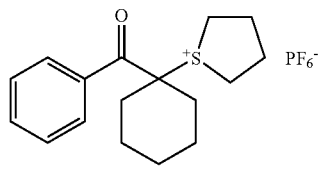 (b-52)
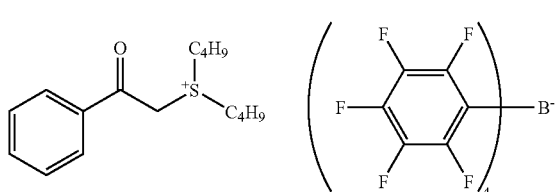 (b-53)
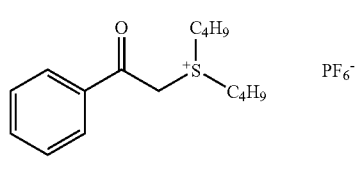 (b-54)
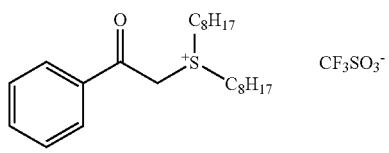 (b-55)
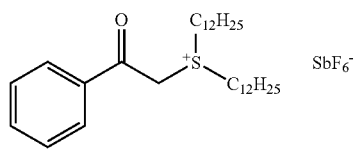 (b-56)
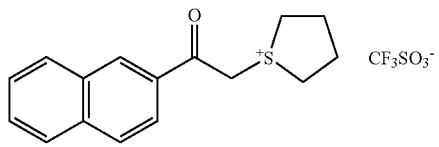 (b-57)
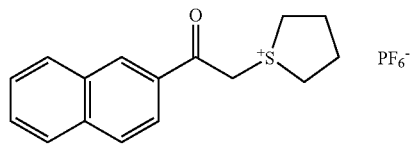 (b-58)

-continued
(b-59)
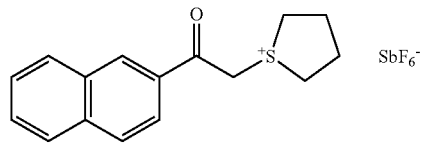
(b-60)
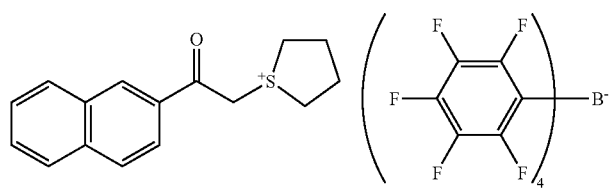
(b-61)
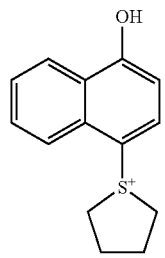
(b-62)
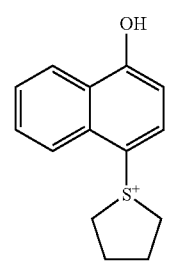
(b-63)
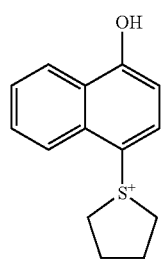
(b-64)
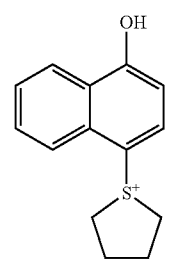
(b-65)
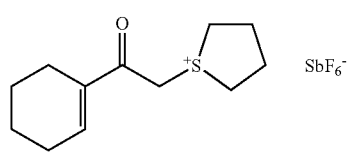
(b-66)
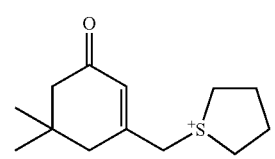
(b-67)
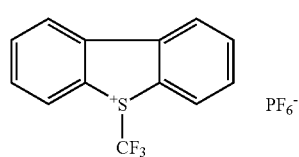
(b-68)
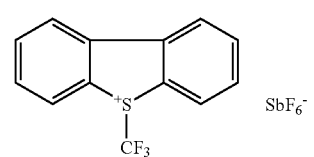
(b-69)
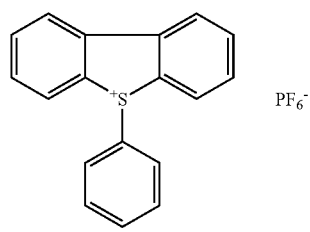
(b-70)
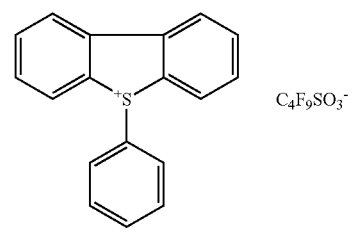
(b-71)
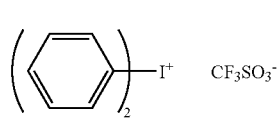
(b-72)
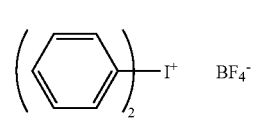

-continued
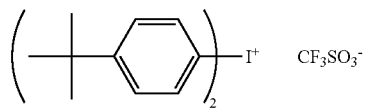 (b-73)
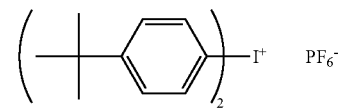 (b-74)
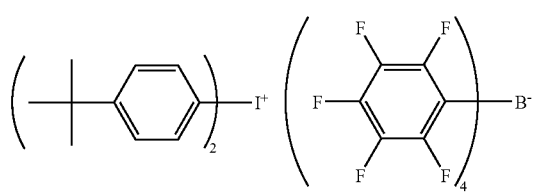 (b-75)
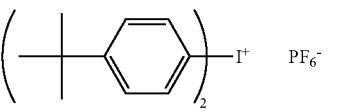 (b-76)
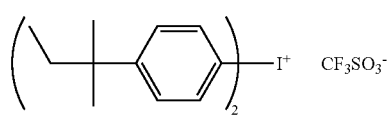 (b-77)
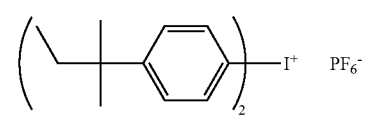 (b-78)
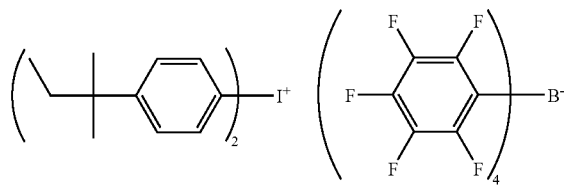 (b-79)
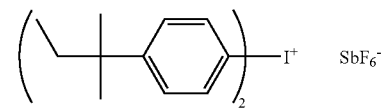 (b-80)
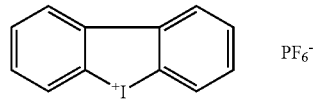 (b-81)
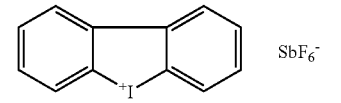 (b-82)
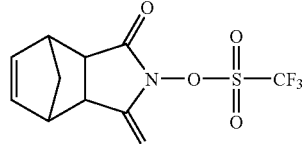 (b-83)
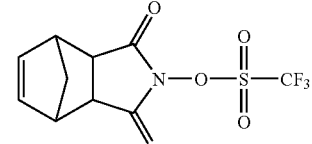 (b-84)
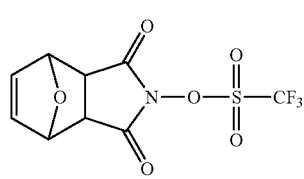 (b-85)
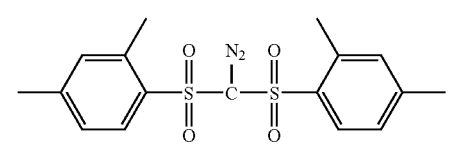 (b-86)
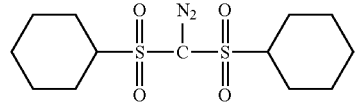 (b-87)
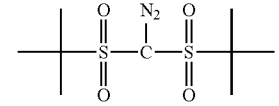 (b-88)
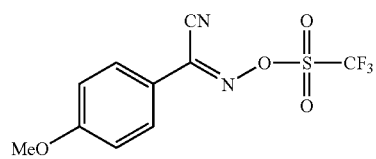 (b-89)
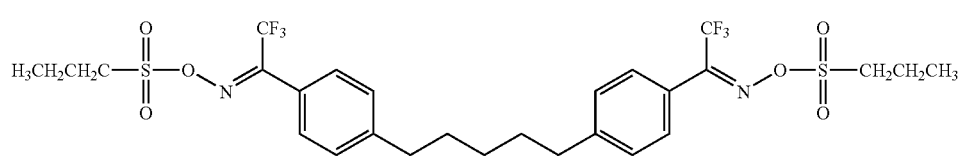 (b-90)

-continued

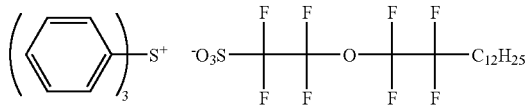
(b-91)

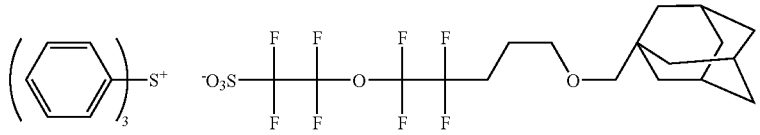
(b-92)

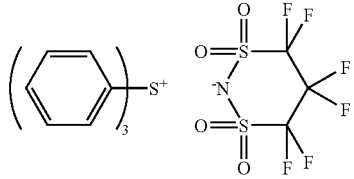
(b-93)

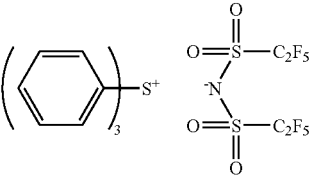
(b-94)

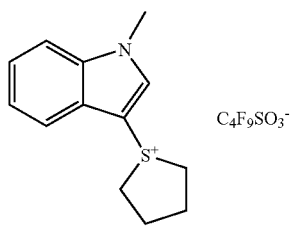
(b-95)

(b-96)

Further, oxazole derivatives and s-triazine derivatives and the like described in JP-A No. 2002-12994, paragraph numbers (0029) to (0030), may be also suitably used.

The onium salts and sulfonate compounds described in JP-A No. 2002-122994, paragraph numbers (0037) to (0063), may be also suitably used in the present invention.

The photochemical acid generator may be used alone or in combination of two or more.

The content of the photochemical acid generator in the curable composition A and the ink composition of the present invention is preferably 0.1 to 20% by mass, more preferably 0.5 to 1% by mass, and still more preferably 1 to 7% by mass, with respect to the total solid matter in the ink composition.

[Colorant]

The curable composition A of the present invention may contain a colorant. Further, the ink composition, which includes the curable composition A, is preferably contains a colorant for forming a colored image.

The colorant usable in the present invention is not particularly limited, and a pigment and an oil-soluble dye with excellent weather resistance and good color reproducibility are preferable. The colorant may be selected from known colorants such as soluble dyes. The colorant suitably used in the ink composition or the ink composition according to the present invention preferably does not function as a polymerization inhibitor in a polymerization reaction being a curing reaction. The reason is that it does not lower the sensitivity of the curing reaction with active radiation.

(Pigment)

The pigment is not particularly limited, and any of the commercially available organic and inorganic pigments, a pigment dispersed in an insoluble resin or the like as a dispersion medium, and a pigment having a resin grafted on the surface thereof can be used. Resin particles dyed with a dye can also be also used.

Examples of the pigments include the pigments described in "Ganryo no Jiten (Pigment dictionary)" ed. by Seishiro Ito, Asakura Shoten (2000), W. Herbst, K. Hunger "Industrial Organic Pigments", JP-A No. 2002-12607, JP-A No. 2002-188025, JP-A No. 2003-26978, and JP-A No. 2003-342503.

Specific examples of the organic and inorganic pigments exhibiting yellow color employable in the present invention, include a monoazo pigment such as C.I. Pigment Yellow 1 (e.g., Fast Yellow G), and C.I. Pigment Yellow 74, a disazo pigment such as C.I. Pigment Yellow 12 (e.g., Disazo Yellow AAA) and C.I. Pigment Yellow 17, a non-benzidine azo pigment such as C.I. Pigment Yellow 180, an azo lake pigment such as C.I. Pigment Yellow 100 (e.g., Tartrazine Yellow Lake), a condensed azo pigment such as C.I. Pigment Yellow 95 (e.g., Condensed Azo Yellow GR), an acidic dye lake pigment such as C.I. Pigment Yellow 115 (e.g., Quinoline Yellow Lake), a basic dye lake pigment such as C.I. Pigment Yellow 18 (e.g., Thioflavin Lake), an anthraquinone pigment such as Flavanthrone Yellow (Y-24), an isoindolinone pigment such as Isoindolinone Yellow 3RLT (Y-110), a quinophthalone pigment such as Quinophthalone Yellow (Y-138), an isoindoline pigment such as Isoindoline Yellow (Y-139), a nitroso pigment such as C.I. Pigment Yellow 153 (e.g., Nickel Nitroso Yellow), and a metallic complex azomethine pigment such as C.I. Pigment Yellow 117 (e.g., Copper Azomethine Yellow).

Examples thereof exhibiting red or magenta color include a monoazo pigment such as C.I. Pigment Red 3 (e.g., Toluidine Red), a disazo pigment such as C.I. Pigment Red 38 (e.g., Pyrazolone Red B), an azo lake pigment such as C.I. Pigment Red 53:1 (e.g., Lake Red C) and C.I. Pigment Red 57:1 (e.g., Brilliant Carmine 6B), a condensed azo pigment such as C.I.

Pigment Red 144 (e.g., Condensed Azo Red BR), an acidic dye lake pigment such as C.I. pigment red 174 (e.g., Phloxin B lake), a basic dye lake pigment such as C.I. Pigment Red 81 (e.g., Rhodamine 6G' Lake), an anthraquinone pigment such as C.I. Pigment Red 177 (e.g., Dianthraquinonyl Red), a thioindigo pigment such as C.I. Pigment Red 88 (e.g., Thioindigo Bordeaux), a perynone pigment such as C.I. Pigment Red 194 (e.g., Perynone Red), a perylene pigment such as C.I. Pigment Red 149 (e.g., Perylene Scarlett), a quinacridone pigment such as C.I. Pigment Violet 19 (unsubstituted quinacridone), C.I. Pigment Red 122 (e.g., Quinacridone Magenta), an isoindolinone pigment such as C.I. Pigment Red 180 (e.g., Isoindolinone Red 2BLT), and an alizarin lake pigment such as C.I. Pigment Red 83 (e.g., Madder Lake).

Examples thereof exhibiting blue or cyan color include a disazo pigment such as C.I. Pigment Blue 25 (e.g., Dianisidine Blue), a phthalocyanine pigment such as C.I. Pigment Blue 15 (e.g., Phthalocyanine Blue), an acidic dye lake pigment such as C.I. Pigment Blue 24 (e.g., Peacock Blue Lake), a basic dye lake pigment such as C.I. Pigment Blue 1 (e.g., Victoria Pure Blue BO Lake), an anthraquinone pigment such as C.I. Pigment Blue 60 (e.g., Indanthrone Blue), and an alkali blue pigment such as C.I. Pigment Blue 18 (e.g., Alkali Blue V-5:1).

Examples thereof exhibiting green color include a phthalocyanine pigment such as C.I. Pigment Green 7 (Phthalocyanine Green), C.I. Pigment Green 36 (Phthalocyanine Green), and an azo metal complex pigment such as C.I. Pigment Green 8 (Nitroso Green).

Examples thereof exhibiting orange color include an isoindoline pigment such as C.I. Pigment Orange 66 (Isoindoline Orange) and an anthraquinone pigment such as C.I. Pigment Orange 51 (Dichloropyranthrone Orange).

Examples thereof exhibiting black color include a carbon black, titanium black, and an aniline black.

As specific examples of white pigment, basic lead carbonate ($2PbCO_3 \cdot Pb(OH)_2$, so-called silver white), zinc oxide (ZnO, so-called zinc white), titanium oxide ($TiO_2$, so-called titanium white), and strontium titanate ($SrTiO_3$, so-called titanium strontium white) are employable.

Here, titanium oxide has a less specific gravity and a greater refractive index, and is chemically and physically stable compare to other white pigments. Therefore, it has a greater concealing and tinting power as a pigment, and furthermore has a superior durability against acid, alkali, and other environmental factors. Thus, use of titanium oxide as the white pigment is preferable. Other white pigments (including white pigments other than those described above) may be used as needed.

For dispersing the pigment, any one of dispersing devices such as a ball mill, a sand mill, an attriter, a roll mill, a jet mill, a homogenizer, a paint shaker, a kneader, a agitator, a henschel mixer, a colloid mill, an ultrasonic wave homogenizer, a pearl mill, and a wet jet mill may be used.

Dispersing agents can also be used when a pigment is to be dispersed. Examples of the dispersing agent include hydroxyl group-containing carboxylic acid esters, salts of a long-chain polyaminoamide with a high-molecular weight acid ester, high-molecular weight polycarboxylic acid salts, high-molecular weight unsaturated acid esters, high-molecular weight copolymers, modified polyacrylates, polyvalent aliphatic carboxylic acids, naphthalenesulfonic acid/formalin condensates, polyoxyethylene alkylphosphoric esters, pigment derivatives, and the like. Use of a commercially available polymer dispersing agent such as a SOLSPERSE® series manufactured by Zeneca Co. may be preferably used.

As a dispersing auxiliary agent, a synergist according to a various types of pigments may be used. The dispersing agent and the dispersing auxiliary agent are preferably added in an amount of 1 to 50 parts by mass with respect to 100 parts by mass of the pigment. In the ink composition, a solvent may be added as a dispersion medium for various components such as pigment or alternatively. Further, the cationic polymerizable compound which is a low-molecular weight component, may be used without solvent. Since the ink composition of the invention is applied to a radioactive ray curable ink, and the ink is cured after application on a recording medium, the ink composition is preferably contains no solvent. It is because the solvent remaining in the hardened ink image leads to deterioration in solvent resistance and causes a problem of VOC (Volatile Organic Compound). From the viewpoints above, the polymerizable compound is preferably used as the dispersion medium, and selection of a polymerizable compound lowest in viscosity among them is preferable for improvement in dispersibility and processability of the ink composition.

The average diameter of the pigment is preferably in the range of 0.02 to 0.4 µm, more preferably 0.02 to 0.1 µm, and still more preferably 0.02 to 0.07 µm. The pigment, the dispersant, and dispersion medium are selected and the dispersion and filtration conditions are determined in such a manner that the average diameter of the pigment particles falls in the preferable range above. Control of particle diameter enables prevention of the clogging in head nozzles and preservation of the storage stability, transparency and curing efficiency of ink.

(Dye)

The dye usable in the present invention is preferably an oil-soluble dye. Specifically, the dye preferably has a solubility in water (mass of the colorant dissolved in 100 g of water) of 1 g or less at 25° C., preferably 0.5 g or less, and more preferably 0.1 g or less. Accordingly, so-called water-insoluble and oil-soluble dyes are suitably used.

As for the dyes for use in the present invention, it is preferable to introduce an oil-solubilizing group on the basic dye structure described above, to ensure that the dye is dissolved in the amount needed in the ink composition.

Examples of the oil-solubilizing groups include long-chain branched alkyl groups, long-chain branched alkoxy groups, long-chain branched alkylthio groups, long-chain branched alkylsulfonyl groups, long-chain branched acyloxy groups, long-chain branched alkoxycarbonyl groups, long-chain branched acyl groups, long-chain branched acylamino groups, long-chain branched alkylsulfonylamino groups, long-chain branched alkylaminosulfonyl groups, as well as aryl, aryloxy, aryloxycarbonyl, arylcarbonyloxy, arylaminocarbonyl, arylaminosulfonyl, and arylsulfonylamino groups containing these long-chain branched substituent groups, and the like.

Alternatively, it is also possible to introduce an oil-solubilizing group, such as alkoxycarbony, aryloxycarbonyl, alkylaminosulfonyl or arylaminosulfonyl, on water-soluble dyes containing carboxylic acid or sulfonic acid groups, by using a long-chain branched alcohol, amine, phenol, or aniline derivative.

The oil-soluble dye preferably has a melting point of 200° C. or lower, more preferably 150° C. or lower, and still more preferably 100° C. or lower. Use of a low-melting point oil-soluble dye enables restriction of crystal precipitation of the colorant in ink composition and improvement in storage stability of the ink composition.

The dye preferably has a high oxidation potential, because it improves resistance to deterioration of color, in particular by oxidative substances such as ozone. Thus, the oil-soluble dye for use in the present invention preferably has an oxidation potential of 1.0 V or more (vs. SCE). The oxidation potential is preferably higher, and thus a dye having an oxidation potential of 1.1 V or more (vs. SCE) is more preferably, and that of 1.15 V or more (vs. SCE) particularly preferable.

As the dye exhibiting yellow color, preferred are the compound having a structure represented by Formula (Y-I) described in JP-A 2004-250483.

Example of the dyes particularly preferable include the dyes represented by Formulae (Y-II) to (Y-IV) in JP-A No. 2004-250483, paragraph (0034), and typical examples thereof include the compounds described in JP-A No. 2004-250483, paragraphs (0060) to (0071). The oil-soluble dyes represented by Formula (Y-I) described therein may be used not only in yellow ink, but also in inks in any other colors such as black and red.

As the magenta dyes, the compounds having the structures represented by Formulae (3) and (4) in JP-A No. 2002-114930 are preferable, and specific examples thereof include the compounds described in JP-A No. 2002-114930, paragraphs (0054) to (0073).

Particularly preferable dyes are the azo dyes represented by Formulae (M-1) to (M-2) in JP-A No. 2002-121414, paragraphs (0084) to (0122), and specific examples thereof include the compounds described in JP-A No. 2002-121414, paragraphs (0123) to (0132). The oil-soluble dyes represented by Formulae (3), (4), and (M-1) to (M-2) may be used not only in magenta ink, but also in inks in any other colors such as black and red inks.

As a dyes exhibiting cyan color, preferred are the dyes represented by Formulae (I) to (IV) in JP-A No. 2001-181547 and the dyes represented by Formulae (IV-3) to (IV-4) in JP-A No. 2002-121414, paragraphs (0063) to (0078), and specific examples thereof include the compounds described in JP-A 2001-181547, paragraphs (0052) to (0066) and in JP-A 2002-112414, paragraphs (0079) to (0081).

Particularly preferable dyes are the phthalocyanine dyes represented by Formulae (C-I) and (C-II) described in JP-A No. 2002-121414, paragraphs (0133) to (0196), and sill more preferable dyes are the phthalocyanine dyes represented by Formula (C-II). Specific examples thereof include the compounds described in JP-A No. 2002-121414, paragraphs (0198) to (0201). The oil-soluble dyes represented by Formulae (I) to (IV), (IV-D) to (IV-4), (C-I), and (C-II) may be used not only in cyan ink, but also in inks in any other colors such as black and green inks.

The colorant added in the ink composition including the curable composition A is preferably 1 to 20% by mass, more preferably 2 to 10% by mass in terms of solid contents.

Hereinafter, various additives added as needed to the curable composition A of the invention and the ink composition containing the curable composition A will be described.

[Ultraviolet Absorbent]

An ultraviolet absorbent may be added to the ink composition according to the present invention, for improvement in weather resistance and preventing discoloration of the obtained image (cured material).

Examples of the ultraviolet absorbents include the benzotriazole compounds described in JP-A Nos. 58-185677, 61-190537, 2-782 5-197075 and 9-34057 and the like; the benzophenone compounds described in JP-A Nos. 46-2784 and 5-194483, U.S. Pat. No. 3,214,463 and the like; the cinnamic acid compounds described in JP-B Nos. 48-30492 and 56-21141, JP-A No. 10-88106, and the like; the triazine compounds described in JP-A Nos. 4-298503, 8-53427, 8-239368, 10-182,621, and 8-501291, and the like; the compounds described in Research Disclosure No. 24,239; compounds emitting light by absorbing ultraviolet ray such as stilbene and benzoxazole compounds; so-called fluorescent brighteners; and the like.

The addition amount may be decided suitably according to applications, but is generally, approximately 0.01 to 15% by mass in terms of solid contents.

[Sensitizer]

A sensitizer may be added as needed to the ink composition according to the present invention, for improvement in acid-generating efficiency of the photochemical acid generator and for raising sensitization wavelength.

The sensitizer is not particularly limited, if it sensitizes the photochemical acid generator in the electron- or energy-transfer mechanism. Preferable examples thereof include aromatic fused-ring compounds such as anthracene, 9,10-dialkoxyanthracene, pyrene, and perylene; aromatic ketone compounds such as acetophenone, benzophenone, thioxanthone, and Michler's ketone; and heterocyclic ring compounds such as phenothiazine and N-aryloxazolydinones.

The addition amount is decided properly according to applications, but generally, preferably 0.01 to 1% by mole, more preferably 0.1 to 0.5% by mole, with respect to the photochemical acid generator.

[Anti-Oxidant]

An anti-oxidant may be added in the present invention in order to improve stability of the ink composition Examples of the anti-oxidants include those described in EP Laid-Open Nos. 223,739, 309,401, 309,402, 310,551, 310,552, and 459,416, German Patent Laid-Open No. 3,435, 443 JP-A Nos. 54-48535, 62-262047, 63-113536, 63-163351, 2-262654, 2-71262, 3-121449, 5-61166, and 5-119449, U.S. Pat. Nos. 4,814,262 and 4,980,275, and the like.

The addition amount thereof is decided properly according to applications, but generally, approximately 0.1 to 8% by mass in terms of solid contents.

[Discoloration Inhibitor]

Various organic compounds and metal complexes can be used as discoloration inhibitors in the ink composition according to the present invention.

Examples of the organic discoloration inhibitor include hydroquinones, alkoxyphenols, dialkoxyphenols, phenols, anilines, amines, indanes, chromanes, alkoxyanilines, heterocyclic rings, and the like. Examples of the metal-complex discoloration inhibitors include nickel complexes, zinc complexes, and the like; and typical examples thereof include the compounds described in the patents cited in Research Disclosure No. 17,643 (sections VII-I to J), ibid., No. 15,162, ibid., No. 18,716 (left column on p. 650), ibid., No. 36,544 (p. 527), ibid., No. 307,105 (p. 872), and ibid., No. 15,162; and the compounds included in formula of typical compounds and the exemplary compounds described in JP-A No. 62-215272, pp. 127 to 137.

The addition amount is decided properly according to applications, but generally, approximately 0.1 to 8% by mass in terms of the solid contents.

[Electroconductive Salts]

With the object of controlling the ejecting property, an electroconductive salt such as potassium thiocyanate, lithium nitrate, ammonium thiocyanate, or dimethylamine hydrochloride may be added to the ink composition according to the present invention.

[Solvent]

Addition of an extremely trace amount of organic solvent to the ink composition according to the present invention is effective for improvement in adhesiveness to the recording medium.

Examples of the solvents include ketone solvents such as acetone, methylethylketone, and diethylketone; alcohol solvents such as methanol, ethanol, 2-propanol, 1-propanol, 1-butanol, and tert-butanol; chlorine-based solvents such as chloroform, and methylene chloride; aromatic solvents such as benzene and toluene; ester solvents such as ethyl acetate, butyl acetate, and isopropyl acetate; ether solvents such as diethylether, tetrahydrofuran, and dioxane; glycol ether solvents such as ethylene glycol monomethyl ether and ethylene glycol dimethyl ether; and the like.

In such a case, the amount of the solvent added is in the range that does not cause problems of solvent resistance and VOC, and thus, preferably in the range of 0.1 to 5% by mass, more preferably 0.1 to 3% by mass, in the entire ink composition.

[Polymer Compound]

Various polymer compounds may be added to the ink composition, for adjustment of the physical properties of the cured film.

Examples of the polymer compounds include acrylic polymers, polyvinylbutyral resins, polyurethane resins, polyamide resins, polyester resins, epoxy resins, phenol resins, polycarbonate resins, polyvinylbutyral resins, polyvinylformal resins, shellac, vinyl resins, acrylic resins, rubber resin, waxes, other natural resins, and the like. These resins may be used in combination of two or more. Among them, vinyl copolymers obtained by copolymerization with an acrylic monomeric are preferable. In addition, copolymers containing a "carboxyl group-containing monomer", an "alkyl methacrylate ester", or an "alkyl acrylate ester" as the structural unit as a copolymer component are also used favorably for the polymer binding material.

[Surfactant]

A surfactant may be added to the ink composition according to the present invention.

The surfactants include those described in JP-A Nos. 62-173463 and 62-183457. Examples thereof include anionic surfactants such as dialkylsulfosuccinic acid salts, alkylnaphthalenesulfonic acid salts, and fatty acid salts; nonionic surfactants such as polyoxyethylene alkylethers, polyoxyethylene alkylallylethers, acetylene glycols, and polyoxyethylene-polyoxypropylene block copolymers; cationic surfactants such as alkylamine salts and quaternary ammonium salts; and the like. An organic fluorocompound may be used instead of the surfactant. The organic fluorocompound is preferably hydrophobic. Favorable hydrophobic surfactants include fluorochemical surfactants, oily fluorochemical compounds (e.g., fluorine oil) and solid fluorochemical compound resins (e.g., tetraethylenefluoride resin); and typical examples thereof include those described in JP-B No. 57-9053 (Columns 8 to 17) and JP-A No. 62-135826.

In addition, a leveling additive, a matting agent, a wax for adjustment of film physical properties, or a tackifier for improvement of the adhesiveness to the recording medium such as of polyolefin and PET that does not inhibit polymerization may be added as needed to the ink composition according to the present invention.

Specific examples of the tackifiers include the high-molecular weight adhesive polymers described in JP-A 2001-49200, pp. 5 to 6 (e.g., copolymers of a (meth)acrylic ester and an alcohol with an alkyl group having 1 to 20 carbons, of a (meth)acrylic ester and an alicyclic alcohol having 3 to 14 carbons, and of a (meth)acrylic ester and an aromatic alcohol having 6 to 14 carbons), and low-molecular weight adhesive resin containing a polymerizable unsaturated bond, and the like.

2. Curable Composition According to the Second Embodiment of the Present Invention The curable composition according to the second embodiment of the present invention (hereinafter, sometimes referred to as "curable composition B") is a curable composition containing a compound represented by the following Formula (I) (specific polymerizable compound B), and a compound that generates acid when irradiated with radiation.

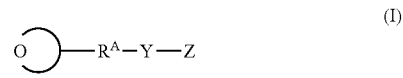

In Formula (I), a cyclic ether group at the end of the compound may have a substituent; $R^A$ represents a bivalent linking group in which the number of atoms constituting the main skeleton thereof is 7 or more; Y represents a bivalent or trivalent linking group having at least one partial structure selected from the following groups.

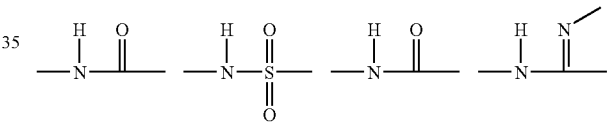

In neighboring two or more compounds represented by Formula (I), two or more partial structures represented by Y may interact with each other.

When Y is a bivalent linking group, Z represents a hydrogen atom or a monovalent nonmetal atomic group.

When Y is a trivalent linking group, two of Z each independently represent a hydrogen atom or a monovalent nonmetal atomic group, and the two of Z may combine with each other to form a ring structure.

The curable composition B is cured by irradiation with radiation, and forms a cured film superior in flexibility. Although the mechanism is not yet clear, it seems that the specific polymerizable compound B, which has a long-chain linking group, has a longer distance between crosslinking points and a greater freedom in rotating its linking group, and thus gives a cured film superior in flexibility. The compound can form a hydrogen-bonding interaction under the influence of the specific partial structure described below and thus, gives a flexible and high-strength film that is superior in adhesiveness to the base material.

[Compound Represented by Formula (II) (Specific Polymerizable Compound B)]

The specific polymerizable compound B is a compound represented by Formula (II). The specific polymerizable compound B is preferably a compound that initiates polymerization reaction and is cured by the acid generated by irradiation of radiation.

Hereinafter, the specific polymerizable compound B will be described in detail.

(Cyclic Ether Group)

The specific polymerizable compound B represented by Formula (I) contains a cyclic ether group as its partial structure. The cyclic ether group is a three- or more-membered cyclic group, preferably a three- or four-membered ring from the viewpoint of reactivity. The number of carbon atoms contained in the cyclic ether group is preferably 2 to 9, more preferably 2 to 6. It may be a monocyclic or polycyclic group. The cyclic ether group is particularly preferably one of the following cyclic ether groups, form the viewpoint of cationic polymerization reactivity.

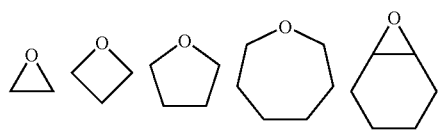

The cyclic ether group may be introduced a substituent group. Examples of the substituent group that may be introduced include an alkyl group having 1 to 18 carbon atoms, a cycloalkyl groups having 3 to 12 carbon atoms, an aryl group having 6 to 14 carbon atoms, an alkoxy group having 1 to 18 carbon atoms, an aryloxy group having 6 to 10 carbon atoms, an alkylamino group having 1 to 18 carbon atoms, an arylamino groups having 6 to 10 carbon atoms, and the like.

In Formula (I), the bonding positions of the cyclic ether group, and of the bivalent linking group, represented by $R^A$ and described below, having 7 or more atoms as the number of atoms constituting the main skeleton thereof are arbitrary. That is, the linking group may bond with any carbon atom in the ring structure.

(Bivalent Linking Group Represented by $R^A$ in which the Number of Atoms Constituting the Main Skeleton thereof is 7 or More)

In Formula (I), $R^A$ represents a bivalent linking group in which the number of atoms constituting the main skeleton thereof is 7 or more (hereinafter, sometimes referred to as "specific linking group A"). In the specific linking group A, the number of atoms constituting the main skeleton of the linking group represented by $R^A$ should be 7 or more, preferably 7 to 20, and more preferably 7 to 12, from the viewpoint of flexibility. The "linking group in which the number of atoms constituting the main skeleton thereof is 7 or more" refers to a bivalent linking group in which the number of atoms that are used only for linking the cyclic ether group with the linking group Y in Formula (I) is 7 or more. Examples of the specific linking group A include those shown below, such as linking groups containing a linking block and bivalent linking groups formed in combinations of two or more linking blocks bound to each other at any bonding site.

Examples of the linking blocks include the partial structures represented by the following (L1-1) to (L1-23).

—O— (L1-1)

—S— (L1-2)

—N— (L1-3)
  |
  $R^L$

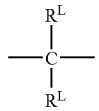 (L1-4)

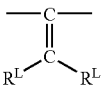 (L1-5)

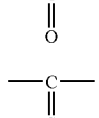 (L1-6)

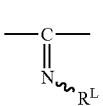 (L1-7)

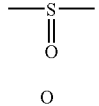 (L1-8)

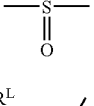 (L1-9)

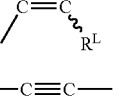 (L1-10)

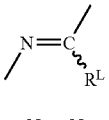 (L1-11)

—C≡C— (L1-12)

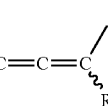 (L1-13)

—N=N— (L1-14)

—N=C=N— (L1-15)

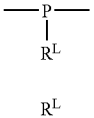 (L1-16)

—B— (L1-17)
  |
  $R^L$

—P— (L1-18)
  |
  $R^L$

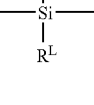 (L1-19)

—Si— (L1-20)
  |
  $R^L$

-continued

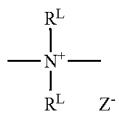
(L1-21)

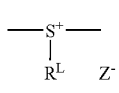
(L1-22)

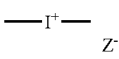
(L1-23)

In the partial structures represented by (L1-1) to (L1-23), $R^L$ each independently represent a hydrogen atom, a halogen atom, a hydroxyl group, a mercapto group, or a monovalent organic group such as an alkyl group, an alkenyl group, an alkynyl group, an aryl group, and an aralkyl group. The main skeleton may be further substituted. Examples of the substituent group introduced to the main skeleton of $R^A$ include an alkyl group, an alkenyl group, an alkynyl group, an aryl group, an aralkyl group, a hydrogen atom, a halogen atom, a hydroxyl group, and a mercapto group.

$Z^-$ is not particularly limited, as long as it is a conjugated anion of an organic or inorganic acid, and it may be a polyvalent anion. Examples of the anion represented by $Z^-$ include an anion of an organic conjugate base such as $R^{a1}$—$SO_3^-$, $R^{a1}$—$SO_2^-$, $R^{a1}$—$CO_2^-$, $R^{a1}$—$CS_2^-$, $R^{a1}$—$O$—$CS_2^-$, $R^{a1}$—$S$—$CS_2^-$, $R^{a1}$—$O$—$PO_2^-$, $(R^{a1}$—$O)_2PO_2^-$, $R^{a1}(R^{a1}$—$O)PO_2^-$, $R^{a1}$-$EW^1$-$Z^-$, -$EW^2$—$R^{a1}$, $(R^{a1})B^-$, or $Ar^XO^-$; and anions of an inorganic conjugate base such as $F^-$, $Cl^-$, $Br^-$, $I^-$, $BF_6^-$, $BF_4^-$, $SbF_6^-$, $ClO_4^-$, $SO_4^{2-}$, $NO_3^-$, $CO_3^{2-}$, $SCN^-$, $CN^-$, $SiF_6^-$, $FSO_3^-$, $I_3^-$, $Br_3^-$, or $IBr_2^-$. $R^{a1}$ represents an organic substituent group such as an alkyl group, an alkenyl group, an alkynyl group, an aryl group, an aralkyl group, or these groups additionally substituted with another substituent group described above, and when there are multiple groups $R^{a1}$ in the structure of the bivalent linking group represented by $R^A$, the groups may be selected independently and may combine each other forming a ring. Each of -$EW^1$- and -$EW^2$- represents a bivalent electron-withdrawing group, and specific examples thereof include —SO—, —CO—, —$SO_2$—, and the like. If the group -$EW^1$- or -$EW^2$- is an end-group, for example when there is no end-group "$Z^-$" in the group "$R^{a1}$-$EW^1$-$Z^-$", the group may represent —CN. Z represents —$CR^{z1}$—, —N— ($R^{z1}$ represents a hydrogen atom or a substituent group). $Ar^X$ represents an aryl group.

In Formulae (L1-1) to (L1-23), the solid line represents a covalent bond, while the wavy line in Formulae (L1-8), (L1-11), (L1-13) or (L1-16) means that the group shown represents a positional isomer and the group contains all of the isomers.

The linking block is preferably, for example, a linking group having at least one block (L1-1), more preferably a linking group having at least one block (L1-1) and one block (L1-4), more preferably a linking group having at least two blocks (L1-1) and one block (L1-4), and particularly preferably a linking group having at least two blocks (L1-1) and one block (L1-4) in which $R^L$ of (L1-4) represents a hydrogen atom and the total number of the blocks constituting the linking group is 4 to 30, preferably 8 to 25, and still more preferably 10 to 18.

In Formula (I), Y represents a bivalent or trivalent linking group having at least one partial structure selected from the following group. When Y is a bivalent linking group, Z represents a hydrogen atom or a monovalent nonmetal atomic group. When Y is a trivalent linking group, two groups of Z each independently represent a hydrogen atom or a monovalent nonmetal atomic group, and may combine with each other to form a ring structure.

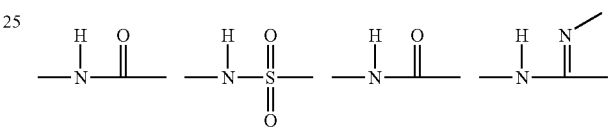

Such a partial structure (hereinafter, sometimes referred to as a "specific partial structure") has a noncovalent-electron-pair bonding unit forming a hydrogen bond with a hydrogen atom capable of hydrogen bonding, such as =O, =N—, or =S, and a hydrogen atom in an active state that can form a hydrogen bond with the noncovalent-electron-pair bond unit, such as a hydrogen atom bonded to a nitrogen atom covalently, a hydrogen atom bonded to an oxygen atom covalently, a hydrogen atom bonded to a sulfur atom covalently or an other hydrogen atom capable of hydrogen bonding, in the structure; and thus, when the compounds having the partial structure Y are present in proximity, they can form a thermally breakable hydrogen bond.

For this reason, a high-strength cured film superior in flexibility is formed by bonding between the cyclic ether group and the partial structure represented by Y via a long-chain linking group, as they are separated by a considerable gap.

Hereinafter, representative examples of the specific polymerizable compounds B are shown below (exemplary compounds (1) to (22)), but the specific polymerizable compounds B are not limited to these examples.

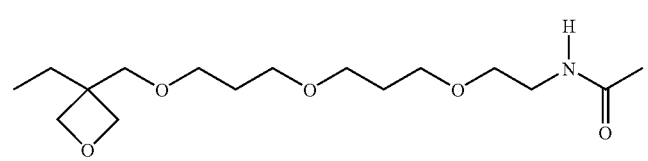
(1)

-continued
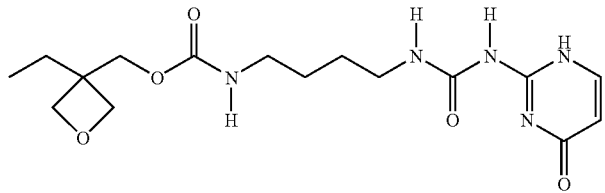
(2)
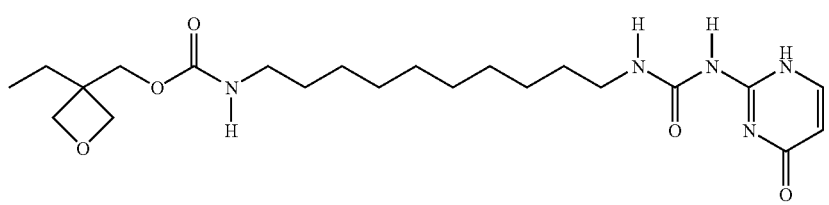
(3)
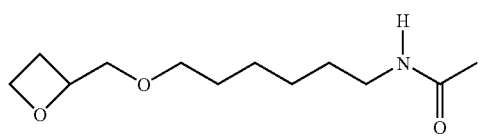
(4)
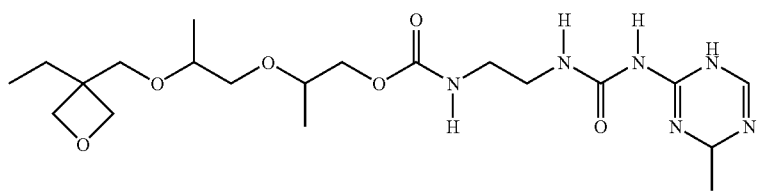
(5)
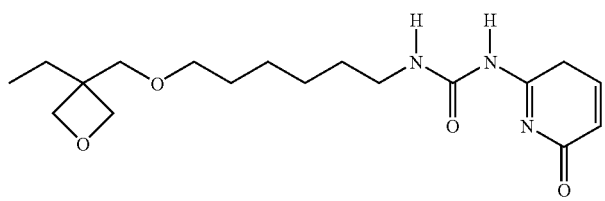
(6)
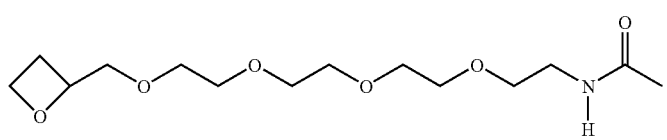
(7)
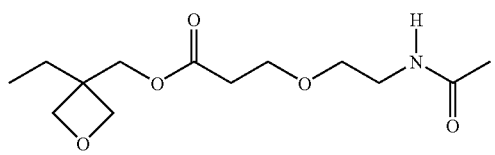
(8)
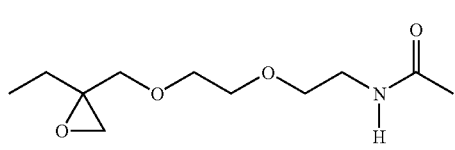
(9)
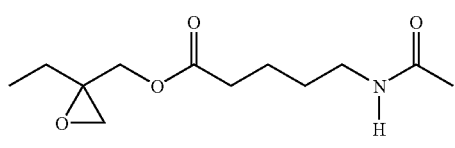
(10)

-continued
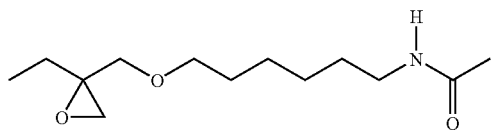
(11)
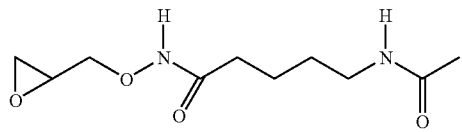
(12)
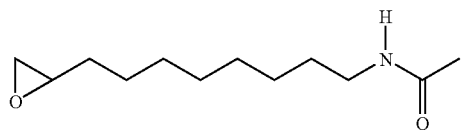
(13)
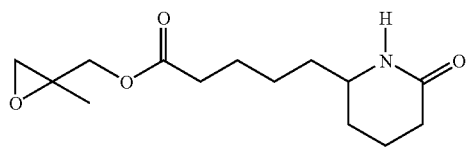
(14)
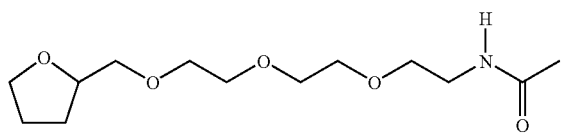
(15)
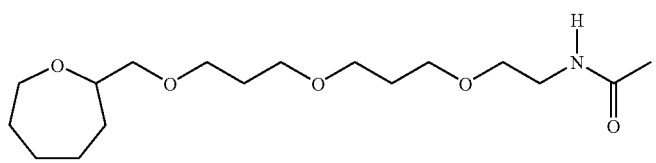
(16)
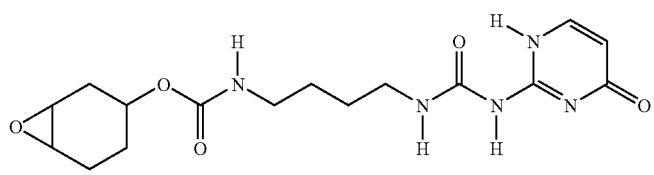
(17)
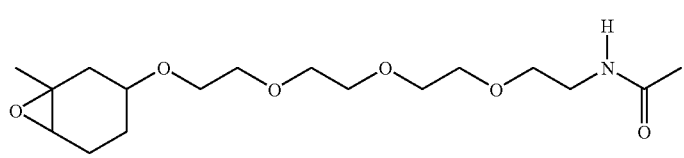
(18)
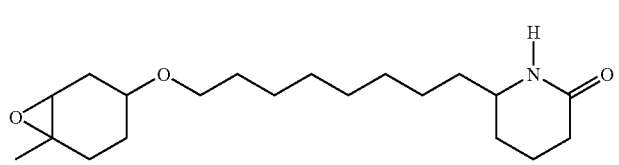
(19)
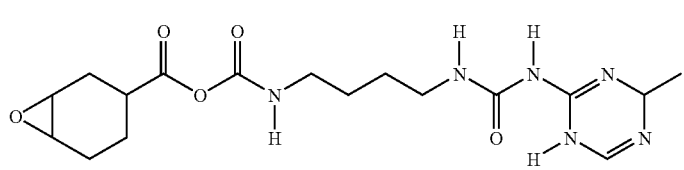
(20)

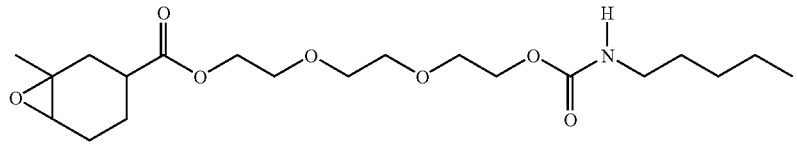

(21)

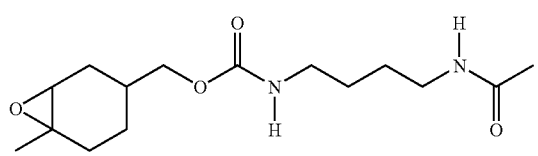

(22)

The specific polymerizable compound B can be produced by a known method. For example, it may be produced by the following manner.

(1) Raw Materials

Any raw materials may be used as the raw materials for the specific polymerizable compound, if they gives an cyclic ether compound in dehydrochlorination reaction according to the Motoi's method dehydrochlorination reaction (Motoi et al., Bull. Chem. Soc. Jpn. 61, 1998), or in a similar sulfonate elimination reaction. Specifically, the specific polymerizable compound B can be produced in etherification reaction between a cyclic ether compound having a halogenated or sulfonic ester structure represented by the following Formula (B) and an alcohol having the specific partial structure.

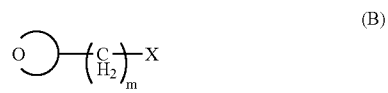

(B)

In Formula (B), X represents a halogen atom, and a leaving group such as a halogen atom or a sulfonic acid ester group; and m represents integer of 1 or more.

Specific examples of the compound represented by Formula (B) include 3-chloromethyl-3-methyloxetane, 3-bromoethyl-3-ethyloxetane, 3-methyl-3-iodopropyloxetane, 3-ethyl-3-methylsulfonyloxymethyloxetane, 3-chloromethyl-3-ethyloxetane, 3-ethyl-3-bromopropyloxetane, 3-chloromethyl-3-propyloxetane, 3-bromoethyl-3-propyloxetane, 3-bromopropyl-3-propyloxetane; and these compounds may be used alone or in combination of two or more.

More specific examples of the alcohol compound having the specific partial structure include N-acetylheptanolamine, triethylene glycol mono-2-(N-acetylamino)ethylether, and the like.

The reaction ratio of the compound represented by Formula (B) to the alcohol compound having the specific partial structure is not particularly limited, but the compound represented by Formula (B) is preferably used in reaction in an amount in the range of 0.05 to 0.6 mole with respect to 1 mole of the alcohol compound having the specific partial structure. The compound represented by Formula (B) is more preferably used in reaction in an amount in the range of 0.2 to 0.5 mole with respect to 1 mole of the alcohol compound having the specific partial structure.

(2) Reaction Temperature

The reaction temperature in production of the specific polymerizable compound B will be described below. The reaction temperature for reaction of the two components is determined by considering the yield of the specific polymerizable compound B and the like, but is preferably in the range of 0 to 100° C., more preferably 10 to 90° C., and still more preferably 20 to 80° C., for improvement in the reactivity between the raw material compounds and the yield of the reaction, and expansion of the degree of freedom in selecting a usable organic solvent.

(3) Reaction Time

The reaction time in producing the specific polymerizable compound B will be described below. The reaction time is decided by considering the yield of the specific polymerizable compound B and the reaction temperature or the like. For example, a value in the range of 10 minutes to 100 hours is preferable at the preferable reaction temperature of 0 to 100° C. In the reaction time above, it is possible to control the amount of residual unreacted raw materials and obtain high productivity. The reaction time in producing the specific polymerizable compound B is more preferably in the range of 30 minutes to 50 hours and still more preferably in the range of 1 to 10 hours.

(4) Reaction Environment (pH)

The reaction atomospher (pH) in producing the specific polymerizable compound B will be described below. The reaction atomospher (pH value) is decided by considering the yield of the specific polymerizable compound B and the like. For example, the reaction atomospher is preferably in the range of 5 to 14 from the view point of suppression of a side reaction and the degree of freedom of selectivity of the raw materials. The pH value in production of the specific polymerizable compound B is more preferably in the range of 6 to 14, and still more preferably in the range of 7 to 14. It is preferable to add an alkali such as sodium hydroxide or potassium hydroxide for adjustment of the pH value in the range above.

(5) Phase-Transfer Catalyst

The phase-transfer catalyst used in production of the specific polymerizable compound B will be described next. A phase-transfer catalyst is preferably added during reaction for improvement of the reactivity between the oxetane alcohol compound and the compound represented by Formula (B). For example, the added amount of the phase-transfer catalyst is preferably set to a value in the range of 0.1 to 30 parts by mass per 100 parts by mass of the total amount of the raw materials, from the viewpoint of expression property of effects such as the improvement reactivity and yield by addition, and easy purification of the specific polymerizable compound A obtained. The added amount is more preferably in the range of 1.0 to 20.0 parts by mass, more preferably 2.0 to 10.0 parts by mass per 100 parts by mass of the total amount of the raw materials.

The kinds of phase-transfer catalyst is not particularly limited. For example, the phase-transfer catalyst is preferably at lease one compound selected from a group of a quaternary ammonium salt, and a quaternary phosphonium salt. Specific examples thereof include tetra-n-butylammonium bromide, tetramethylammonium bromide, benzyltriethylammonium bromide, hexadecyltrimethylammonium bromide, triethylhexadecylammonium bromide, trioctylmethylammonium bromide, methyltriphenylphosphonium bromide, triethylhexadecylphosphonium bromide, tetraphenylphosphonium bromide, tetrabutylphosphonium bromide, and the like. These compounds may be used alone or in combination of two or more.

(6) Organic Solvent

The organic solvent for use in preparation of the specific polymerizable compound B will be described next. The organic solvent is preferably a liquid whose boiling point under atmospheric pressure is 250° C. or lower since the liquid is a good solvent for the raw materials and the production can be easily made. Examples of the organic solvents include hydrocarbons such as hexane, heptane, and octane; halogenated hydrocarbons such as dichloromethane and chloroform; ethers such as diethylether, dibutylether, ethylene glycol dimethylether, tetrahydrofuran, and dioxane; ketones such as acetone, methylethylketone, methylisobutylketone and cyclohexanone; esters such as ethyl acetate, butyl acetate, amyl acetate and γ-butylolactone; aromatic hydrocarbons such as benzene, toluene and xylene; and the like. These solvents may be used alone or in combination of two or more.

The structure of the specific polymerizable compound B obtained by the production method above can be identified from $^1$H-NMR and IR spectra.

In the curable composition B, the content of the specific polymerizable compound B is preferably 1 to 70% by mass, more preferably 1 to 60% by mass, and still more preferably 1 to 50% by mass, with respect to the total solid matters in the composition.

The preferable range of the content of the specific polymerizable compound B is also applicable, when the curable composition B is applied to an ink composition.

In addition to the specific polymerizable compound B, a compound that generates an acid by irradiation of radiation that can generate an initiation site allowing polymerization and curing of the polymerizable compound is preferably added to the curable composition B and the ink composition including the curable composition B.

The curable composition B and the ink composition including the curable composition B may contain other polymerizable compounds (i.e. cationically polymerizable compounds) together with the specific polymerizable compound B, within a range that does not impair the effects of the present invention.

The other polymerizable compounds that may be used in combination will be described.

In the invention, the curable composition B and the ink composition including the curable composition B of the invention preferably contain the specific polymerizable compound B, at least one compound selected from epoxy compounds or other oxetane compounds not included in the specific polymerizable compound B as other polymerizable compounds, and a vinyl ether compound, from the viewpoint of effectively suppressing the shrinkage during the curing of the composition.

Examples of the other polymerizable compounds for use in the curable composition B and the ink composition including the curable composition B are the same as those for use in the curable composition A and the preferable examples thereof are also the same.

When the specific polymerizable compound B and another cationic polymerizable compounds are used together, the content ratio between the specific polymerizable compound B and another cationic polymerizable compounds is preferably 10:1 to 10:100, more preferably 10:3 to 10:80, and still more preferably 10:5 to 10:60 in terms of mass ratio.

[Compound that Generates an Acid when Irradiated with Radiation]

The curable composition B and the ink composition including the curable composition B according to the present invention preferably contain a compound that generates an acid by irradiation of radiation (photochemical acid generator). In the present invention, the acid generated by irradiation of radiation initiates polymerization and curing reactions of the polymerizable compound.

Examples of the photochemical acid generators for use in the curable composition B and the ink composition including the curable composition B are the same as those described in the curable composition A, and the preferable examples thereof are also the same. The photochemical acid generators may be used alone or in combination of two or more.

The content of the photochemical acid generator in the curable composition B and the ink composition including the curable composition B of the present invention is preferably 0.1 to 20% by mass, more preferably 0.5 to 10% by mass, and still more preferably 1 to 7% by mass, with respect to the total solid matters in the composition.

[Colorant]

The curable composition B of the present invention may contain a colorant. Further, the ink composition, which includes the curable composition B, is preferably contains a colorant for forming a colored image.

Examples of the colorants for use are the same as those described in the curable composition A, and the preferable examples thereof are also the same.

The colorant is preferably contained in the ink composition including the curable composition B of the second embodiment in an amount of 1 to 20% by mass, more preferably 2 to 10% by mass, as solid matter.

[Additive]

Various additives may be added as needed to the curable composition B and the ink composition including the curable composition B according to the present invention.

Examples of the additives include those similar to those described in the curable composition A. Favorable examples and content of the additives are the same as those described in the curable composition A.

3. Curable Composition in Third Embodiment of the Present Invention

The curable composition according to the third embodiment of the present invention (hereinafter, sometimes referred to as "curable composition C") is a curable composition containing a compound represented by the following Formula (II) (hereinafter, referred to as "specific polymerizable compound C"), a compound that generates acid when irradiated with radiation.

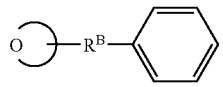
(II)

In Formula (II), $R^B$ represents a linking group in which the number of atoms constituting the main skeleton thereof is 4 or more.

The curable composition C gives a curable composition that is cured at high sensitivity by irradiation with radiation and gives a high-quality cured image sufficiently adhesive to the recording medium. Although the mechanism is not yet clear, it seems that the specific polymerizable compound C, which has a long-chain linking group, has a longer distance between crosslinking points and a greater freedom in rotating its linking group, and thus, gives a hardened film superior in flexibility.

[Compound Represented by Formula (II) (Specific Polymerizable Compound C)]

The specific polymerizable compound C is a compound represented by Formula (II). The specific polymerizable compound C is preferably a compound that initiates polymerization reaction and is cured by the acid generated by irradiation of radiation.

Hereinafter, the specific polymerizable compound C will be described in detail.

(Cyclic Ether Group)

The specific polymerizable compound C represented by Formula (II) contains a cyclic ether group as its partial structure. The cyclic ether group is a three- or more-membered cyclic group, preferably a three- or four-membered ring from the viewpoint of reactivity. The number of carbon atoms contained in the cyclic ether group is preferably 2 to 9, more preferably 2 to 6. It may be a monocyclic or polycyclic group.

The cyclic ether group is particularly preferably one of the following cyclic ether groups, form the viewpoint of cationic polymerization reactivity.

The cyclic ether group may be introduced a substituent group. Examples of the substituent group that may be introduced include an alkyl group having 1 to 18 carbon atoms, a cycloalkyl groups having 3 to 12 carbon atoms, an aryl group having 6 to 14 carbon atoms, an alkoxy group having 1 to 18 carbon atoms, an aryloxy group having 6 to 10 carbon atoms, an alkylamino group having 1 to 18 carbon atoms, and arylamino groups having 6 to 10 carbon atoms, and the like.

In Formula (II), the bonding positions of the cyclic ether group, and of the bivalent linking group, represented by $R^B$ described as below, having 4 or more atoms as the number of atoms constituting the main skeleton thereof are arbitrary. That is, the linking group may bond with any carbon atom in the ring structure.

(Linking Group Represented by $R^B$ in which the Number of Atoms Constituting the Main Skeleton thereof is 4 or More)

The specific polymerizable compound C represented by Formula (II) contains a linking group in which the number of atoms constituting the main skeleton thereof is 4 or more (hereinafter, referred to as "specific linking group B").

The specific linking group B is a bivalent linking group, and the number of atoms constituting the main skeleton of the linking group represented by $R^B$ should be 4 or more, more preferably 6 to 20, and still more preferably 6 to 12, from the viewpoint of flexibility. The "linking group in which the number of atoms constituting the main skeleton thereof is 4 or more" refers to a bivalent linking group in which the number of atoms that are used only for linking the cyclic ether group with the phenyl group in Formula (II) is 4 or more. Examples of the specific linking group A include a bivalent linking group having a linking block shown below, and a bivalent linking group formed by linking two or more linking blocks to each other at any bonding site. Examples of the specific linking groups B include those shown below, such as linking groups containing a linking block and bivalent linking groups formed in combination of two or more linking blocks bound to each other at any binding site.

Examples of the linking blocks include the partial structures represented by the following (L2-1) to (L2-23).

(L2-1)

(L2-2)

(L2-3)

(L2-4)

(L2-5)

(L2-6)

(L2-7)

(L2-8)

(L2-9)

(L2-10)

(L2-11)

(L2-12)

(L2-13)

(L2-14)

(L2-15)

-continued

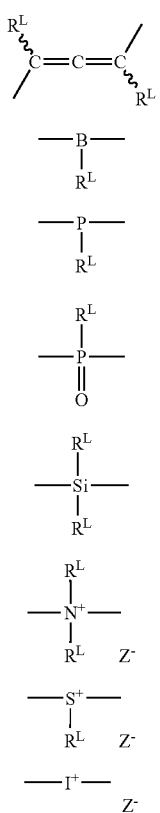

(L2-16)
(L2-17)
(L2-18)
(L2-19)
(L2-20)
(L2-21)
(L2-22)
(L2-23)

In the partial structures represented by (L1-1) to (L1-23), $R^L$ each independently represent a hydrogen atom, a halogen atom, a hydroxyl group, a mercapto group, or a monovalent organic group such as an alkyl group, an alkenyl group, an alkynyl group, an aryl group, and an aralkyl group. The main skeleton may be further substituted. Examples of the substituent group introduced to the main skeleton of $R^4$ include an alkyl group, an alkenyl group, an alkynyl group, an aryl group, an aralkyl group, a hydrogen atom, a halogen atom, a hydroxyl group, and a mercapto group.

$Z^-$ is not particularly limited, as long as it is a conjugated anion of an organic or inorganic acid, and it may be a polyvalent anion. Examples of the anion represented by $Z^-$ include an anion of an organic conjugate base such as $R^{a1}$—$SO_3^-$, $R^{a1}$—$SO_2^-$, $R^{a1}$—$CO_2^-$, $R^{a1}$—$CS_2^-$, $R^{a1}$—$O$—$CS_2^-$, $R^{a1}$—$S$—$CS_2^-$, $R^{a1}$—$O$—$PO_2^-$, $(R^{a1}$—$O)_2PO_2^-$, $R^{a1}(R^{a1}$—$O)PO_2^-$, $R^{a1}$-$EW^1$-$Z^-$, -$EW^2$—$R^{a1}$, $(R^{a1})B^-$, or $Ar^XO^-$; and anions of an inorganic conjugate base such as $F^-$, $Cl^-$, $Br^-$, $I^-$, $BF_6^-$, $BF_4^-$, $SbF_6^-$, $ClO_4^-$, $SO_4^{2-}$, $NO_3^-$, $CO_3^{2-}$, $SCN^-$, $CN^-$, $SiF_6^-$, $FSO_3^-$, $I_3^-$, $Br_3^-$, or $IBr_2^-$. $R^{a1}$ represents an organic substituent group such as an alkyl group, an alkenyl group, an alkynyl group, an aryl group, an aralkyl group, or these groups additionally substituted with another substituent group described above, and when there are multiple groups $R^{a1}$ in the structure of the bivalent linking group represented by $R^4$, the groups may be selected independently and may combine each other forming a ring. Each of -$EW^1$— and -$EW^2$— represents a bivalent electron-withdrawing group, and specific examples thereof include —SO—, —CO—, —$SO_2$—, and the like. If the group -$EW^1$— or -$EW^2$— is an end-group, for example when there is no end-group "$Z^-$" in the group "$R^{a1}$-$EW^1$-$Z^-$", the group may represent —CN. Z represents —$CR^{z1}$—, —N—($R^{z1}$ represents a hydrogen atom or a substituent group). $Ar^X$ represents an aryl group.

In Formulae (L2-1) to (L2-23), the solid line represents a covalent bond, while the wavy line in Formulae (L2-8), (L2-11), (L2-13) or (L2-16) means that the group shown there represents a positional isomer and the group contains all of the isomers.

The linking block is preferably, for example, a linking group having at least one block (L2-1), more preferably, a linking group having at least one block (L2-1) and one block (L2-4), more preferably a linking group having at least two blocks (L2-1) and one block (L2-4), and particularly preferably a linking group having at least two blocks (L2-1) and one block (L2-4) in which $R^L$ of (L2-4) represents a hydrogen atom and the total number of the blocks constituting the linking group is 4 to 30, preferably 8 to 25, and still more preferably 10 to 18.

The specific polymerizable compound C represented by Formula (II) contains a phenyl group. The phenyl group may be substituted with a substituent group such as an alkyl group, an alkenyl group, an alkynyl group, an aryl group, an aralkyl group, and the like, but is more preferably unsubstituted.

Hereinafter, typical examples of the specific polymerizable compounds C (a-1 to a-26) will be listed, but the invention is not limited by these typical examples at all.

a-1
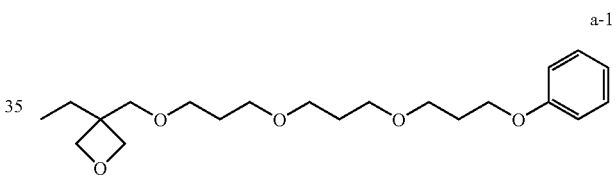

a-2
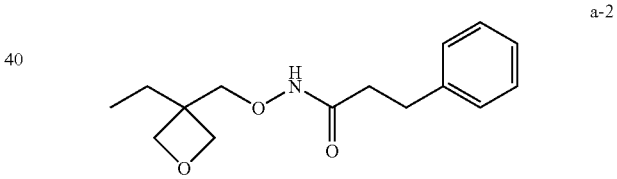

a-3
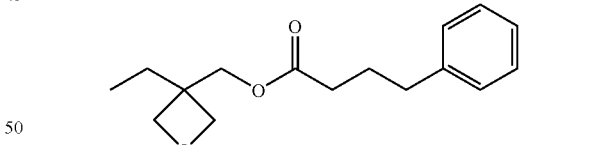

a-4
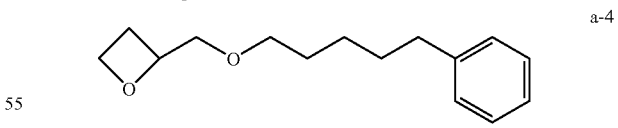

a-5
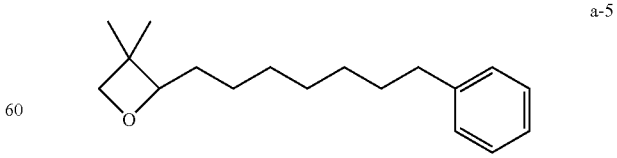

a-6
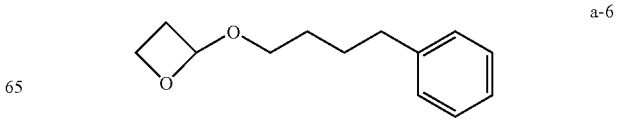

-continued
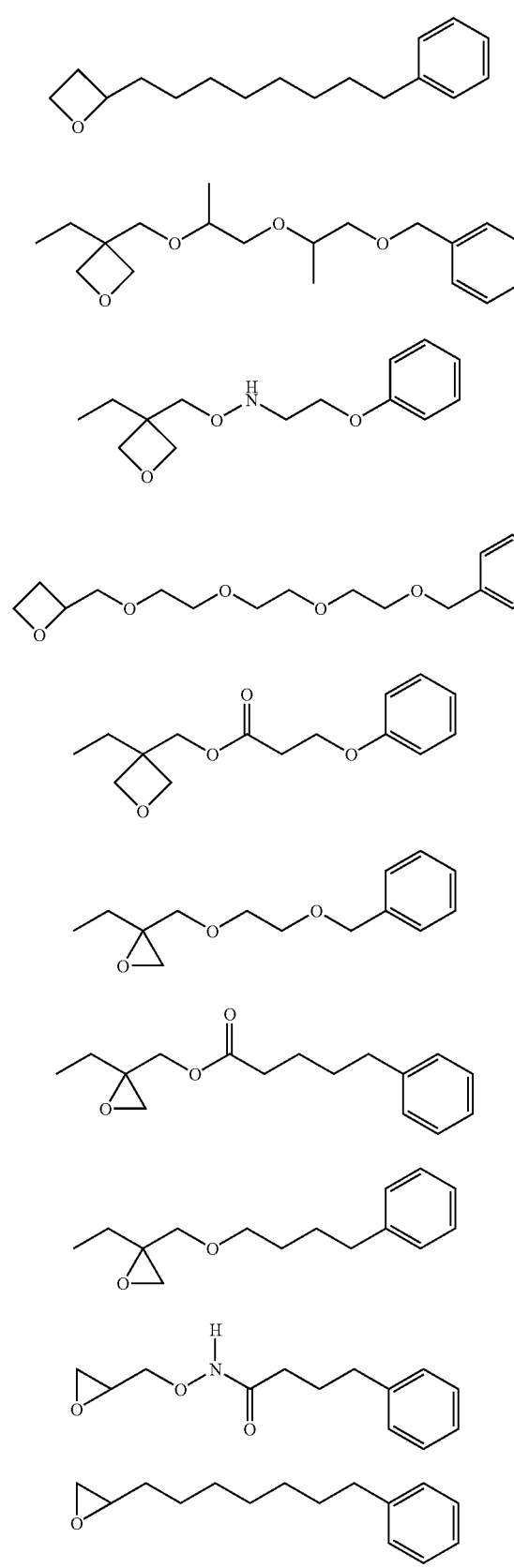
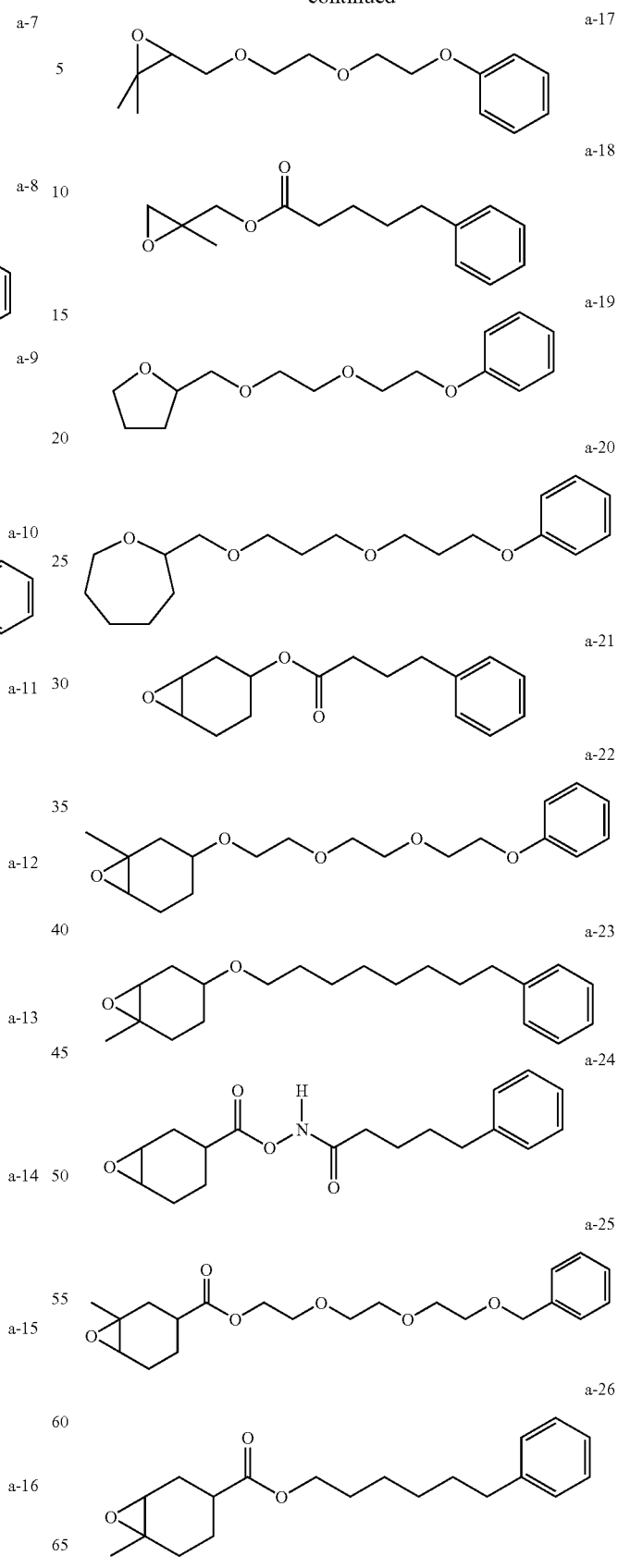

The specific polymerizable compound C can be produced, for example, by the following method:

(1) Raw Materials

Any raw materials may be used as the raw materials for the specific polymerizable compound, if they give an oxetane compound in dehydrochlorination reaction according to the Motoi's method dehydrochlorination reaction (Motoi et al., Bull. Chem. Soc. Jpn. 61, 1998). Specifically, the specific polymerizable compound C can be produced in etherification reaction between the cyclic ether alcohol compound represented by the following Formula (C) and a halogenated or sulfonic ester derivative of aralkyl compound.

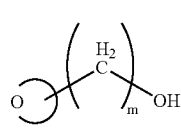
(C)

In Formula (C), m is an integer of 1 or more.

Specific examples of the cyclic ether alcohol compounds represented by Formula (C) (oxetane alcohol compounds) include 3-methyl-3-oxetanemethanol, 3-methyl-3-oxetaneethanol, 3-methyl-3-oxetanepropanol, 3-ethyl-3-oxetanemethanol, 3-ethyl-3-oxetaneethanol, 3-ethyl-3-oxetanepropanol, 3-propyl-3-oxetanemethanol, 3-propyl-3-oxetaneethanol, 3-propyl-3-oxetanepropanol and the like, and these compounds may be used alone or in combination of two or more.

More specific examples of halogenated aralkyl compounds include 1-bromo-5-phenylpentane, 1-bromo-5-phenoxypentane and the like.

The reaction ratio of the oxetane alcohol compound represented by Formula (C) to the halogenated aralkyl compound is not particularly limited, but the halogenated aralkyl compound is preferably used in an amount in the range of 0.05 to 0.6 mole in reaction with respect to 1 mole of the oxetane alcohol compound represented by Formula (C). The halogenated aralkyl compound is more preferably used in an amount in the range of 0.2 to 0.5 mole, with respect to 1 mole of the oxetane alcohol compound represented by Formula (C).

(2) Reaction Temperature

The reaction temperature in production of the specific polymerizable compound C will be described. The reaction temperature for reaction of the two components is determined by considering the yield of the specific polymerizable compound and the like, but is preferably in the range of 0 to 100° C., more preferably 10 to 90° C., and still more preferably 20 to 80° C., from the viewpoint of reactivity between the raw material compounds and the yield of the reaction, and the degree of freedom of selectivity of usable organic solvents.

(3) Reaction Time

The reaction time in producing the specific polymerizable compound C will be described below. The reaction period is decided by considering the yield of the specific polymerizable compound C and the reaction temperature or the like. For example, a value in the range of 10 minutes to 100 hours is preferable at the preferable reaction temperature of 0 to 100° C. In the reaction time above, it is possible to control the amount of residual unreacted raw materials and obtain high productivity. The reaction time in producing the specific polymerizable compound C is more preferably in the range of 30 minutes to 50 hours and still more preferably in the range of 1 to 10 hours.

(4) Reaction Environment (pH)

The reaction atomospher (pH) in producing the specific polymerizable compound A will be described below. The reaction atomospher (pH value) is decided by considering the yield of the specific polymerizable compound C and the like. For example, the reaction atomospher is preferably in the range of 5 to 14 from the view point of suppression of a side reaction and the degree of freedom of selectivity of the raw materials. The pH value in production of the specific polymerizable compound A is more preferably in the range of 6 to 14, and still more preferably in the range of 7 to 14. It is preferable to add an alkali such as sodium hydroxide or potassium hydroxide for adjustment of the pH value in the range above.

(5) Phase-Transfer Catalyst

The phase-transfer catalyst used in preparation of the specific polymerizable compound C will be described next. A phase-transfer catalyst is preferably added during reaction for improvement of the reactivity between the oxetane alcohol compound and the halogenated aralkyl compound. For example, the added amount of the phase-transfer catalyst is preferably set to a value in the range of 0.1 to 30 parts by mass per 100 parts by mass of the total amount of the raw materials, from the viewpoint of expression property of effects such as the improvement reactivity and yield by addition, and easy purification of the specific polymerizable compound C obtained. The added amount is more preferably in the range of 1.0 to 20.0 parts by mass, more preferably 2.0 to 10.0 parts by mass per 100 parts by mass of the total amount of the raw materials.

The kinds of phase-transfer catalyst is not particularly limited. For example, the phase-transfer catalyst is preferably at lease one compound selected from a group of a quaternary ammonium salt, and a quaternary phosphonium salt. Specific examples thereof include tetra-n-butylammonium bromide, tetramethylammonium bromide, benzyltriethylammonium bromide, hexadecyltrimethylammonium bromide, triethylhexadecylammonium bromide, trioctylmethylammonium bromide, methyltriphenylphosphonium bromide, triethylhexadecylphosphonium bromide, tetraphenylphosphonium bromide, tetrabutylphosphonium bromide, and the like. These compounds may be used alone or in combination of two or more.

(6) Organic Solvent

The organic solvent for use in preparation of the specific polymerizable compound C will be described next. The organic solvent is preferably a liquid whose boiling point under atmospheric pressure is 250° C. or lower since the liquid is a good solvent for the raw materials and the production can be easily made. Examples of the organic solvents include hydrocarbons such as hexane, heptane, and octane; halogenated hydrocarbons such as dichloromethane and chloroform; ethers such as diethylether, dibutylether, ethylene glycol dimethylether, tetrahydrofuran, and dioxane; ketones such as acetone, methylethylketone, methylisobutylketone and cyclohexanone; esters such as ethyl acetate, butyl acetate, amyl acetate and γ-butylolactone; aromatic hydrocarbons such as benzene, toluene and xylene; and the like. These solvents may be used alone or in combination of two or more.

The structure of the specific polymerizable compound C obtained by the production method above can be identified from $^1$H-NMR and IR spectra.

In the curable composition C, the content of the specific polymerizable compound C in the curable composition C is preferably 1 to 70% by mass, more preferably 1 to 60% by mass, and still more preferably 1 to 50% by mass, with respect to the total solid matters in the composition.

The preferable range of the content of the specific polymerizable compound C is also applicable, when the curable composition C is applied to an ink composition.

The curable composition C and the ink composition applied the curable composition C may contain other polymerizable compounds (i.e. cationically polymerizable compounds) together with the specific polymerizable compound C, within a range that does not impair the effects of the present invention.

The curable composition C and the ink composition including the curable composition C preferably contain the specific polymerizable compound C, at least one compound selected from epoxy compounds or other oxetane compounds not included in the specific polymerizable compound C as other polymerizable compounds, and a vinyl ether compound, from the viewpoint of effectively suppressing the shrinkage during the curing of the composition.

Examples of the other polymerizable compounds for use in the curable composition C and the ink composition including the curable composition C are the same as those for use in the curable composition A and the preferable examples thereof are also the same.

When the specific polymerizable compound C and another cationic polymerizable compounds are used together, the content ratio between the specific polymerizable compound C and another cationic polymerizable compounds is preferably 10:1 to 10:100, more preferably 10:3 to 10:80, and still more preferably 10:5 to 10:60 in terms of mass ratio.

[Compound that Generates an Acid when Irradiated with Radiation]

The curable composition C and the ink composition including the curable composition C according to the present invention preferably contain a compound that generates an acid by irradiation of radiation (photochemical acid generator). In the present invention, the acid generated by irradiation of radiation initiates polymerization and curing reactions of the polymerizable compound.

Examples of the photochemical acid generators for use in the curable composition C and the ink composition including the curable composition C are the same as those described in the curable composition A, and the preferable examples thereof are also the same. The photochemical acid generators may be used alone or in combination of two or more.

The content of the photochemical acid generator in the curable composition C and the ink composition including the curable composition C of the present invention is preferably 0.1 to 20% by mass, more preferably 0.5 to 10% by mass, and still more preferably 1 to 7% by mass, with respect to the total solid matters in the composition.

[Colorant]

The curable composition C of the present invention may contain a colorant. Further, the ink composition, which includes the curable composition C, is preferably contains a colorant for forming a colored image.

Examples of the colorants for use are the same as those described in the curable composition A, and the preferable examples thereof are also the same.

The colorant is preferably contained in the ink composition including the curable composition B of the second embodiment in an amount of 1 to 20% by mass, more preferably 2 to 10% by mass, as solid matter.

[Additives]

Various additives may be added as needed to the curable composition C and the ink composition including the curable composition C according to the present invention.

Examples of the additives include those similar to those described in the curable composition A. Favorable examples and content of the additives are the same as those described in the curable composition A.

[Preferable Embodiment of Ink Composition]

The ink composition including the curable composition A, B or C (the ink compositions according to the present invention) is preferably prepared to contain a specific polymerizable compound A, B, or C that generates an acid by irradiation of radiation and other polymerizable compound, a colorant and the like contained as needed as described above. The content of the colorant is preferably 1 to 10% by mass, more preferably 2 to 8% by mass, and the content of the total polymerizable compounds including the specific polymerizable compound is preferably 1 to 97% by mass, more preferably, 30 to 95% by mass, with respect to the total mass of the ink composition. The compound that generates acid by irradiation of radiation is contained in an amount of preferably 0.01 to 20% by mass, more preferably, 0.1 to 20% by mass, with respect to the total polymerizable compounds including the specific polymerizable compound.

When the ink composition according to the present invention is used as inkjet-recording ink, the viscosity of the inkjet-recording ink is preferably 7 to 30 cm Pa·s, more preferably 7 to 20 mPa·s, at the ejection temperature (for example, 40 to 80° C., preferably 25 to 30° C.), from the point of ejection efficiency. The viscosity of the ink composition according to the present invention at room temperature (25 to 30° C.) is preferably, for example, 35 to 500 mPa·s, more preferably 35 to 200 mPa·s. It is preferably to adjust the composition suitably so as to make the ink composition according to the present invention have a viscosity in the range above. By increasing the viscosity at room temperature, it becomes possible to prevent penetration of the ink into a recording medium even when a porous recording medium is used, and reduce the amounts of unhardened monomer and odor. Favorably, it is also possible to suppress ink bleeding when the ink droplet is ejected and consequently improve the image quality.

The surface tension of the ink composition according to the present invention is preferably 20 to 30 mN/m and more preferably 23 to 28 mN/m. When the ink composition according to the present invention is used on various recording media such as polyolefin, PET, coated paper, and non-coated paper, the surface tension thereof is preferably 20 mN/m or more for prevention of ink bleeding and penetration, and 30 mN/m or less for improvement in compatibility therewith.

The ink composition according to the present invention is used suitably as an inkjet recording ink. When used as an inkjet-recording ink, the ink composition is ejected on a recording medium in an inkjet printer and then, the ejected ink composition is cured by irradiation of radiation for recording.

The cured film obtained with the ink composition according to the present invention is superior in the strength of the cured film which is cured by irradiation of active radiation such as ultraviolet ray, and thus, the composition can be used not only for image forming but also in various applications, for example, in formation of an ink-receiving layer (image region) on planographic printing plate.

<Inkjet-Recording Method, and Printed Material>

The inkjet-recording method (inkjet-recording method according to the present invention) to which the ink composition according to the present invention is suitably applied will be described below.

The inkjet-recording method according to the present invention includes a process of ejecting the ink composition according to the present invention onto a recording medium (support, recording material, or the like) using an inkjet-recording apparatus, and a process of curing the ejected ink composition by irradiation of active radiation. The cured ink composition forms an image on the recording medium.

The recording medium to which the inkjet-recording method according to the present invention is applicable is not particularly limited, and examples thereof include papers such as common coated and non-coated papers and various non-absorptive resin materials for use in so-called soft packaging and resin films thereof in the film shape; and typical examples of the various plastic films include PET film, OPS film, OPP film, ONy film, PVC film, PE film, TAC film, and the like. Examples of the other plastics for use as the recording medium material include polycarbonate, acrylic resins, ABS, polyacetal, PVA, rubbers, and the like. In addition, metal and glass are also usable as the recording media. The ink composition according to the present invention, which is resistant to heat shrinkage during curing and superior in adhesiveness to the base material (recording medium), has an advantage of allowing formation of an high-definition image even on films easily curled or deformed, for example by curing and shrinkage of ink or the heat during curing reaction, such as thermally shrinkable PET film, OPS film, OPP film, ONy film, and PVC film.

An example of the recording materials for use in the present invention is the support for planographic printing plate described below.

Examples of the active radiation for use in the inkjet-recording method according to the present invention include α rays, γ rays, X rays, ultraviolet rays, visible rays, infrared rays, electron beam, and the like. The peak wavelength of the active radiation is preferably 200 to 600 nm, more preferably 300 to 450 nm, and still more preferably 350 to 420 nm. In addition, the output of the active radiation is preferably 2,000 mJ/cm$^2$ or less, more preferably 10 to 2,000 mJ/cm$^2$, still more preferably 20 to 1,000 mJ/cm$^2$, and particularly preferably, 50 to 800 mJ/cm$^2$.

In particular in the ink jet-recording method according to the present invention, the ink composition is preferably irradiated with a light-emitting diode emitting an ultraviolet ray having an emission wavelength peak of 350 to 420 nm and having a maximum illumination on the recording medium surface at 10 to 1,000 mW/cm$^2$.

In addition to the above conditions and the like, the conditions applied to an inkjet recording method of the invention and the details of an inkjet recording apparatus will be described below in a planographic printing plate and a method of producing a planographic printing plate of the invention that are preferred applications of the inkjet recording method of the invention.

By employing the abovementioned inkjet recording method, with respect to various recording media having various surface wettability, the dot diameter of the deposited ink can be kept constant and the image quality is improved. In order to obtain a colored image, it is preferable to superpose inks in the order from less bright color to brighter color. By superposing inks in the order from less bright color to brighter color, the irradiation can readily reach to the ink at the bottom, and excellent curable sensitivity, reduction in residual monomer, odor reduction, and improvement in adhesiveness can be expected. In the irradiation, all colors can be ejected and exposed to light all in at once, however each color is preferably exposed to light one by one from the viewpoint of accelerating the curing.

In the printed material of the invention, an image is formed by the above-described inkjet recording method (the inkjet recording method of the invention) using the ink composition of the invention.

For this reason, the printed material has an image with high quality and excellent flexibility.

<Planographic Printing Plate and Method of Producing Planographic Printing Plate>

The method of producing a planographic printing plate according to the present invention is a method of producing a planographic printing plate including a process of ejecting the ink composition according to the present invention onto a support, and a process of curing the ejected ink composition by irradiation of active radiation onto the ejected ink composition so as to form a hydrophobic image on the support with the cured ink composition.

The planographic printing plate according to the present invention is also a planographic printing plate produced by the method of producing a planographic printing plate according to the present invention. The planographic printing plate has a support and a hydrophobic image formed on the support.

In the related art, as the planographic printing plate, a PS plate having the configuration in which a lipophilic photosensitive resin layer is provided on a hydrophilic substrate is widely used. As a method of manufacturing the PS plate, normally, after mask exposure (surface exposure) is conducted through a lith film, an unexposed portion is dissolved and removed, thereby obtaining a desired printing plate. In recent years, however, a digitization technology that electronically processes, stores, and outputs image information widely spread, and a new image output system is demanded accordingly. In particular, a computer to plate (CTP) technology that scans digitized image information with light having high preference, such as laser light, without using a lith film, thereby directly manufacturing a printing plate is being developed.

As a system that obtains a planographic printing plate for scanning exposure, a method of directly producing a planographic printing plate using an ink composition or an inkjet recording ink composition is exemplified. According to this method, ink is ejected onto a substrate (preferably, a hydrophilic substrate) by an inkjet method and then is exposed to active radiation such that a portion of the ink composition is exposed, and a printing plate having a desired image (preferably, a hydrophobic image) is obtained. An ink composition that is suitable for this method is the ink composition of the invention.

The respective steps of the method of manufacturing the planographic printing plate of the invention will now be described.

[Process of Ejecting Ink Composition According to Present Invention onto a Support]

(Support)

A support (recording medium) on which the inkjet recording ink of the present invention can be ejected is not particularly limited as long as it is a dimensionally stable plate-like material. Examples thereof include a paper, a paper laminated with a plastic (such as polyethylene, polypropylene, and polystyrene), a metal plate (such as aluminum, zinc, and copper), a plastic film (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinylacetal), and a paper and a plastic film on which the abovementioned metals are laminated or deposited. Preferred examples of the support include a polyester film and an aluminum plate. Among these, preferred is an aluminum plate having excellent dimensional stability and relatively low cost.

The aluminum plate is a pure aluminum plate, an alloy plate having aluminum as the main component containing a small amount of different components, or an aluminum or aluminum alloy thin film laminated with plastics. Examples of different components contained in the aluminum alloy include silicon, iron, manganese, copper, magnesium, chromium, zinc, bismuth, nickel, and titanium. The content of the different components in the alloy is preferably not more than 10 weight %. In the present invention, a pure aluminum plate is preferred. However, since it is difficult to produce completely pure aluminum in terms of the refining technique, a small amount of different components may be contained. The composition of the aluminum plate is not specified and well-known materials can be suitably used.

The thickness of the support is preferably 0.1 to 0.6 mm, more preferably 0.15 to 0.4 mm.

Prior to using the aluminum plate, it is preferred to apply surface treatments such as surface roughening and anodic oxidation. Such surface treatments facilitate improving the hydrophilicity and ensuring the adhesiveness of the image recording layer and the support. Prior to the surface roughening of the aluminum plate, a degreasing treatment for removing rolling oil on the surface using, for example, a surfactant, an organic solvent or an alkaline aqueous solution is performed.

The surface roughening of the aluminum plate is performed by various methods, such as mechanical surface roughening, electrochemical surface roughening (surface roughening in which the surface is electrochemically dissolved), and chemical surface roughening (surface roughening in which the surface is chemically selectively dissolved).

As the method of mechanical surface roughening, well-known methods such as a ball polishing method, a brush polishing method, a blast polishing method, and a buff polishing method may be used. Moreover, in the step for rolling the aluminum, a transcriptional method in which a rugged shape is transcripted using a rugged roller may be used.

Examples of the method of electrochemical surface roughening include a method performed by alternating current or direct current in an electrolyte containing acids such as hydrochloric acid and nitric acid. Moreover, examples thereof include a method using mixed acid described in JP-A No. 54-63902.

After the surface-roughening, the aluminum plate is subjected to alkali etching using an aqueous solution such as potassium hydroxide and sodium hydroxide as necessary. Furthermore, after the neutralization treatment, an anodic oxidation is performed so as to improve the abrasion resistance as desired.

In the anodic oxidation of the aluminum plate, any eletrolyte may be used, as long as it can form a porous oxide coating. Generally used are, for instance, sulfuric acid, hydrochloric acid, oxalic acid, chromic acid and mixtures thereof. The concentration of these electrolytes is suitably selected depending on the types of electrolytes.

Since the conditions for the anodic oxidation variously vary depending on the types of electrolytes used, it can not be indiscriminately specified. However in general, it is preferable that the electrolyte concentration is 1 to 80% by mass, the electrolyte temperature is 5 to 70° C., the current density is 5 to 60 A/dm$^2$, the electric voltage is 1 to 100 V, and the electrolysis time is 10 seconds to 5 minutes. The amount of the anodic oxide coating formed is preferably 1.0 to 5.0 g/m$^2$, and more preferably 1.5 to 4.0 g/m$^2$. Within such a range, excellent printing durability and excellent scratch resistance in the non-image area of the planographic printing plate may be obtained.

The support used in the present invention may be a substrate as is, that has been surface treated and has an anodic oxide coating. However, an expansion treatment or sealing of microspores in the anodic oxide coating described in JP-A No. 2001-253181 and JP-A No. 2001-32236, and a surface hydrophilizing in which the substrate is soaked in an aqueous solution containing hydrophilic compounds may be suitably selected and performed as necessary, in order to further improve the adhesiveness with the top layer, hydrophilicity, fouling resistance, and thermal insulation properties. Of course, the expansion treatment and sealing are not limited to those described above, and any well-known method may be performed.

<Sealing>

Possible examples of the sealing besides vapor sealing include sealing by an aqueous solution containing inorganic fluorine compounds such as treatment using zirconate fluoride only, treatment by sodium fluoride, vapor sealing by adding lithium chloride, and sealing by hot water.

Among these, preferred are sealing by an aqueous solution containing inorganic fluorine compounds, sealing by vapor, and sealing by hot water. Hereunder are respective descriptions thereof.

<<Sealing by Aqueous Solution Containing Inorganic Fluorine Compounds>>

Metal fluorides are preferred examples of the inorganic fluorine compounds used for the sealing by an aqueous solution containing inorganic fluorine compounds.

Specific examples thereof include sodium fluoride, potassium fluoride, calcium fluoride, magnesium fluoride, sodium zirconate fluoride, potassium zirconate fluoride, sodium titanate fluoride, potassium titanate fluoride, ammonium zirconate fluoride, ammonium titanate fluoride, potassium titanate fluoride, zirconate fluoride, titanate fluoride, hexafluorosilicic acid, nickel fluoride, iron fluoride, phosphate fluoride, and ammonium phosphate fluoride. Among these, preferred are sodium zirconate fluoride, sodium titanate fluoride, zirconate fluoride, and titanate fluoride.

The concentration of the inorganic fluorine compound in the aqueous solution is preferably not less than 0.01 mass %, more preferably not less than 0.05 mass % from the point of sufficient sealing of the microspores in the anodic oxide coating, and is preferably not more than 1 mass %, more preferably not more than 0.5 mass % from the point of the fouling resistance.

The aqueous solution containing the inorganic fluorine compound preferably further contains the phosphate compound. If the phosphate compound is contained, the surface hydrophilicity of the anodic oxide coating is improved, so that the developability and the fouling resistance can be improved.

Preferred examples of the phosphate compounds include a metal phosphate such as an alkali metal and an alkali earth metal.

Specifically, examples thereof include zinc phosphate, aluminum phosphate, ammonium phosphate, diammonium hydrogenphosphate, ammonium dihydrogenphosphate, ammonium phosphate, potassium phosphate, sodium phosphate, potassium dihydrogenphosphate, dipotassium hydrogenphosphate, calcium phosphate, sodium ammonium hydrogenphosphate, magnesium hydrogenphosphate, magnesium phosphate, ferrous phosphate, ferric phosphate, sodium dihydrogenphosphate, sodium biphosphate, disodium hydrogenphosphate, lead phosphate, diammonium phosphate, calcium dihydrogenphosphate, lithium phosphate, phosphorus wolframate, ammonium phosphowolframate, sodium phosphowolframate, ammonium phosphomolybdate, sodium phosphomolybdate, sodium phosphite, sodium tripolyphosphate and sodium pyrophosphate. Among these, sodium dihydrogenphosphate, disodium hydrogenphosphate, potassium dihydrogenphosphate and dipotassium hydrogenphosphate are preferred.

The combination of the inorganic fluorine compound and the phosphate compound is not specifically limited. However, the aqueous solution preferably contains at least sodium zirconate fluoride as an inorganic fluorine compound and at least sodium dihydrogenphosphate as a phosphate compound.

The concentration of the phosphate compound in the aqueous solution is preferably not less than 0.01% by mass, more preferably not less than 0.1% by mass from the point of improving the developability and fouling resistance, and is preferably not more than 20% by mass, more preferably not more than 5% by mass from the point of the solubility.

The ratio of the respective compounds in the aqueous solution is not specifically limited. However, the mass ratio of the inorganic fluorine compound and the phosphate compounds is preferably 1/200 to 10/1, more preferably 1/30 to 2/1.

Moreover, the temperature of the aqueous solution is preferably not less than 20° C., more preferably not less than 40° C., and preferably not more than 100° C., more preferably not more than 80° C.

The aqueous solution is preferably not less than pH1, more preferably not less than pH2, and preferably not more than pH11, more preferably not more than pH5.

The method of sealing by an aqueous solution containing the inorganic fluorine compound is not specifically limited, and examples thereof include a soaking method and a spraying method. One type thereof may be solely used for a plurality of times, or two or more types thereof may be used in combination.

Among these, the soaking method is preferred. If the soaking method is used for treatment, the treatment time is preferably not less than 1 second, preferably not less than 3 seconds, and preferably not more than 100 seconds, more preferably not more than 20 seconds.

<<Sealing by Vapor>>

Examples of sealing by vapor include a method in which a pressurized or atmospheric vapor is continuously or discontinuously made in contact with an anodic oxide coating.

The temperature of the vapor is preferably not less than 80° C., more preferably not less than 95° C., and not more than 105° C.

The pressure of the vapor is preferably within a range from (atmospheric pressure −50 mmAq) to (atmospheric pressure +300 mmAq) ($1.008 \times 10^5$ to $1.043 \times 10^5$ Pa).

Moreover, the time for making the vapor in contact is preferably not less than 1 second, more preferably not less than 3 seconds, and not more than 100 seconds, more preferably not more than 20 seconds.

<<Sealing by Hot Water>>

Examples of sealing by hot water include a method in which an aluminum plate having an anodic oxide coating formed is soaked in hot water.

The hot water may contain inorganic salts (such as phosphate) or organic salts.

The temperature of the hot water is preferably not less than 80° C., more preferably not less than 95° C., and not more than 100° C.

Moreover, the time for soaking in hot water is preferably not less than 1 second, more preferably not less than 3 seconds, and not more than 100 seconds, more preferably not more than 20 seconds.

Examples of the hydrophilizing used in the present invention include an alkali metal silicate method described in U.S. Pat. Nos. 2,714,066, 3,181,461, 3,280,734, and 3,902,734. In the method, the support is soaked in an aqueous solution such as sodium silicate, or electrolyzed. Other examples include a method of treatment using potassium zirconate fluoride described in JP-B No. 36-22063, and a method of treatment using polyvinylsulfonic acid described in U.S. Pat. Nos. 3,276,868, 4,153,461, and 4,689,272.

The central line average roughness of the support of the present invention is preferably 0.10 to 1.2 μm. Within this range, excellent adhesiveness with the image recording layer, excellent printing durability, and excellent fouling resistance can be obtained.

If the inkjet recording ink of the present invention is ejected onto the surface of the hydrophilic support, it is preferable that the inkjet recording ink is heated to 40 to 80° C., preferably 25 to 30° C. so as to decrease the viscosity of the ink composition to 7 to 30 mPa·s, preferably 7 to 20 mPa·s, and then ejected. In particular, usage of an ink composition having an ink viscosity of 35 to 500 mPa·s at 25° C. provides a great effect. By using this method, high ejecting stability can be achieved.

The radioactive ray curable inkjet recording ink such as the ink of the present invention generally has a greater viscosity than that of an aqueous ink that is normally used for the inkjet recording ink. Therefore the viscosity fluctuates a lot due to the temperature fluctuation at the time of printing. The fluctuation of the ink viscosity has a large affect on the change in the droplet size and the droplet ejecting speed, causing deterioration in the image quality. Therefore, it is required to keep the ink temperature at the time of printing as constant as possible. Therefore, the temperature control range of the present invention is suitably ±5° C., preferably ±2° C., and more preferably ±1° C. with respect to the set temperature.

(Inkjet Recording Apparatus)

The inkjet recording apparatus used in the present invention is not specifically limited, and a commercially available inkjet recording apparatus can be used. That is, in the present invention, the recording can be performed onto the recording medium using a commercially available inkjet recording apparatus.

The inkjet recording apparatus of the present invention includes for example an ink supply system, a temperature sensor, and a radioactive source.

The ink supply system comprises, for example: a source tank containing the inkjet recording ink of the present invention; supply piping; an ink supply tank immediately in front of an inkjet head; a filter; and a piezo type inkjet head. The piezo type inkjet head can be driven so that multisize dots of 1 to 100 pl, preferably 8 to 30 pl can be ejected with a resolution of for example 320×320 to 4000×4000 dpi, preferably 400×400 to 1600×1600 dpi, and more preferably 720×720 dpi. In the present invention dpi denotes the number of dots per 2.54 cm.

As described above, it is desirable that radiation-curable ink discharged from nozzles be kept at a predetermined temperature. Therefore, it is possible to thermally insulate or heat a portion from the ink supply tank to the inkjet head. For example, the following method may be used as a temperature control method: a plurality of temperature sensors are provided each pipe; and heating control is performed on the basis of the amount of ink flowing through the pipe and an environmental temperature. However, the invention is not limited thereto. The temperature sensors can be provided in the ink supply tank and around the nozzles of the inkjet head. It is preferable that the heating head unit be thermally insulated or shielded such that the main body of the apparatus is not influenced by a variation in temperature due to the air from the outside. In order to shorten the printer warming-up time required for heating or reduce the loss of thermal energy, it is preferable to perform thermal insulation from other portions and to reduce the overall thermal capacity of the heating unit.

[Process of Curing the Ejected Ink Composition by Irradiation of Active Radiation onto the Ejected Ink Composition so as to Form a Hydrophobic Image on the Support with the Cured Ink Composition]

The ink composition ejected onto the surface of the support is cured by irradiating the active radiation. At this time, when a sensitizing dye is present, together with a polymerization initiator (photoinitiator), in the ink composition, the sensitizing dye in the system is excited by absorbing the active radiation and facilitates decomposition of the polymerization initiator by contacting with the polymerization initiator to achieve a higher sensitive curing reaction.

Here the radioactive rays to be used include α rays, γ rays, electron beams, X rays, ultraviolet rays, visible light, and infrared light. The peak wavelength of the radioactive ray depends on the absorption property of the sensitizing dye. However, it is suitable if this is for example, 200 to 600 nm, preferably 300 to 450 nm, and more preferably 350 to 420 nm. Moreover, the polymerization initiation system of the present invention has sufficient sensitivity even to radioactive rays of low output. Therefore, the output of the radioactive rays is suitably within an irradiation energy of for example not more than 2000 mJ/cm$^2$, preferably 10 to 2000 mJ/cm$^2$, more preferably 20 to 1000 mJ/cm$^2$, and even more preferably 50 to 800 mJ/cm$^2$. The radioactive rays are suitably irradiated at an exposure face illuminance of for example 10 to 2000 mW/cm$^2$, preferably 20 to 1000 mW/cm$^2$.

As the radioactive source, a mercury-vapor lamp or a gas/solid state laser are mainly used. For the ultraviolet ray curable inkjet, a mercury-vapor lamp and a metal halide lamp are widely known. However, presently, a mercury-free lamp is strongly desired from the viewpoint of environmental protection, and it is industrially and environmentally very useful to replace it by a GaN semiconductor ultraviolet light emitting device. Furthermore, the LED (UV-LED) and the LD (UV-LD) has small size, long life, high efficiency, and low cost, which is expected for a light source for a light curable inkjet.

Moreover, the light emitting diode (LED) and the laser diode (LD) can be used as a radioactive source. In particular, if an ultraviolet source is required, a UV-LED and a UV-LD can be used. For example, Nichia Corporation has brought into the market a purple LED having the wavelength of the main emission spectrum between 365 nm and 420 nm. If a still shorter wavelength is required, an LED emitting radioactive rays having the wavelength center between 300 nm and 370 nm is disclosed in U.S. Pat. No. 6,084,250. Moreover, other UV-LEDs are available, and radiation having different ultraviolet bands can be irradiated. A particularly preferred radioactive source in the present invention is a UV-LED, and more particularly preferred is a UV-LED having a peak wavelength at 350 to 420 nm.

The maximum illuminance on the recording medium of LED is preferably 10 to 2,000 mW/cm$^2$, more preferably 20 to 1,000 mW/cm$^2$, particularly preferably 50 to 800 mW/cm$^2$.

The inkjet recording ink of the present invention is suitably irradiated by such radioactive rays for, for example 0.01 to 120 seconds, preferably 0.1 to 90 seconds.

The irradiation condition and basic irradiation method of the radioactive rays is disclosed in JP-A No. 60-132767. Specifically, it is performed by providing light sources on the both sides of a head unit including the ink ejecting device, and scanning the head unit and the light sources by a so-called shuttle method. The radioactive rays are irradiated after a fixed time (for example 0.01 to 0.5 seconds, preferably 0.01 to 0.3 seconds, more preferably 0.01 to 0.15 seconds) after the ink is deposited. Such a control of the time from ink depositing to irradiation within a very short time enables preventing bleeding of the ink deposited onto the recording medium before being cured. Moreover, since a porous recording medium can also be exposed to light before the ink is permeated to the deep part where the light source can not reach, residual unreacted monomer can be reduced, resulting in odor reduction.

Furthermore, the curing may be completed by another light source without driving. A method of using an optical fiber, and a method wherein a collimated light source is faced to a mirror surface provided on the side face of a head unit to irradiate UV light to a recording unit are disclosed as an irradiation method in WO99/54415.

Thus, according to the method of producing a planographic printing plate according to the present invention, it is possible to form a hydrophobic image on the surface of a support by using the ink composition according to the present invention and curing the ejected ink composition by irradiation of active radiation.

As described above, the curable compositions A, B and C of the present invention can be suitably used for an ink composition and, in particular, for an inkjet-recording ink composition. Such an ink composition is cured at high sensitivity with irradiation of radiation such as ultraviolet rays and forms a high-quality image.

Further, the curable compositions A, B and C of the present invention are useful as a component for ink compositions such as UV-curing ink, coating materials, and adhesives and also as an optical material used in production of resists, color filters, optical disks, or the like.

The ink composition of the present invention including the curable composition A, B or C of the present invention is cured at high sensitivity, and forms a high-strength image region based directly on digital data by application of the inkjet-recording method, even when the ink composition is ejected on a non-absorptive recording medium. Thus, the ink composition of the present invention can be used suitably for production of a planographic printing plate, in particular a planographic printing plate having an A2-sized or larger area, and the planographic printing plate thus prepared is superior in printing durability.

Further, the ink composition according to the present invention is cured at high sensitivity by irradiation with active radiation and gives at higher sensitivity a hydrophobic region (hydrophobic image) superior in adhesiveness to the support and flexibility. For that reason, the planographic printing plate (planographic printing plate according to the present invention) obtained by the method of producing a planographic printing plate according to the present invention has an image region superior in image quality and flexibility and also in printing durability.

EXAMPLES

Hereinafter, the present invention will be described in more detail by reference to Examples and Comparative Examples, but the invention is not limited to these examples.

Example 1-1

Each crude color inks 1-1 thus prepared was filtered through a filter having an absolute filtration precision of 2 μm to obtain ink 1-1 of each color.

<<Inkjet Image Recording>>

Next, recording on a recording medium was performed using a commercially available inkjet recording apparatus having a piezo type inkjet nozzle. The ink supply system has an initial tank, a supply piping, an ink supply tank immediately in front of an inkjet head, a filter, and a piezo type inkjet head. The heat insulation and heating were performed from <<Preparation of ink>>

<Yellow ink 1-1>

| | |
|---|---|
| C.I. Pigment Yellow 13 | 5 parts by mass |
| Photocationic polymerization initiator: triphenylsulfonium salt (UVI-6992: manufactured by Dow Chemical Company) | 6 parts by mass |
| Sensitization dye: 9,10-dibutoxyanthracene | 3 parts by mass |
| Polymerizable compound | |
| Monomer: 3,4-epoxycyclohexylmethyl-3',4'-epoxycyclohexane carboxylate (Celoxide 2021A: manufactured by Daicel-UCB Co. Ltd.) | 35 parts by mass |
| Monomer: 3,7-bis(3-oxetanyl)-5-oxanonane (OXT-221: manufactured by Toagosei Co., Ltd.) | 40 parts by mass |
| Monomer: the following specific polymerizable compound (C-1) | 11 parts by mass |

Specific polymerizable compound (c-1)

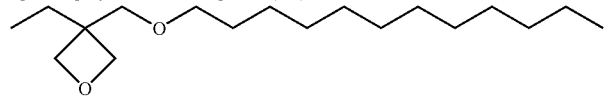

<Magenta ink 1-1>

| | |
|---|---|
| C.I. Pigment Red 57:1 | 5 parts by mass |
| Photocationic polymerization initiator: triphenylsulfonium salt (UVI-6992: manufactured by Dow Chemical Company) | 6 parts by mass |
| Sensitization dye: 9,10-dibutoxyanthracene | 3 parts by mass |
| Polymerizable compound | |
| Monomer: 3,4-epoxycyclohexylmethyl-3',4'-epoxycyclohexane carboxylate (Celoxide 2021A: manufactured by Daicel-UCB Co.) | 35 parts by mass |
| Monomer: 3,7-bis(3-oxetanyl)-5-oxanonane (OXT-221: manufactured by Toagosei Co., Ltd.) | 40 parts by mass |
| Monomer: the specific polymerizable compound (c-1) | 11 parts by mass |

<Cyan ink 1-1>

| | |
|---|---|
| C.I. Pigment blue 15:3 | 5 parts by mass |
| Photocationic polymerization initiator: triphenylsulfonium salt (UVI-6992, manufactured by Dow Chemical Company) | 6 parts by mass |
| Sensitization dye, 9,10-dibutoxyanthracene | 3 parts by mass |
| Polymerizable compound | |
| Monomer: 3,4-epoxycyclohexylmethyl-3',4'-epoxycyclohexanecarboxylate (Celoxide 2021A: manufactured by Daicel-UCB Co.) | 35 parts by mass |
| Monomer: 3,7-bis(3-oxetanyl)-5-oxanonane (OXT-221: manufactured by Toagosei Co., Ltd.) | 40 parts by mass |
| Monomer: the specific polymerizable compound (c-1) | 11 parts by mass |

<Black ink 1-1>

| | |
|---|---|
| (C) CI. Pigment black 7 | 5 parts by mass |
| (B) Photocationic polymerization initiator: triphenylsulfonium salt (UVI-6992, manufactured by Dow Chemical Company) | 6 parts by mass |
| Sensitization dye: 9,10-dibutoxyanthracene | 3 parts by mass |
| Polymerizable compound | |
| Monomer: 3,4-epoxycyclohexylmethyl-3',4'-epoxycyclohexane carboxylate (Celoxide 2021A: manufactured by Daicel-UCB Co.) | 35 parts by mass |
| Monomer: 3,7-bis(3-oxetanyl)-5-oxanonane (OXT-221: manufactured by Toagosei Co., Ltd.) | 40 parts by mass |
| Monomer: the specific polymerizable compound (c-1) | 11 parts by mass | the ink supply tank to the inkjet head. The temperature sensors were respectively provided in the vicinity of the ink supply tank and the nozzle of the inkjet head to perform temperature control such that the nozzle part was always at 70° C.±2° C. The piezo type inkjet head was driven such that multi-size dots of 8 to 30 pl can be ejected with a resolution of 720×720 dpi. After spotting, the exposure system, the main scanning speed, and the ejection frequency were adjusted such that UV rays were concentrated to an exposure illuminance of 100 mW/cm², and the irradiation starts after 0.1 second since ink was spotted onto the recording medium. Moreover, the exposure time was variable to irradiate exposure energy. The term 'dpi' in the invention denotes the number of dots per 2.54 cm.

<Formation and Evaluation of Color Image>

Ink of each color prepared above was respectively ejected at an environmental temperature of 25° C., in an order of black→cyan→magenta→yellow, and the ultraviolet rays were irradiated for each color using a metal halide lamp (Trade Name: Vzero 085, manufactured by Integration Technology, Co., Ltd.). Light exposure was performed such that the total exposure energy per one color is uniform, that is, 100 mJ/cm², as energy for complete curing, to eliminate stickiness in a touch test. The respective color images were recorded on a grained aluminum substrate, a biaxial oriented transparent polypropylene film that was subjected to a surface treatment to give printability, a soft polyvinyl chloride sheet, a cast coated paper, and a commercially available recycled paper, as the recording medium. As a result, all provided an image of high resolution without dot bleeding. Further, on a woodfree paper, ink did not penetrate to the backside, and ink was sufficiently cured with almost no odor due to unreacted monomer. In addition, ink recorded onto the film had sufficient flexibility. Even if the film was bent, no crack occurred in ink, and there was no peeling and no problem found in the adhesiveness test by Cellophane Tape (Registered Trademark) peeling.

Example 1-2

<Magenta Ink 1-2>

A magenta ink 1-2 was prepared in a similar manner as the magenta ink 1-1, except that, among the monomers used as polymerizable compounds in magenta ink 1 prepared in Example 1, the 11 parts by mass of the specific polymerizable compound (c-1) was replaced with 11 parts by mass of the following specific polymerizable compound (c-2).

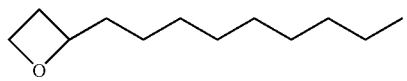

Specific polymerizable compound (c-2)

Example 1-3

<Magenta Ink 1-3>

A magenta ink 1-3 was prepared in a similar manner as the magenta ink 1-1, except that, among the monomers used as polymerizable compounds in magenta ink 1 prepared in Example 1, the 11 parts by mass of the specific polymerizable compound (c-1) was replaced with 11 parts by mass of the following specific polymerizable compound (c-3).

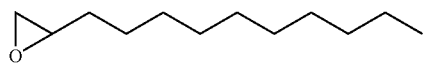

Specific polymerizable compound (c-3)

Example 1-4

<Magenta Ink 1-4>

A magenta ink 1-4 was prepared in a similar manner as the magenta ink 1-1, except that, among the monomers used as polymerizable compounds in magenta ink 1 prepared in Example 1, the 11 parts by mass of the specific polymerizable compound (c-1) was replaced with 11 parts by mass of the following specific polymerizable compound (c-4).

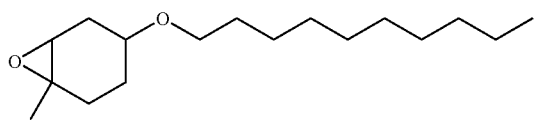

Specific polymerizable compound (c-4)

Example 1-5

<Magenta Ink 1-5>

A magenta ink 1-5 was prepared in a similar manner as the magenta ink 1-1, except that, the 3 parts by mass of "9,10-dibutoxyanthracene" used as a Sensitization dye in the magenta ink 1-1 prepared in Example 1 was replaced with 3 parts by mass of "Darocur ITX (manufactured by Ciba Specialty Chemicals)".

Comparative Example 1-1

<Magenta Ink 1-6>

A magenta ink 1-6 was prepared in a similar manner as the magenta ink 1-1, except that, among the monomers used the polymerizable compounds in the magenta ink 1-1 prepared in Example 1, the 40 parts by mass of 3,7-bis(3-oxetanyl)-5-oxanonane (OXT-221: manufactured by Toagosei Co., Ltd.) and 11 parts by mass of the specific polymerizable compound (c-1) were replaced with 51 parts by mass of 3,7-bis(3-oxetanyl)-5-oxanonane (OXT-221: manufactured by Toagosei Co., Ltd.).

Comparative Example 1-2

<Magenta Ink 7>

A magenta ink 1-7 was prepared in a similar manner as the magenta ink 1-1, except that, among the monomers used the polymerizable compounds in the magenta ink 1-1 prepared in Example 1, the 11 parts by mass of specific polymerizable compound (c-1) was replaced with 11 parts by mass of the following comparative polymerizable compound (1).

Comparative polymerizable compound (1)

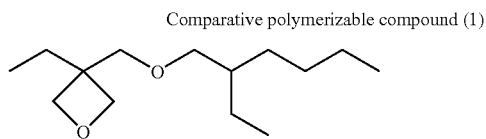

Each of the crude magenta inks 1-2 to 1-7 prepared in Examples 1-2 to 1-5 and Comparative Example 1-1 and 1-2 was filtered through a filter having an absolute filtration precision of 2 μm to obtain each of magenta inks 1-2 to 1-7.

The ink viscosity of each ink compositions prepared in Examples and Comparative Examples above was in the range of 7 to 20 mPa·s at the ink ejection temperature.

<Evaluation>

The sensitivity needed for curing each ink was measured by the following method.

In addition, the magenta inks 1-1 to 1-7 prepared in Examples 1-1 to 1-5 and Comparative Examples 1-1 and 1-2 were used, and magenta images were formed in the same manner as the method described in Example 1. For each formed image, the evaluations of the adhesiveness of the formed image to a recording medium, and the flexibility of the cured material were performed by the following methods.

1-1. Measurement of Curing Sensitivity

The amount (mJ/cm$^2$) of exposure energy providing no stickiness on an image surface after irradiation of ultraviolet rays was defined as the curing sensitivity. A smaller numeric value means high sensitivity.

1-2. Evaluation of Flexibility

The flexibility was evaluated by using a PVC sheet (manufactured by Avery) as the recording medium.

The evaluation of flexibility was performed according to a degree of a crack generated a cured film (image) after bending a PVC sheet having a magenta image ten times. The bending test is a functional evaluation of a five scale evaluation when a state where no crack is generated is set to a value of five. The value of three or more is evaluated as a state where no problem for practical use exists.

1-3. Evaluation of the Adhesiveness to Recording Medium

The adhesiveness to recording medium was evaluated by using an acrylic plate (manufactured by Repsol) or a PC plate (manufactured by Lexan) as the recording medium.

The adhesiveness of the acrylic or PC plate having a magenta image was evaluated in a cross hatch test (EN ISO2409). A higher value in the test is favorable, and a value of 3B or higher indicates that the adhesiveness to medium is in the state practically without problem.

TABLE 1

| | Magenta ink number | Sensitivity (mJ/cm$^2$) | Flex- ibility | Adhesiveness (to acrylic plate) | Adhesive- ness (to PC plate) |
|---|---|---|---|---|---|
| Example 1-1 | 1-1 | 250 | 5 | 4B | 4B |
| Example 1-2 | 1-2 | 250 | 5 | 4B | 4B |
| Example 1-3 | 1-3 | 250 | 5 | 3B | 4B |
| Example 1-4 | 1-4 | 250 | 4 | 3B | 4B |
| Example 1-5 | 1-5 | 250 | 5 | 4B | 4B |
| Comparative Example 1-1 | 1-6 | 410 | 2 | 1B | 1B |
| Comparative Example 1-2 | 1-7 | 250 | 2 | 2B | 2B |

As apparent form Table 1, the ink compositions according to the present invention (magenta inks 1-1 to 1-5) are highly sensitive, and the obtained image using the compositions exhibit excellent flexibility and adhesiveness to the recording medium.

Meanwhile, the magenta inks 1-6 and 1-7 obtained in Comparative Examples 1-1 and 1-2 are inferior in flexibility and adhesiveness to the recording medium of the resultant image.

1-4. Evaluation of Color Image

A color image was formed by using a combination of the black ink 1-1, cyan ink 1-1, and yellow ink 1-1 obtained in Example 1-1 and the magenta inks 1-2 to 1-5 obtained in Example 1-2 to 1-5 in the following manner.

Ink of each color prepared above was respectively ejected at an environmental temperature of 25° C., in an order of black→cyan→magenta→yellow, and the ultraviolet rays were irradiated for each color using a metal halide lamp (Trade Name: Vzero 085, manufactured by Integration Technology, Co., Ltd.). Light exposure was performed such that the total exposure energy per one color is uniform, that is, 100 mJ/cm$^2$, as energy for complete curing, to eliminate stickiness in a touch test. The respective color images were recorded on a grained aluminum substrate, a biaxial oriented transparent polypropylene film that was subjected to a surface treatment to give printability, a soft polyvinyl chloride sheet, a cast coated paper, and a commercially available recycled paper, as the recording medium. As a result, all provided an image of high resolution without dot bleeding. Further, on a woodfree paper, ink did not penetrate to the backside, and ink was sufficiently cured with almost no odor due to unreacted monomer. In addition, ink recorded onto the film had sufficient flexibility. Even if the film was bent, no crack occurred in ink, and there was no peeling and no problem found in the adhesiveness test by Cellophane Tape (Registered Trademark) peeling.

Example 1-6

Image Formation by Light-emitting Diode (LED)

An inkjet image recording was performed in a similar manner to Example 1-1, except that the magenta ink 1-1 prepared in Example 1-1 was used and the metal halide lamp Vzero085 manufactured by Integration Technology was replaced with an ultraviolet light-emitting diode (UV-LED).

The UV-LED used in the present Example was NCCU033 manufactured by Nichia Corporation. The LED emitted an UV ray having a wavelength of 365 nm from the tip, and a ray at an intensity of approximately 100 mW per tip when a current of approximately 500 mA was applied. It was possible to give a power of 0.3 W/cm$^2$ on the surface of the recording medium by using multiple tips placed at an interval of 7 mm. The period from ejection to exposure and the exposure period were variable according to the traveling speed of the recording medium and the distance between the head and the LED. In the present Example, the image was exposed to the light, approximately 0.5 second after ejection.

It was possible to adjust the exposure energy on the recording medium in the range of 0.01 to 15 J/cm$^2$ according to the settings for the distance to medium and the traveling speed.

Comparative Example 1-3

Image Formation by Light-emitting Diode (LED)

An inkjet image was recorded in a similar manner as the Example 1-6, except that the magenta ink 1-1 used in Example 1-6 was replaced with the magenta ink 1-6 prepared in Comparative Example 1-1.

<Evaluation>

The sensitivity needed for curing of the inks prepared in Example 1-6 and Comparative Example 1-3 was measured according to the method above.

In addition, the adhesiveness to the recording medium and the flexibility the image formed with the ink prepared in Example 1-6 or Comparative Example 1-3 were evaluated according to the method as described above.

Evaluation results are shown in Table 2.

TABLE 2

| | Magenta ink number | Sensitivity (mJ/cm$^{-2}$) | Flex-ibility | Adhesiveness (to acrylic plate) | Adhesiveness (to PC plate) |
|---|---|---|---|---|---|
| Example 1-6 | 1-1 | 50 | 5 | 4B | 4B |
| Comparative Example 1-3 | 1-6 | 300 | 2 | 1B | 1B |

As apparent form Table 2, the ink composition according to the present invention (magenta ink 1-1) was highly sensitive to the ultraviolet light-emitting diode and the image obtained was image superior in flexibility and the adhesiveness to the recording medium.

Comparison of the results shown in Table 1 obtained by using an ultraviolet ray lamp with those shown in Table 2 obtained by using an ultraviolet light-emitting diode reveals that the ink compositions are more sensitive to the light from ultraviolet light-emitting diode than to radiation.

Example 1-7

—Preparation of Support—

Molten aluminum was prepared by using an aluminum alloy in a composition (consisting of Al, Si: 0.06% by mass, Fe: 0.30% by mass, Cu: 0.025% by mass, Mn: 0.001% by mass, Mg: 0.001% by mass, Zn: 0.001% by mass, Ti: 0.03% by mass, and unavoidable impurities); and the molten aluminum was filtered and molded into ingots having a thickness of 500 mm and a width of 1,200 mm by DC casting. The surface of the ingot was scraped to an average depth of 10 mm by a surface grinder, and the ingot was heated consistently at 550° C. for approximately 5 hours, and hot-rolled into a rolled plate having a thickness of 2.7 mm after it is cooled to a temperature of 400° C. The plate was heat-treated additionally at 500° C. in a continuous annealing machine, and cold-rolled into a JIS 1050 aluminum plate having a thickness of 0.24 mm. The width and the length of the average crystal grain in the aluminum plate obtained were respectively 50 μm and 300 μm. After the aluminum plate was cut to a width of 1,030 mm, it was subjected to the following surface treatment.

—Surface Treatment—

The following various treatments (a) to (j) were performed continuously. The processing solution remaining on the aluminum plate was removed by nip roller, after each treatment and washing with water.

(a) Mechanical Surface-roughening Treatment

The aluminum plate was surface-roughened mechanically with a revolving roller-shaped nylon brush, while an abrasional slurry suspension of an abrasive having a specific gravity of 1.12 (pumice) in water is supplied to the surface of the aluminum plate. The average diameter of the abrasive particles was 30 μm, and the maximum diameter 100 μm. The nylon brush is made of 6·10 nylon, and the length and the diameter of the bristles were respectively 45 mm and 0.3 mm. The nylon brush was planted on a ϕ300 mm stainless steel tube as it is embedded in the holes therein. Three rotating brushes were used. The distance between the two supporting rollers (ϕ200 mm) at the bottom of the brush was 300 mm. The brush roller was pressed hard onto the aluminum plate, until the load of the drive motor rotating the brush reaches 7 kW or more larger than the load before the roller is pressed thereon. The rotation direction of the brush was the same as the traveling direction of the aluminum plate. The rotation frequency of the brush was 200 rpm.

(b) Alkaline Etching Treatment

The aluminum plate thus obtained was etched by spraying it with an aqueous solution containing caustic soda and aluminum ion at concentrations respectively of 2.6% by mass and 6.5% by mass at a temperature of 70° C. and dissolving the aluminum plate in an amount of 10 g/m$^2$. The aluminum plate was then washed with water by spraying.

(C) Desmutting Treatment

The aluminum plate was desmutted by spraying it with an aqueous solution at a temperature of 30° C. containing nitric acid at a concentration of 1% by mass (also containing aluminum ion at 0.5% by mass) and then washed with water by spraying. The aqueous solution nitrate used in desmutting used was the wastewater discharged from the step of electrochemical surface-roughening treatment in an aqueous nitric acid solution by using AC current.

(d) Electrochemical Surface-roughening Treatment

The aluminum plate was then surface-roughened electrochemically, continuously by applying a 60-Hz AC voltage. The electrolyte solution used then was an aqueous solution containing 10.5 g/L nitric acid (also containing aluminum ion at 5 g/L and ammonium ion at 0.007% by mass), and the liquid temperature was 50° C. The electrochemical surface-roughening treatment was performed by using a trapezoidal alternate current at an electric-current transition period from zero to the peak TP of 0.8 msec and a duty ratio of 1:1, and also using a carbon electrode as the counter electrode. The auxiliary anode used was ferrite.

The electric current density was 30 A/dm$^2$ at the maximum, and when an aluminum plate is used as the anode, the total amount of electric current applied was 220 C/dm$^2$. Part (5%) of the current from power source was divided and sent to the auxiliary electrode. Subsequently, the aluminum plate was washed with water by spraying.

(e) Alkaline Etching Treatment

The aluminum plate was etched by spraying it with an aqueous solution containing caustic soda and aluminum ion at concentrations respectively of 26% by mass and 6.5% by mass at 32° C. and dissolving the aluminum plate in an amount of 0.50 g/m$^2$; and the smuts mainly of aluminum hydroxide generated in the electrochemical surface-roughening treatment was removed and the edge region of the bit was dissolved, smoothening the edge region, by using the AC current in the stage above. The aluminum plate was then washed with water by spraying.

(f) Desmutting Treatment

The aluminum plate was desmutted by spraying it with an aqueous 15% by mass sulfuric acid solution (also containing aluminum ion at 4.5% by mass) at a temperature of 30° C., and then, washed with water by spraying. The aqueous nitric acid solution used in the desmutting treatment was the wastewater from the step of electrochemical surface-roughening treatment in an aqueous nitric acid solution by using AC current.

(g) Electrochemical Surface-roughening Treatment

The aluminum plate was surface-roughened electrochemically, continuously by using a 60-Hz AC voltage. The electrolyte solution used then was an aqueous 5.0 g/L hydrochloric acid solution (also containing aluminum ion at 5 g/L) at a temperature of 35° C. The electrochemical surface-roughening treatment was performed by using a trapezoidal alternate current at an electric-current transition period of from zero to the peak TP of 0.8 msec and a duty ratio of 1:1 and also using a carbon electrode as the counter electrode. The auxiliary anode used was ferrite.

The electric current density was 25 A/dm$^2$ at the maximum, and when an aluminum plate is used as the anode, the total amount of electric current applied was 50 C/dm$^2$. The aluminum plate was then washed with water by spraying.

(h) Alkaline Etching Treatment

The aluminum plate was etched by spraying it with an aqueous solution containing caustic soda and aluminum ion at concentrations respectively of 26% by mass and 6.5% by mass at 32° C. and dissolving the aluminum plate in an amount of 0.12 g/m$^2$; and the smuts mainly of aluminum hydroxide generated in the electrochemical surface-roughening treatment was removed and the edge region of the bit was dissolved, smoothening the edge region, by using the AC current in the stage above. The aluminum plate was then washed with water by spraying.

(i) Desmutting Treatment

The aluminum plate was desmutted by spraying it with an aqueous 25% by mass sulfuric acid solution (also containing aluminum ion at 0.5% by mass) at a temperature of 60° C., and then, washed with water by spraying.

(j) Anodizing Process

The aluminum plate was anodized in an anodic oxidation apparatus (the length of the first and second electrolysis units: 6 m, the length of the first and second power supply units: 3 m, and the length of the first and second power-supply electrode unit: 2.4 m). The electrolyte solution supplied to the first and second electrolysis units was sulfuric acid. The electrolyte solution was an aqueous 50 g/L sulfuric acid solution (also containing aluminum ion at 0.5% by mass) at a temperature of 20° C. The aluminum plate was then washed with water by spraying. The final amount of the oxide layer thus prepared was 2.7 g/m$^2$.

(Preparation and Evaluation of Planographic Printing Plate)

An image was formed and cured on the aluminum support prepared above with each of the magenta ink 1 obtained in Examples 1-1, in a similar manner as Example 1. The image thus obtained and the printing durability thereof were evaluated by using it as the planographic printing plate, according to the following method:

a. Evaluation of Image

An image was printed by using each of the planographic printing plates prepared with the magenta ink 1-1 of Example 1-1 in a Heidel KOR-D printing machine, while supplying ink [VALUES-G red for sheet-fed printing press (manufactured by Dainippon Ink and Chemicals, Inc.)] and dampening water [Ecolity 2 (manufactured by Fuji Photo Film)]. The image after printing on 100 papers was evaluated visually, revealing that the planographic printing plates prepared with the ink composition of the Example gave an image having no whitening in the image region and no stains in the nonimage region.

b. Evaluation of Printing Durability

Continued printing with the planographic printing plates gave 10,000 or more prints carrying a high-quality image having no whitening in the image region and no stains in the nonimage region, indicating that the plate was at the level practically without any problem in printing durability.

Example 2-1

Image Formation by Cationic Polymerization (Preparation of Ink)

<Yellow ink 2-1>

| | |
|---|---|
| C.I. Pigment Yellow 13 | 5 parts by mass |
| Photocationic polymerization initiator: triphenylsulfonium salt (UVI-6992, manufactured by Dow Chemical Company) | 6 parts by mass |
| Sensitization dye: 9,10-dibutoxyanthracene | 3 parts by mass |
| Polymerizable compound | |
| Monomer: 3,4-epoxycyclohexylmethyl-3',4'-epoxycyclohexane carboxylate (Celoxide 2021A, manufactured by Daicel-UCB Co.) | 5 parts by mass |
| Monomer: 3,7-bis(3-oxetanyl)-5-oxanonane (OXT-221, manufactured by Toagosei Co., Ltd.) | 71 parts by mass |
| Monomer: the following compound (b-1) | 10 parts by mass |

Compound (b-1)

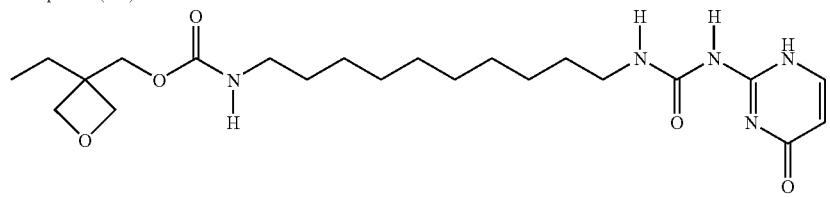

<Magenta ink 2-1>

| | |
|---|---|
| C.I. Pigment Red 57:1 | 5 parts by mass |
| Photocationic polymerization initiator: triphenylsulfonium salt (UVI-6992, manufactured by Dow Chemical Company) | 6 parts by mass |
| Sensitization dye: 9,10-dibutoxyanthracene | 3 parts by mass |
| Polymerizable compound | |
| Monomer: 3,4-epoxycyclohexylmethyl-3',4'-epoxycyclohexane carboxylate (Celoxide 2021A, manufactured by Daicel-UCB Co.) | 5 parts by mass |
| Monomer: 3,7-bis(3-oxetanyl)-5-oxanonane (OXT-221, manufactured by Toagosei Co., Ltd.) | 71 parts by mass |
| Monomer: the compound (b-1) | 10 parts by mass |

<Cyan ink 2-1>

| | |
|---|---|
| C.I. Pigment blue 15:3 | 5 parts by mass |
| Photocationic polymerization initiator: triphenylsulfonium salt (UVI-6992, manufactured by Dow Chemical Company) | 6 parts by mass |
| Sensitization dye: 9,10-dibutoxyanthracene | 3 parts by mass |
| Polymerizable compound | |
| Monomer:3,4-epoxycyclohexylmethyl-3',4'-epoxycyclohexanecarboxylate (Celoxide 2021A, manufactured by Daicel UCB) | 5 parts by mass |
| Monomer: 3,7-bis(3-oxetanyl)-5-oxanonane (OXT-221, manufactured by Toagosei Co., Ltd.) | 71 parts by mass |
| Monomer: the compound (a-1) | 10 parts by mass |

<Black ink 2-1>

| | |
|---|---|
| C.I. Pigment black 7 | 5 parts by mass |
| Photocationic polymerization initiator: triphenylsulfonium salt (UVI-6992, manufactured by Dow Chemical Company) | 6 parts by mass |
| Sensitization dye: 9,10-dibutoxyanthracene | 3 parts by mass |
| Polymerizable compound | |
| Monomer: 3,4-epoxycyclohexylmethyl-3',4'-epoxycyclohexanecarboxylate (Celoxide 2021A: manufactured by Daicel-UCB Co.) | 5 parts by mass |
| Monomer: 3,7-bis(3-oxetanyl)-5-oxanonane (OXT-221, manufactured by Toagosei Co., Ltd.) | 71 parts by mass |
| Monomer: the compound (b-1) | 10 parts by mass |

Each crude color inks 2-1 thus prepared was filtered through a filter having an absolute filtration precision of 2 µm to obtain ink 2-1 of each color.

<<Inkjet Image Recording>>

(Evaluation of Multicolor Image)

Next, an image was recorded on a recording medium by using a commercially available inkjet-recording apparatus equipped with a piezoelectric inkjet nozzle, in a similar manner as Example 1-1.

<Formation and Evaluation of Color Image>

Ink of each color prepared above was respectively ejected at an environmental temperature of 25° C., in an order of black→cyan→magenta→yellow, and the ultraviolet rays were irradiated for each color using a metal halide lamp (Trade Name: Vzero 085, manufactured by Integration Technology, Co., Ltd.). Light exposure was performed such that the total exposure energy per one color is uniform, that is, 100 mJ/cm$^2$, as energy for complete curing, to eliminate stickiness in a touch test. The respective color images were recorded on a grained aluminum substrate, a biaxial oriented transparent polypropylene film that was subjected to a surface treatment to give printability, a soft polyvinyl chloride sheet, a cast coated paper, and a commercially available recycled paper, as the recording medium. As a result, all provided an image of high resolution without dot bleeding. Further, on a woodfree paper, ink did not penetrate to the backside, and ink was sufficiently cured with almost no odor due to unreacted monomer. In addition, ink recorded onto the film had sufficient flexibility. Even if the film was bent, no crack occurred in ink, and there was no peeling and no problem found in the adhesiveness test by Cellophane Tape (Registered Trademark) peeling.

Example 2-2

Image Formation by Cationic Polymerization

<Magenta Ink 2-2>

A magenta ink 2-2 was prepared in a similar manner as the magenta ink 2-1, except that, among the monomers used as the polymerizable compound in the magenta ink 2-1 prepared in Example 2-1, the compound (b-1) was replaced with the following compound (b-2).

Compound (b-2)

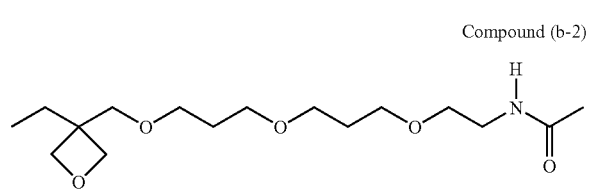

Example 2-3

Image Formation by Cationic Polymerization

<Magenta Ink 2-3>

A magenta ink 2-3 was prepared in a similar manner as the magenta ink 2-1, except that, among the monomers used as the polymerizable compound in the magenta ink 2-1 prepared in Example 2-1, the compound (b-1) was replaced with the following compound (b-3).

Compound (b-3)

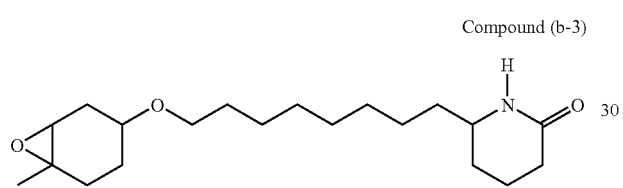

Example 2-4

Image Formation by Cationic Polymerization

<Magenta Ink 2-4>

A magenta ink 2-4 was prepared in a similar manner as the magenta ink 2-1, except that, among the monomers used as the polymerizable compound in the magenta ink 2-1 prepared in Example 2-1, the compound (b-1) was replaced with the following compound (b-4).

Compound (b-4)

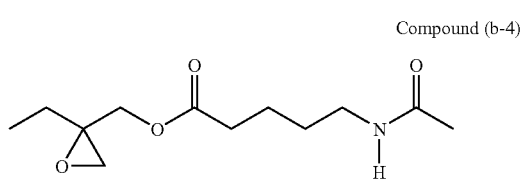

Example 2-5

Image Formation by Cationic Polymerization

<Magenta Ink 2-5>

A magenta ink 2-5 was prepared in a similar manner as the magenta ink 2-1, except that, the 3 parts by mass of "9,10-dibutoxyanthracene" used as the Sensitization dye in the magenta ink 2-1 prepared in Example 2-1 was replaced with 3 parts by mass of "Darocur ITX (manufactured by Ciba Specialty Chemicals)".

Example 2-6

Image Formation by Cationic Polymerization

<Magenta Ink 2-6>

A magenta ink 2-6 was prepared in a similar manner as the magenta ink 2-1, except that, the 5 parts by mass of "C.I. Pigment Red 57:1" used in the magenta ink 2-1 prepared in Example 2-1 was replaced with 5 parts by mass of the following "oil-soluble dye M-1 having an oxidation potential of +1.37 V".

M-1

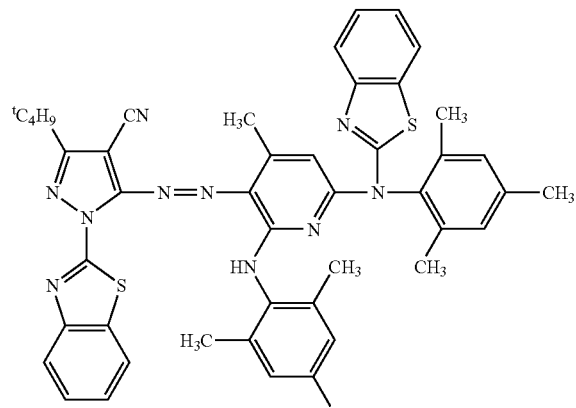

Example 2-7

Image Formation by Cationic Polymerization

<Magenta Ink 2-7>

A magenta ink 2-7 was prepared in a similar manner as the magenta ink 2-1, except that, the 5 parts by mass of the "C.I. Pigment Red 57:1" used in the magenta ink 2 of Example 2-1 was replaced with 5 parts by mass of the following "oil-soluble dye M-2 having an oxidation potential of +0.94 V".

M-2

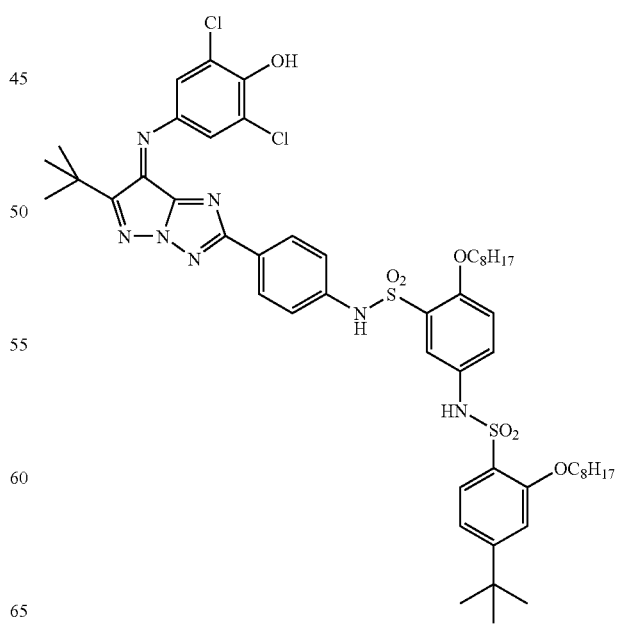

Comparative Example 2-1

Image Formation by Cationic Polymerization

<Magenta Ink 2-8>

A magenta ink 2-8 was prepared in a similar manner as the magenta ink 2-1, except that, among the monomers used as the polymerizable compound in the magenta ink 2-1 prepared in Example 2-1, the compound (b-1) was replaced with the following comparative compound (2).

Comparative compound (2)

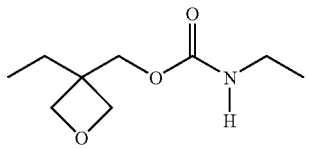

Comparative Example 2-2

Image Formation by Cationic Polymerization

<Magenta Ink 2-9>

A magenta ink 2-9 was prepared in a similar manner as the magenta ink 2-1, except that, among the monomers used as the polymerizable compound in the magenta ink 2-1 prepared in Example 2-1, the compound (b-1) was replaced with the following comparative compound (3).

Comparative compound (3)

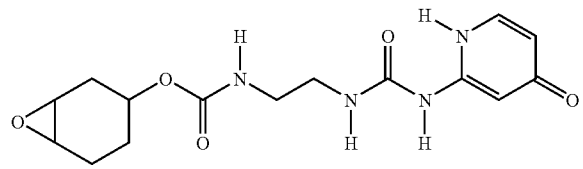

Each of the crude magenta inks 2-2 to 2-9 prepared in Examples 2-2 to 2-7 and Comparative Example 2-1 and 2-2 was filtered through a filter having an absolute filtration precision of 2 μm to obtain each of magenta inks 2-2 to 2-9.

The ink viscosity of each of the ink compositions prepared in Examples and Comparative Examples above was in the range of 7 to 20 mPa·s at the ink ejection temperature.

<<Inkjet Image Recording>>

A magenta image was formed in a manner similar as the method in Example 1 by using each of the magenta inks 2-2 to 2-9 prepared in Examples 2-2 to 2-7 and Comparative Examples 2-1 and 2-2 above and the magenta ink 2-1 prepared in Example 2-1.

<Evaluation of Inkjet Image>

The curing sensitivity, flexibility, and adhesiveness to PET base plate of each of the image formed were evaluated according to the following methods. Results are shown in Table 3.

2-1. Measurement of Curing Sensitivity

The amount (mJ/cm$^2$) of exposure energy providing no stickiness on an image surface after irradiation of ultraviolet rays was defined as the curing sensitivity. A smaller numeric value means high sensitivity. a higher sensitivity.

2-2. Measurement of Flexibility

The evaluation of flexibility was performed according to a degree of a crack generated a cured film (image) after bending a PVC sheet having a magenta image ten times. The bending test is a functional evaluation of a five scale evaluation when a state where no crack is generated is set to a value of five. The value of three or more is evaluated as a state where no problem for practical use exists.

2-3. Adhesiveness

The adhesiveness to PET was evaluated by a cross hatch test (EN ISO2409). A higher value in the test is more favorable, and a value of 3B or higher indicates a state without practical problem.

TABLE 3

| | | Sensitivity (mJ/cm$^2$) | Flexibility | Adhesiveness (PET) |
|---|---|---|---|---|
| Example 2-1 | Magenta ink 2-1 | 165 | 5 | 4B |
| Example 2-2 | Magenta ink 2-2 | 330 | 5 | 4B |
| Example 2-3 | Magenta ink 2-3 | 330 | 5 | 3B |
| Example 2-4 | Magenta ink 2-4 | 330 | 4 | 3B |
| Example 2-5 | Magenta ink 2-5 | 330 | 5 | 4B |
| Example 2-6 | Magenta ink 2-6 | 330 | 5 | 4B |
| Example 2-7 | Magenta ink 2-7 | 330 | 5 | 4B |
| Comparative Example 2-1 | Magenta ink 2-8 | 1100 | 2 | 1B |
| Comparative Example 2-2 | Magenta ink 2-9 | 800 | 2 | 2B |

As apparent form Table 3, the images prepared by using the ink composition according to the present invention are cured at high sensitivity, and are superior in flexibility and adhesiveness to base material.

Example 2-8

Image Formation by Light-emitting Diode (LED)

An inkjet image was recorded in a similar manner to example 2-1, except that the magenta ink 1 prepared in Example 2-1 was used and the metal halide lamp Vzero085 manufactured by Integration Technology was replaced with an ultraviolet light-emitting diode (UV-LED).

The UV-LED used in the present Example was NCCU033 manufactured by Nichia Corporation. The LED emitted an UV ray having a wavelength of 365 nm from the tip, and a ray at an intensity of approximately 100 mW per tip when a current of approximately 500 mA was applied. It was possible to give a power of 0.3 W/cm$^2$ on the surface of the recording medium by using multiple tips placed at an interval of 7 mm. The period from ejection to exposure and the exposure period were variable according to the traveling speed of the recording medium and the distance between the head and the LED. In the present Example, the image was exposed to the light, approximately 0.5 second after ejection.

It was possible to adjust the exposure energy on the recording medium in the range of 0.01 to 15 J/cm$^2$ according to the settings for the distance to medium and the traveling speed.

Comparative Example 2-3

Image Formation by Light-emitting Diode (LED)

An inkjet image was recorded in a similar manner as the Example 2-8, except that the magenta ink 2-1 of Example 2-8 was replaced the magenta ink 2-8 prepared in Comparative Example 2-1.

<<Evaluation of Inkjet Image>>

The sensitivity, flexibility, and adhesiveness to each base plate of the images thus formed were evaluated according to the method described above. Evaluation results are summarized in Table 4.

TABLE 4

| | | Exposure method | Sensitivity (mJ/cm$^2$) | Flexibility | Adhesiveness (PET) |
|---|---|---|---|---|---|
| Example 2-11 | Magenta ink 2-1 | Metal halide lamp | 165 | 5 | 4B |
| Example 2-8 | Magenta ink 2-1 | Light-emitting diode | 50 | 5 | 4B |
| Comparative Example 2-3 | Magenta ink 2-8 | Light-emitting diode | 350 | 2 | 1B |

As shown in Table 4, an image was formed at highly sensitivity even when formed with an ultraviolet light-emitting diode, and the image obtained is soft and superior in the adhesiveness to base material.

Results obtained in Example 2-8 and those of Example 1, in which an image formed by using the magenta ink of Example 2-1 above was hardened by an ultraviolet lamp (metal halide lamp), are also compared. When an image was hardened with an ultraviolet light-emitting diode as in Example 8, the image was softer and more adhesive and had superior image-forming property than the image formed with an ultraviolet ray lamp, thus it was more sensitive to radiation of radiation.

Example 2-9

—Preparation of Support—

An aluminum plate was prepared in a similar manner as in Example 1-7. After the aluminum plate was cut to a width of 1,030 mm, it was subjected to a surface treatment similar to that in Example 1-7, to give an aluminum support.

<Preparation and Evaluation of Planographic Printing Plate>

An image was formed on the aluminum support thus prepared with the magenta ink 2-1, ink composition used in Example 2-1, and hardened similarly to Example 2-1. The aluminum plate was used as a planographic printing plate, and the image and printing durability were evaluated by the following methods:

a. Evaluation of Image

Printing was performed by using the planographic printing plate prepared with the ink compositions of Example 2-1 in a Heidel KOR-D printing machine, while supplying ink [VALUES-G red for sheet-fed printing press (manufactured by Dainippon Ink and Chemicals, Inc.)] and dampening water [Ecolity 2 (manufactured by Fuji Photo Film)]. The image after printing on 100 papers was evaluated visually, revealing that the planographic printing plates prepared with the ink composition of the Example gave an image having no whitening in the image region and no stains in the nonimage region.

b. Evaluation of Printing Durability

Continued printing with the planographic printing plates gave 10,000 or more prints carrying a high-quality image having no whitening in the image region and no stains in the nonimage region, indicating that the plate was at the level practically without any problem in printing durability.

Example 3-1

<<Preparation of ink>>

<Yellow ink 3-1>

| | |
|---|---|
| C.I. Pigment Yellow 13 | 5 parts by mass |
| Photocationic polymerization initiator: triphenylsulfonium salt (UVI-6992, manufactured by Dow Chemical Company) | 6 parts by mass |
| Sensitization dye: 9,10-dibutoxyanthracene | 3 parts by mass |
| Polymerizable compound | |
| Monomer: 3,4-epoxycyclohexylmethyl-3',4'-epoxycyclohexane carboxylate (Celoxide 2021A, manufactured by Daicel-UCB Co.) | 35 parts by mass |
| Monomer: 3,7-bis(3-oxetanyl)-5-oxanonane (OXT-221, manufactured by Toagosei Co., Ltd.) | 21 parts by mass |
| Monomer: the following specific polymerizable compound (a-1) | 30 parts by mass |

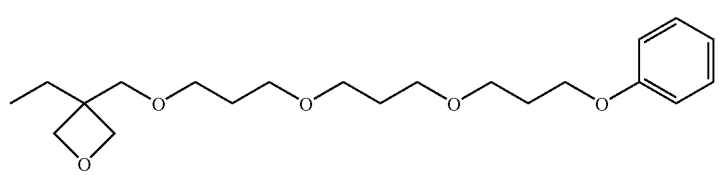

(a-1)

<Magenta ink 3-1>

| | |
|---|---|
| C.I. Pigment Red 57:1 | 5 parts by mass |
| Photocationic polymerization initiator: triphenylsulfonium salt | 6 parts by mass |

-continued

| <<Preparation of ink>> | |
|---|---|
| (UVI-6992, manufactured by Dow Chemical Company) | |
| Sensitization dye: 9,10-dibutoxyanthracene | 3 parts by mass |
| Polymerizable compound | |
| | |
| Monomer: 3,4-epoxycyclohexylmethyl-3',4'-epoxycyclohexanecarboxylate | 35 parts by mass |
| (Celoxide 2021A, manufactured by Daicel-UCB Co.) | |
| Monomer: 3,7-bis(3-oxetanyl)-5-oxanonane | 21 parts by mass |
| (OXT-22 1, manufactured by Toagosei Co., Ltd.) | |
| Monomer: the specific polymerizable compound (a-1) | 30 parts by mass |
| <Cyan ink 3-1> | |
| | |
| C.I. Pigment blue 15:3 | 5 parts by mass |
| Photocationic polymerization initiator: triphenylsulfonium salt | 6 parts by mass |
| (UVI-6992, manufactured by Dow Chemical Company) | |
| Sensitization dye: 9,10-dibutoxyanthracene | 3 parts by mass |
| Polymerizable compound | |
| | |
| Monomer: 3,4-epoxycyclohexylmethyl-3',4'-epoxycyclohexanecarboxylate | 35 parts by mass |
| (Celoxide 2021A, manufactured by Daicel-UCB Co.Ltd.) | |
| Monomer: 3,7-bis(3-oxetanyl)-5-oxanonane | 21 parts by mass |
| (OXT-221, manufactured by Toagosei Co., Ltd.) | |
| Monomer: the specific polymerizable compound (a-1) | 30 parts by mass |
| <Black ink 3-1> | |
| | |
| C.I. Pigment black 7 | 5 parts by mass |
| Photocationic polymerization initiator: triphenylsulfonium salt | 6 parts by mass |
| (UVI-6992, manufactured by Dow Chemical Company) | |
| Sensitization dye: 9,1 0-dibutoxyanthracene | 3 parts by mass |
| Polymerizable compound | |
| | |
| Monomer: 3,4-epoxycyclohexylmethyl-3',4'-epoxycyclohexanecarboxylate | 35 parts by mass |
| (Celoxide 2021A: manufactured by Daicel-UCB Co.) | |
| Monomer: 3,7-bis(3 -oxetanyl)-5 -oxanonane | 21 parts by mass |
| (OXT-221, manufactured by Toagosei Co., Ltd.) | |
| Monomer, the specific polymerizable compound (a-1) | 30 parts by mass |

Each crude color inks 3-1 thus prepared were was filtered through a filter having an absolute filtration precision of 2 µm to obtain ink 3-1 of each color.

<<Inkjet Image Recording>>

An image was recorded on a recording medium in a similar manner to example 1-1, in a commercially available inkjet-recording apparatus having piezoelectric inkjet nozzles.

<Formation and Evaluation of Color Image>

Ink of each color prepared above was respectively ejected at an environmental temperature of 25° C., in an order of black→cyan→magenta→yellow, and the ultraviolet rays were irradiated for each color using a metal halide lamp (Trade Name: Vzero 085, manufactured by Integration Technology, Co., Ltd.). Light exposure was performed such that the total exposure energy per one color is uniform, that is, 100 mJ/cm², as energy for complete curing, to eliminate stickiness in a touch test. The respective color images were recorded on a grained aluminum substrate, a biaxial oriented transparent polypropylene film that was subjected to a surface treatment to give printability, a soft polyvinyl chloride sheet, a cast coated paper, and a commercially available recycled paper, as the recording medium. As a result, all provided an image of high resolution without dot bleeding. Further, on a woodfree paper, ink did not penetrate to the backside, and ink was sufficiently cured with almost no odor due to unreacted monomer. In addition, ink recorded onto the film had sufficient flexibility. Even if the film was bent, no crack occurred in ink, and there was no peeling and no problem found in the adhesiveness test by Cellophane Tape (Registered Trademark) peeling.

Example 3-2

<Magenta Ink 3-2>

A magenta ink 3-2 was prepared in a similar manner as the magenta ink 3-1, except that, among the monomers used as the polymerizable compounds in the magenta ink 3-1, 30 parts by mass of the specific polymerizable compound (a-1) was replaced with 30 parts by mass of the following specific polymerizable compound (a-22).

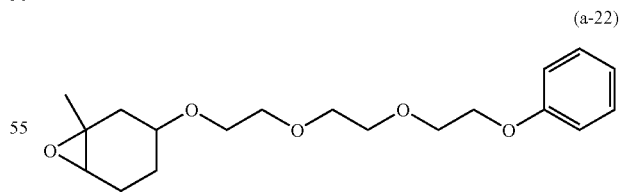

(a-22)

Example 3-3

<Magenta Ink 3-3>

A magenta ink 3-3 was prepared in a similar manner as the magenta ink 3-1, except that, among the monomers used as the polymerizable compounds in the magenta ink 3-1, 30 parts by mass of the specific polymerizable compound (a-1)

was replaced with 30 parts by mass of the following specific polymerizable compound (a-25).

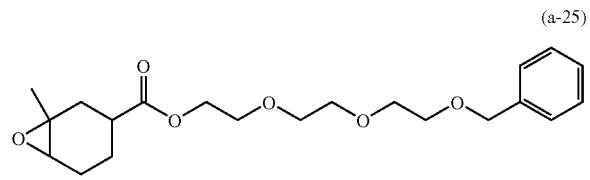

(a-25)

Example 3-4

<Magenta Ink 3-4>

A magenta ink 3-4 was prepared in a similar manner as the magenta ink 3-1, except that, among the monomers used as the polymerizable compounds in the magenta ink 3-1, 30 parts by mass of the specific polymerizable compound (a-1) was replaced with 30 parts by mass of the following specific polymerizable compound (a-10).

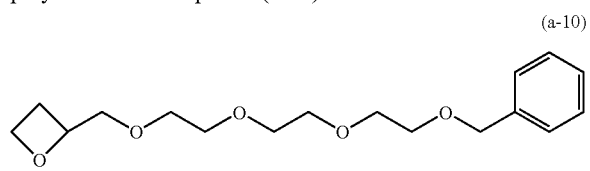

(a-10)

Example 3-5

<Magenta Ink 3-5>

A magenta ink 3-5 was prepared in a similar manner as the magenta ink 3-1, except that, the 3 parts by mass of the 9,10-dibutoxyanthracene used as the Sensitization dye in the magenta ink 3-1 of Example 1 was replaced with 3 parts by mass of "Darocur ITX (manufactured by Ciba Specialty Chemicals)".

Example 3-6

<Magenta Ink 3-6>

A magenta ink 3-6 was prepared in a similar manner as the magenta ink 3-1, except that, the 5 parts by mass of the C.I. Pigment Red 57:1 used in the magenta ink 1 of Example 3-1 was replaced with 5 parts by mass of the following oil-soluble dye M-1 having an oxidation potential of +1.37 V.

M-1

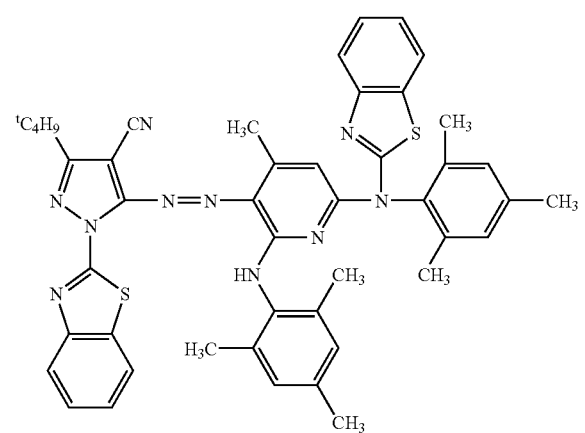

Example 3-7

<Magenta Ink 3-7>

A magenta ink 3-7 was prepared in a similar manner as the magenta ink 3-1, except that, the 5 parts by mass of the C.I. Pigment Red 57:1 used in the magenta ink 3-1 of Example 3-1 was replaced with 5 parts by mass of the following oil-soluble dye M-2 having an oxidation potential of +0.94 V.

M-2

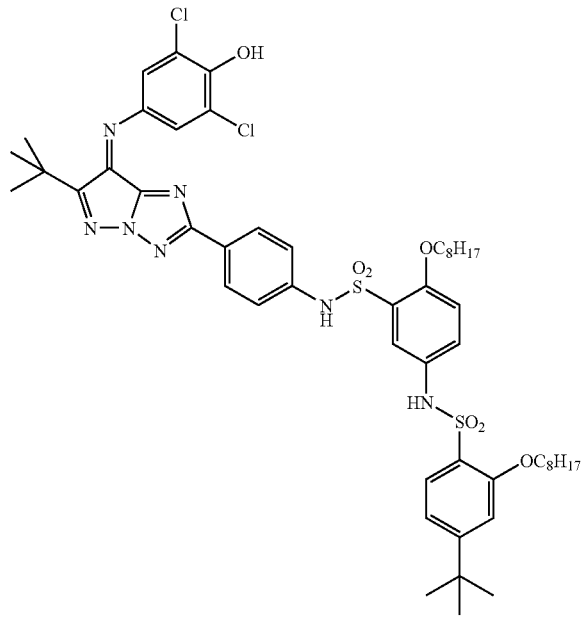

Comparative Example 3-1

<Magenta Ink 3-8>

A magenta ink 3-8 was prepared in a similar manner as the magenta ink 3-1, except that, among the monomers used as polymerizable compound in the magenta ink 3-1 of Example 3-1, the 30 parts by mass of the specific polymerizable compound (a-1) was replaced with 30 parts by mass of the following comparative compound (4).

Comparative compound (4)

Comparative Example 3-2

<Magenta Ink 3-9>

A magenta ink 3-9 was prepared in a similar manner as the magenta ink 3-1, except that, among the monomers used as polymerizable compound in the magenta ink 3-1 of Example 3-1, the 30 parts by mass of the specific polymerizable compound (a-1) was replaced with 30 parts by mass of the following comparative compound (5).

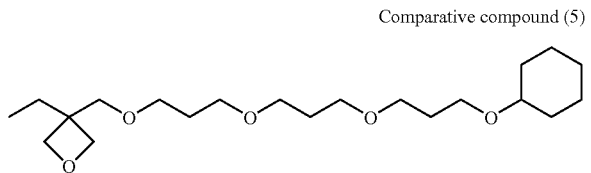

Comparative compound (5)

Each of the crude magenta inks 3-2 to 3-9 prepared in Examples 3-2 to 3-7 and Comparative Example 3-1 and 3-2 was filtered through a filter having an absolute filtration precision of 2 μm to obtain each of magenta inks 3-2 to 3-9.

The ink viscosity of each of the ink compositions prepared in Examples and Comparative Examples above was in the range of 7 to 20 mPa·s at the ink ejection temperature.

<<Inkjet Image Recording>>

An magenta image was formed according to the method described in Example 3-1 by using each of the magenta inks 3-2 to 3-9 prepared in Examples 3-2 to 3-7 and Comparative Examples 3-1 and 3-2 above and the magenta ink 3-1 prepared in Example 3-1.

<Evaluation of Inkjet Image>

The adhesiveness to polystyrene plate of each of the images formed was evaluated according the method below.

3-1. Adhesiveness

The adhesiveness to a polystyrene plate was evaluated by a cross patch test (EN ISO2409). A higher value in the test is more favorable, and a value of 3B or higher indicates a state without practical problem. Results are shown in Table 5.

TABLE 5

| | Magenta ink number | Adhesiveness (polystyrene plate) |
|---|---|---|
| Example 3-1 | 3-1 | 5B |
| Example 3-2 | 3-2 | 5B |
| Example 3-3 | 3-3 | 4B |
| Example 3-4 | 3-4 | 5B |
| Example 3-5 | 3-5 | 4B |
| Example 3-6 | 3-6 | 5B |
| Example 3-7 | 3-7 | 5B |
| Comparative Example 3-1 | 3-8 | 2B |
| Comparative Example 3-2 | 3-9 | 1B |

As apparent from Table 5, the ink compositions according to the present invention (magenta inks 3-1 to 3-7) were superior in adhesiveness and flexibility of the obtained image.

Meanwhile, the magenta ink 3-8 or 3-9 obtained in Comparative Example 3-1 or 3-2 was definitely inferior in adhesiveness.

Example 3-8

Image Formation by Light-emitting Diode (LED)

An inkjet image was recorded in a similar manner to example 3-1, except that the magenta ink 3-1 prepared in Example 3-1 was used and the metal halide lamp Vzero085 manufactured by Integration Technology was replaced with an ultraviolet light-emitting diode (UV-LED).

The UV-LED used in the present Example was NCCU033 manufactured by Nichia Corporation. The LED emitted an UV ray having a wavelength of 365 nm from the tip, and a ray at an intensity of approximately 100 mW per tip when a current of approximately 500 mA was applied. It was possible to give a power of 0.3 W/cm on the surface of the recording medium by using multiple tips placed at an interval of 7 mm. The period from ejection to exposure and the exposure period were variable according to the traveling speed of the recording medium and the distance between the head and the LED. In the present Example, the image was exposed to the light, approximately 0.5 second after ejection.

It was possible to adjust the exposure energy on the recording medium in the range of 0.01 to 15 $J/cm^2$ according to the settings for the distance to medium and the traveling speed.

Comparative Example 3-3

Image Formation by Light-emitting Diode (LED)

An inkjet image was recorded in a similar manner to example 3-1, except that the magenta ink 3-1 used in Example 3-8 was replaced with the magenta ink 3-8 prepared in Comparative Example 3-1.

<Evaluation of Inkjet Image>

The adhesiveness and sensitivity of the inks obtained in Example 3-8 and Comparative Example 3-3 were evaluated according to the following the methods.

The sensitivity was measured as the exposure energy ($mJ/cm^2$) at which the image after UV irradiation became non-tacky. A lower numerical value indicates higher sensitive.

The flexibility of the image formed in Example 3-8 or Comparative Example 3-3 was evaluated according to the method above.

Evaluation results are summarized in Table 6.

TABLE 6

| | Magenta ink number | Sensitivity ($mJ/cm^2$) | Adhesiveness (to polystyrene plate) |
|---|---|---|---|
| Example 3-8 | 3-1 | 50 | 4B |
| Comparative Example 3-3 | 3-8 | 80 | 1B |

As apparent form Table 6, the ink composition according to the present invention (magenta ink 3-1) was highly sensitive to the ultraviolet light-emitting diode and superior in adhesiveness of the obtained image.

As shown in Table 5, the image formed with an ultraviolet light-emitting diode was also more sensitive to irradiation with radiation than that formed with an ultraviolet lamp.

Example 3-9

—Preparation of Support—

An aluminum plate was prepared in a similar manner as in Example 1-7. After the aluminum plate was cut to a width of 1,030 mm, it was subjected to a surface treatment similar to that in Example 1-7, to give an aluminum support.

<Preparation and Evaluation of Planographic Printing Plate>

An image was formed on the aluminum support thus prepared with the magenta ink 3-1, ink composition used in Example 3-1, and hardened similarly to Example 3-1. The aluminum plate was used as a planographic printing plate, and the image and printing durability were evaluated by the following methods:

a. Evaluation of Image

Printing was performed by using the planographic printing plate prepared with the ink compositions of Example 3-1 in a Heidel KOR-D printing machine, while supplying ink [VALUES-G red for sheet-fed printing press (manufactured by Dainippon Ink and Chemicals, Inc.)] and dampening water [Ecolity 2 (manufactured by Fuji Photo Film)]. The image after printing on 100 papers was evaluated visually, revealing that the planographic printing plates prepared with the ink composition of the Example gave an image having no whitening in the image region and no stains in the nonimage region.

b. Evaluation of Printing Durability

Continued printing with the planographic printing plates gave 10,000 or more prints carrying a high-quality image having no whitening in the image region and no stains in the nonimage region, indicating that the plate was at the level practically without any problem in printing durability.

All publications, patent applications, and technical standards mentioned in this specification are herein incorporated by reference to the same extent as if each individual publication, patent application, or technical standard was specifically and individually indicated to be incorporated by reference.

What is claimed is:

1. A curable composition comprising:
   a compound having a single partial structure containing a cyclic ether group, and at least one linear alkyl group having 8 to 16 carbon atoms; and
   a compound that generates acid when irradiated with radiation,
   wherein the cyclic ether group is a four-membered cyclic ether group,
   wherein the curable composition is used for inkjet recording, and
   wherein the linear alkyl group having 8 to 16 carbon atoms is non-substituted alkyl.

2. An ink composition comprising the curable composition of claim 1 and a colorant,
   wherein the ink composition is used for ink recording.

3. An inkjet recording method comprising:
   ejecting the ink composition of claim 2 onto a recording medium using an inkjet recording apparatus; and
   curing the ejected ink composition by irradiation of active radiation.

4. The inkjet recording method of claim 3, wherein the active radiation comprises ultraviolet rays irradiated from a light-emitting diode generating ultraviolet rays, wherein an emission peak wavelength is in a range of 350 to 420 nm and a maximum illuminance on a surface of the recording medium is 10 to 2,000 mW/cm$^2$.

5. A planographic printing plate produced by the method comprising:
   ejecting the ink composition of claim 2 onto a support; and
   curing the ejected ink composition by irradiation of active radiation onto the ejected ink composition so as to form a hydrophobic image on the support with the cured ink composition.

6. The curable composition of claim 1, wherein the compound having a single partial structure containing a cyclic ether group, and at least one linear alkyl group having 8 to 16 carbon atoms is a compound having single cyclic ether group in the molecule.

7. The curable composition of claim 1, wherein the linear alkyl group of the compound having a single partial structure containing a cyclic ether group, and at least one linear alkyl group having 8 to 16 carbon atoms is linked, directly or via a linking group, to a carbon atom in the cyclic ether group,
   wherein the linking group is selected from at least one of the group consisted of —O—, —S—, —C(=O)O—, and combinations thereof.

8. The curable composition of claim 1, wherein the compound having a single partial structure containing a cyclic ether group, and at least one linear alkyl group having 8 to 16 carbon atoms is produced by an etherification reaction of a cyclic ether alcohol compound represented by the following Formula (A):

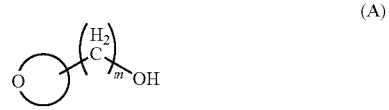

(A)

where in Formula (A), m is an integer of from 0 to 10.

9. The curable composition of claim 8, wherein the Formula (A) is at least one selected from the group consisting of 3-methyl-3-oxetanemethanol, 3-methyl-3-oxetaneethanol, 3-methyl-3-oxetanepropanol, 3-ethyl-3-oxetanemethanol 3-ethyl-3-oxetaneethanol, 3-ethyl-3-oxetanepropanol, 3-propyl-3-oxetanemethanol 3-propyl-3 -oxetaneethanol, and 3-propyl-3-oxetanepropanol.

10. The curable composition of claim 1, wherein the compound having a single partial structure containing a cyclic ether group, and at least one linear alkyl group having 8 to 16 carbon atoms is at least one selected from the group consisting of following compounds:

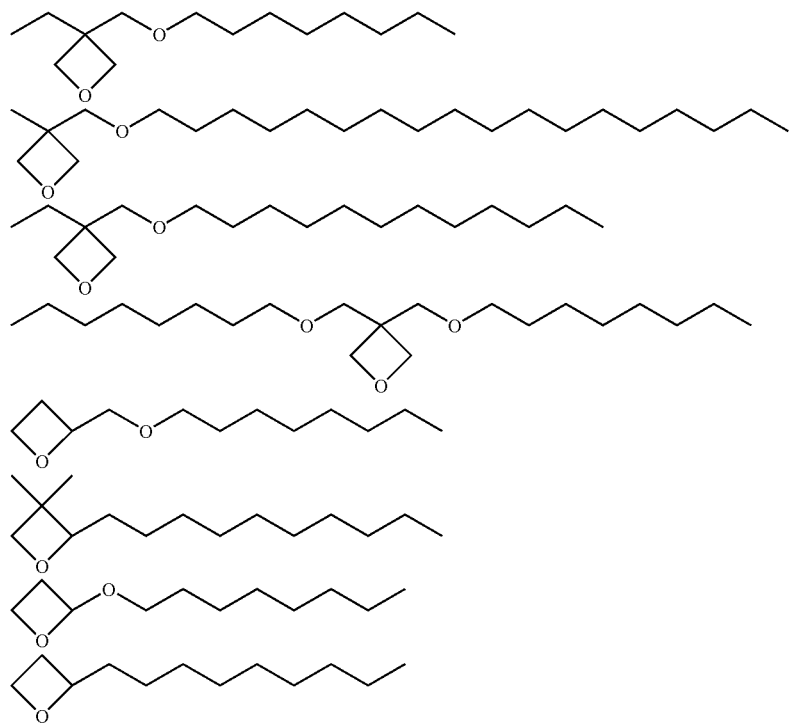
* * * * *